US012211860B2

(12) United States Patent
Chaji et al.

(10) Patent No.: US 12,211,860 B2
(45) Date of Patent: Jan. 28, 2025

(54) INTEGRATION OF MICRODEVICES INTO SYSTEM SUBSTRATE

(71) Applicant: VueReal Inc., Waterloo (CA)

(72) Inventors: Gholamreza Chaji, Waterloo (CA); Ehsanollah Fathi, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/209,105

(22) Filed: Jun. 13, 2023

(65) Prior Publication Data

US 2023/0326937 A1 Oct. 12, 2023

Related U.S. Application Data

(60) Division of application No. 17/083,403, filed on Oct. 29, 2020, now Pat. No. 12,080,685, which is a (Continued)

(30) Foreign Application Priority Data

Oct. 30, 2017 (CA) ...................................... 2984214

(51) Int. Cl.
*H01L 27/12* (2006.01)
*H01L 21/683* (2006.01)
(Continued)

(52) U.S. Cl.
CPC ...... *H01L 27/1266* (2013.01); *H01L 21/6835* (2013.01); *H01L 25/0753* (2013.01);
(Continued)

(58) Field of Classification Search
CPC .......................... H01L 21/6835; H01L 27/1266
(Continued)

(56) References Cited

U.S. PATENT DOCUMENTS 6,132,909 A 10/2000 Phillips
6,555,408 B1 4/2003 Jacobsen
(Continued)

FOREIGN PATENT DOCUMENTS

CN 102113089 4/2014
CN 103646893 4/2016
(Continued)

OTHER PUBLICATIONS

International Search Report and Written Opinion in International Application No. PCT/IB2017/057310, mailed Mar. 7, 2018 (6 pages).

(Continued)

*Primary Examiner* — Christopher M Raabe
(74) *Attorney, Agent, or Firm* — NIXON PEABODY LLP

(57) ABSTRACT

In a micro-device integration process, a donor substrate is provided on which to conduct the initial manufacturing and pixelation steps to define the micro devices, including functional, e.g. light emitting layers, sandwiched between top and bottom conductive layers. The microdevices are then transferred to a system substrate for finalizing and electronic control integration. The transfer may be facilitated by various means, including providing a continuous light emitting functional layer, breakable anchors on the donor substrates, temporary intermediate substrates enabling a thermal transfer technique, or temporary intermediate substrates with a breakable substrate bonding layer.

9 Claims, 61 Drawing Sheets

Related U.S. Application Data division of application No. 16/542,019, filed on Aug. 15, 2019, now Pat. No. 10,998,352, which is a continuation-in-part of application No. 15/820,683, filed on Nov. 22, 2017, now Pat. No. 10,468,472.

(60) Provisional application No. 62/809,161, filed on Feb. 22, 2019, provisional application No. 62/746,300, filed on Oct. 16, 2018, provisional application No. 62/734,679, filed on Sep. 21, 2018, provisional application No. 62/515,185, filed on Jun. 5, 2017, provisional application No. 62/482,899, filed on Apr. 7, 2017, provisional application No. 62/473,671, filed on Mar. 20, 2017, provisional application No. 62/426,353, filed on Nov. 25, 2016.

(51) Int. Cl.
 *H01L 25/075* (2006.01)
 *H01L 33/62* (2010.01)

(52) U.S. Cl.
 CPC .......... *H01L 27/1214* (2013.01); *H01L 33/62* (2013.01); *H01L 2221/68322* (2013.01); *H01L 2221/68354* (2013.01); *H01L 2221/68363* (2013.01); *H01L 2221/68381* (2013.01); *H01L 2933/0066* (2013.01)

(58) Field of Classification Search
 USPC ......................................................... 445/24
 See application file for complete search history.

(56) References Cited

U.S. PATENT DOCUMENTS

| | | |
|---|---|---|
| 6,946,322 B2 | 9/2005 | Brewer |
| 7,033,842 B2 | 4/2006 | Haji |
| 7,148,127 B2 | 12/2006 | Oohata |
| 7,972,875 B2 | 7/2011 | Rogers |
| 8,349,116 B1 | 1/2013 | Bibl |
| 9,178,123 B2 | 11/2015 | Sakariya |
| 9,607,907 B2 | 3/2017 | Wu |
| 9,773,750 B2 | 9/2017 | Bibl |
| 9,825,014 B2 | 11/2017 | Cha |
| 2004/0142575 A1 | 7/2004 | Brewer |
| 2004/0154733 A1 | 8/2004 | Morf |
| 2009/0057681 A1 | 3/2009 | Komatsu |
| 2010/0140633 A1 | 6/2010 | Emerson |
| 2010/0317132 A1 | 12/2010 | Rogers |
| 2011/0151153 A1 | 6/2011 | Felder |
| 2012/0115262 A1 | 5/2012 | Menard |
| 2012/0314388 A1* | 12/2012 | Bower ................. H05K 3/20 156/219 |
| 2012/0320581 A1 | 12/2012 | Rogers |
| 2013/0130440 A1 | 5/2013 | Hu |
| 2014/0159065 A1 | 6/2014 | Hu |
| 2014/0312368 A1 | 10/2014 | Lee |
| 2014/0340900 A1 | 11/2014 | Bathurst |
| 2014/0363928 A1 | 12/2014 | Hu |
| 2015/0327388 A1 | 11/2015 | Menard |
| 2016/0087165 A1 | 3/2016 | Lee |
| 2016/0126218 A1 | 5/2016 | Kurita |
| 2016/0218143 A1 | 7/2016 | Chaji |
| 2016/0240516 A1 | 8/2016 | Chang |
| 2016/0268491 A1 | 9/2016 | Wu |
| 2016/0308103 A1 | 10/2016 | Hu |
| 2016/0360712 A1 | 12/2016 | Yorio |
| 2016/0372893 A1 | 12/2016 | McLaurin |
| 2017/0025399 A1 | 1/2017 | Takeya |
| 2017/0062397 A1 | 3/2017 | Park |
| 2017/0122502 A1 | 5/2017 | Cok |
| 2017/0215280 A1 | 7/2017 | Chaji |
| 2017/0263811 A1 | 9/2017 | Zou |
| 2017/0278733 A1 | 9/2017 | Chang |
| 2017/0330856 A1 | 11/2017 | Zou |
| 2017/0338199 A1 | 11/2017 | Zou |
| 2017/0345692 A1 | 11/2017 | Liu |
| 2018/0006083 A1 | 1/2018 | Zhu |
| 2018/0033768 A1 | 2/2018 | Kumar |
| 2018/0045383 A1* | 2/2018 | Hasegawa ............... H01L 25/18 |
| 2018/0053751 A1 | 2/2018 | Zou |
| 2018/0096877 A1 | 4/2018 | Horibe |
| 2018/0138071 A1* | 5/2018 | Bower ................... H01L 24/97 |
| 2018/0138357 A1 | 5/2018 | Henley |
| 2018/0158706 A1 | 6/2018 | Hsu |
| 2018/0166429 A1 | 6/2018 | Chong |
| 2018/0218952 A1 | 8/2018 | Horibe |
| 2018/0226287 A1 | 8/2018 | Bower et al. |
| 2018/0247922 A1 | 8/2018 | Robin |
| 2018/0261582 A1 | 9/2018 | Henry |
| 2018/0358246 A1 | 12/2018 | Kobrin |
| 2018/0374987 A1 | 12/2018 | Zou |
| 2019/0027639 A1 | 1/2019 | Yoon |
| 2019/0115235 A1 | 4/2019 | Ahn |
| 2019/0157501 A1 | 5/2019 | An |
| 2019/0164946 A1 | 5/2019 | Fu |
| 2019/0187375 A1 | 6/2019 | Nemouchi |
| 2019/0252350 A1 | 8/2019 | Schwarz |
| 2019/0304818 A1 | 10/2019 | Ahn |
| 2019/0305178 A1* | 10/2019 | Ahn ..................... H01L 25/167 |
| 2019/0326149 A1* | 10/2019 | Bower .................. H01L 33/62 |
| 2019/0393201 A1* | 12/2019 | Caplet .................. B81C 99/008 |
| 2020/0235076 A1 | 7/2020 | Batres |
| 2020/0303359 A1 | 9/2020 | Robin |
| 2023/0078708 A1 | 3/2023 | Chaji |

FOREIGN PATENT DOCUMENTS

| | | |
|---|---|---|
| CN | 105493297 | 4/2016 |
| CN | 105723528 | 6/2016 |
| CN | 102737719 | 7/2017 |
| CN | 107017319 | 8/2017 |
| CN | 107210293 | 9/2017 |
| CN | 105129259 | 4/2018 |
| CN | 105576088 | 5/2018 |
| GB | 2545155 A | 6/2017 |
| JP | 2001196444 A | 7/2001 |
| JP | 2006140398 A | 6/2006 |
| WO | WO 1997/036194 | 10/1997 |
| WO | WO 2002/022374 | 3/2002 |
| WO | 2007015561 A1 | 2/2007 |

OTHER PUBLICATIONS

International Search Report and Written Opinion in International Application No. PCT/IB2017/056082, mailed Jan. 30, 2018 (6 pages).

International Search Report and Written Opinion for International Application No. PCT/IB2020/051501, mailed May 22, 2020 (9 pages).

\* cited by examiner

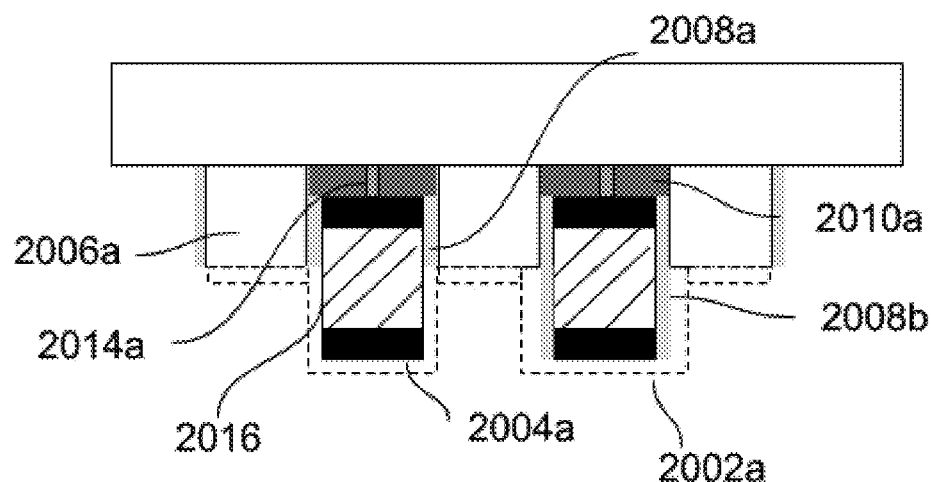
FIG. 20A1
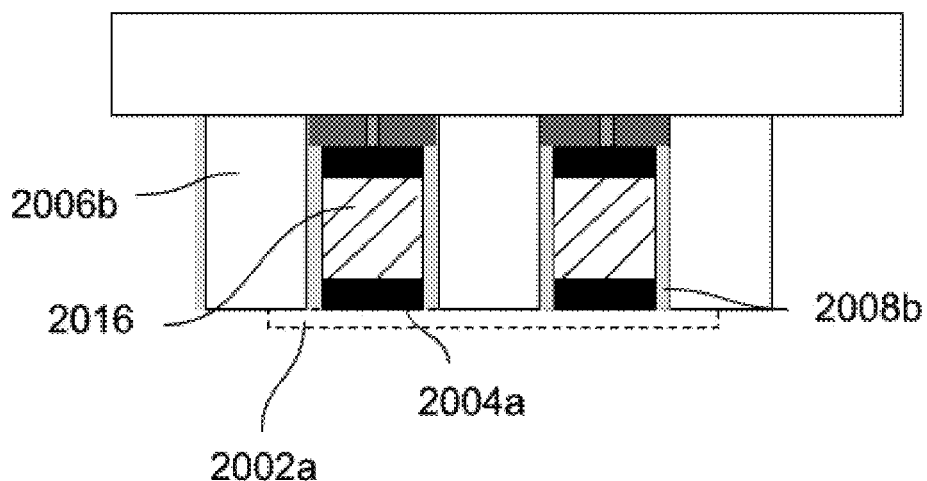
FIG. 20A2

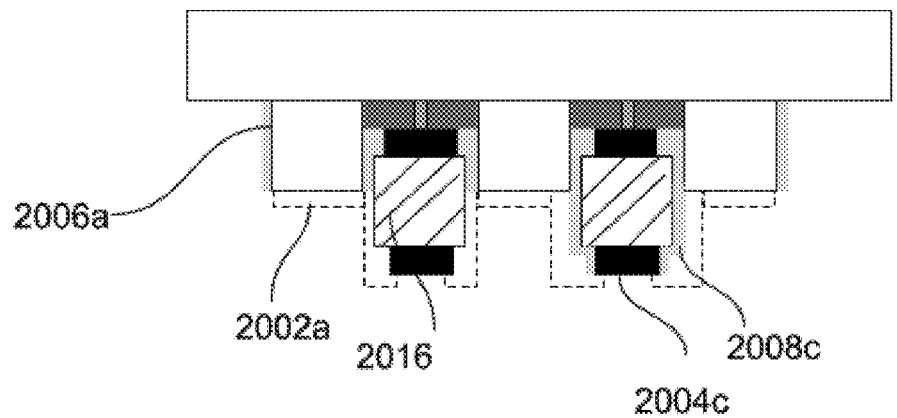
FIG. 20B1
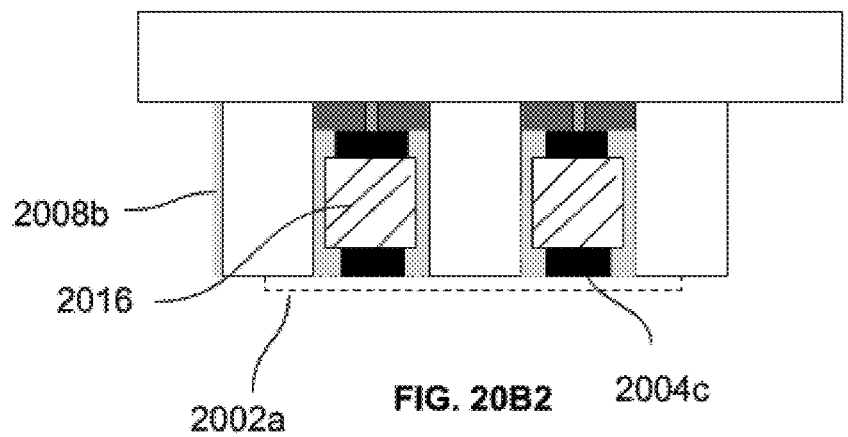
FIG. 20B2

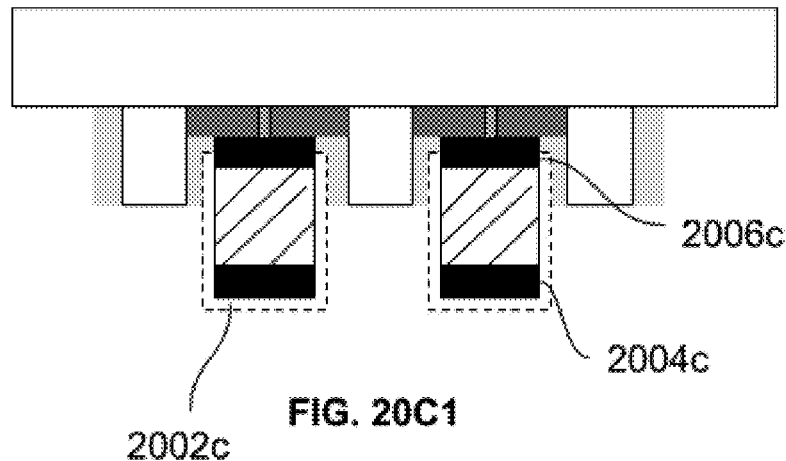
FIG. 20C1
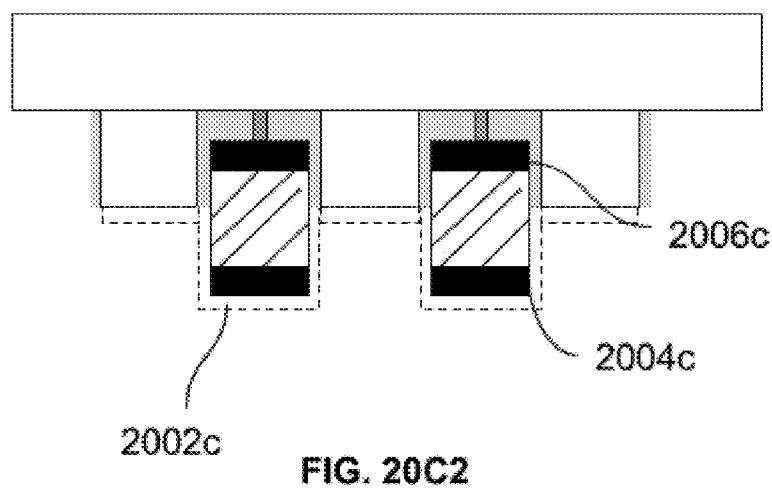
FIG. 20C2

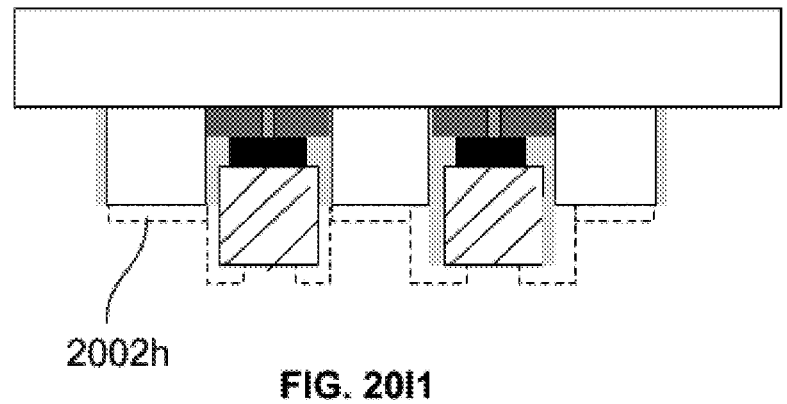
FIG. 20I1
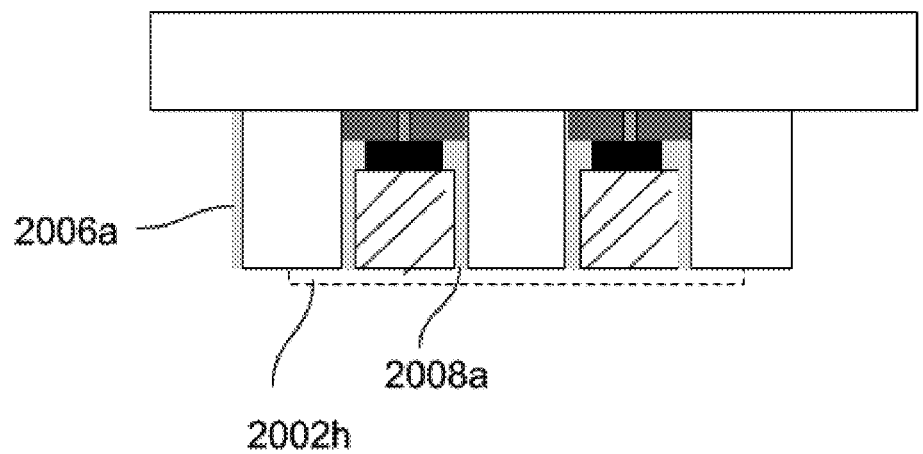
FIG. 20I2

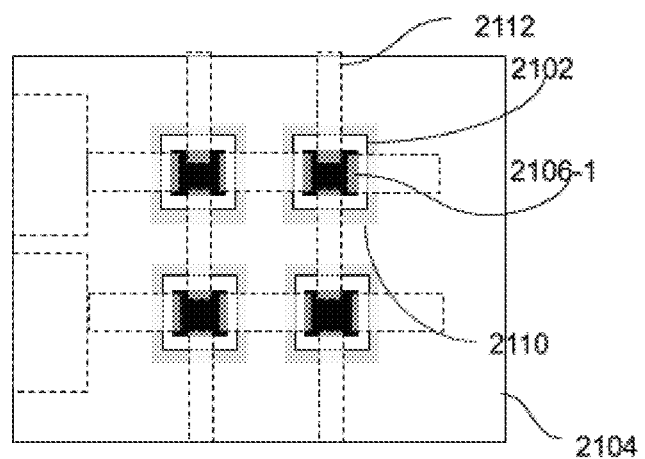
FIG. 21B1
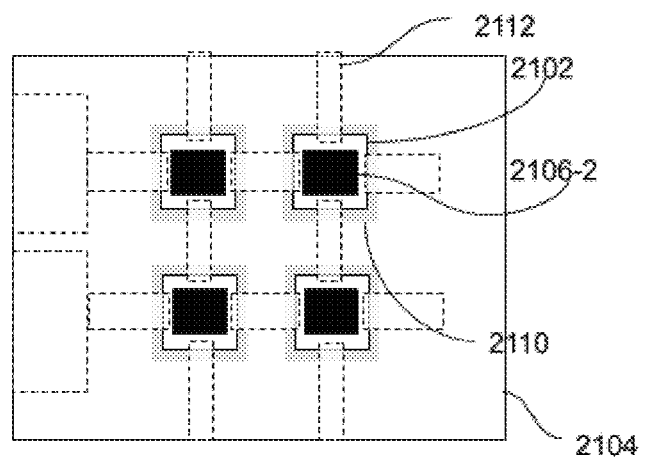
FIG. 21B2

INTEGRATION OF MICRODEVICES INTO SYSTEM SUBSTRATE

CROSS-REFERENCE TO RELATED APPLICATIONS

This application is a division of U.S. Nonprovisional patent application Ser. No. 17/083,403, filed Oct. 29, 2020, which is a division of U.S. Nonprovisional patent application Ser. No. 16/542,019, filed Aug. 15, 2019, now U.S. Pat. No. 10,998,352, issued May 4, 2021, which claims priority to and the benefit of U.S. Provisional Patent Application No. 62/809,161, filed Feb. 22, 2019, U.S. Provisional Patent Application No. 62/746,300, filed Oct. 16, 2018, and U.S. Provisional Patent Application No. 62/734,679, filed Sep. 21, 2018, and is a continuation-in-part of U.S. Nonprovisional patent application Ser. No. 15/820,683, filed Nov. 22, 2017, now U.S. Pat. No. 10,468,472, issued Nov. 5, 2019, which claims priority to and the benefit of U.S. Provisional Patent Application No. 62/515,185, filed Jun. 5, 2017, U.S. Provisional Patent Application No. 62/482,899, filed Apr. 7, 2017, U.S. Provisional Patent Application No. 62/473,671, filed Mar. 20, 2017, U.S. Provisional Patent Application No. 62/426,353, filed Nov. 25, 2016, and Canadian Patent Application No. 2,984,214, filed Oct. 30, 2017, each of which is incorporated herein by reference in its entirety.

FIELD OF THE INVENTION

The present disclosure relates to optoelectronic microdevices, and more particularly to integrating optoelectronic microdevices into a system substrate with enhanced bonding and conductivity capability.

BACKGROUND OF THE INVENTION

An object of the present invention is to overcome the shortcomings of the prior art by providing a system and method for transferring microdevices from a donor substrate to a system substrate.

SUMMARY OF THE INVENTION

Accordingly to one embodiment of the present invention, a method to manufacture a pixelated structure comprises: providing a donor substrate, depositing a first conductive layer on the donor substrate, depositing a fully or partially continuous light emitting functional layer on the first conductive layer, depositing a second conductive layer on the functional layer, patterning the second conductive layer to form pixelated structures, providing a bonding contact for each pixelated structure, fixing the bonding contact to a system substrate; and removing the donor substrate.

In one embodiment, the microdevices are turned into arrays using continuous pixelation.

In another embodiment, the microdevices are separated and transferred to an intermediate substrate by filling the vacancies between the devices.

In another embodiment, the microdevices are post processed after being transferred to the intermediate substrate.

According to one embodiment, a bonding structure may be provided. The bonding structure may comprise a plurality of microdevices on a donor substrate, wherein each microdevice comprises one or more conductive pads formed on a surface of the microdevice; and a temporary material covers at least a part of each microdevice or the one or more conductive pads. In one case, the temporary material act as an anchor holding the plurality of microdevices inside the housing structure in the donor substrate.

According to one embodiment, a method to integrate microdevices on a backplane may be provided, the method comprising; providing a microdevice substrate comprised of one or more microdevices; connecting pads on the microdevices and corresponding pads on the backplane to bond a selective set of the microdevices from the substrate to the backplane, and separating the microdevice substrate to leave the bonded selected set of microdevices on the backplane.

BRIEF DESCRIPTION OF THE DRAWINGS

The invention will be described in greater detail with reference to the accompanying drawings which represent preferred embodiments thereof, wherein:

FIGS. 20A1-20A2 show an example highlighting the temporary conductive material covering microdevices, in accordance with some embodiments of the invention.

FIGS. 20B1-20B2 show another example highlighting the temporary conductive material covering microdevices, in accordance with some embodiments of the invention.

FIGS. 20C1-20C2 show another example highlighting the temporary conductive material covering microdevices, in accordance with some embodiments of the invention.

FIGS. 20I1-20I2 show another example highlighting the temporary conductive material covering microdevices, in accordance with some embodiments of the invention.

FIG. 21B1 shows an exemplary top view representation of FIG. 20B1, in accordance with an embodiment of the invention.

FIG. 21B2 shows another exemplary top view representation of FIG. 20B2, in accordance with an embodiment of the invention.

Similar or identical elements are indicated if the same reference numbers are used in different figures.

Figure 1A:
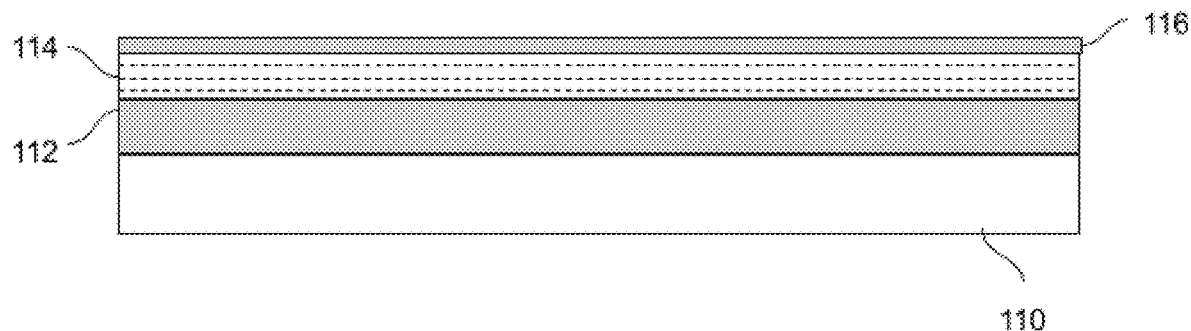
FIG. 1A illustrates a cross-sectional view of a lateral functional structure on a donor substrate, in accordance with an embodiment of the present invention.

The present disclosure is susceptible to various modifications and alternative forms, and specific embodiments or implementations are shown as examples in the drawings and will be described in detail herein. However, the disclosure is not limited to the particular forms disclosed. Rather, the disclosure covers all modifications, equivalents, and alternatives falling within the spirit and scope of the invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Unless defined otherwise, all technical and scientific terms used herein have the same meaning as commonly understood by one of ordinary skill in the art that this invention belongs to.

As used in the specification and claims, the singular forms "a," "an," and "the" include plural references unless the context clearly dictates otherwise.

In this description, the terms "device", "vertical device," and "microdevice" are used interchangeably. However, it is clear to one skilled in the art that the embodiments described here are independent of the device size.

In this description, the terms "donor substrate" and "temporary substrate" are used interchangeably.

In this description, the terms "receiver substrate," "system substrate," and "backplane" are used interchangeably.

Examples of optoelectronic devices are sensors and light emitting devices, such as, for example, light emitting diodes (LEDs).

The present disclosure is related to microdevice array display devices, wherein the microdevice array may be bonded to a backplane with a reliable approach. The microdevices are fabricated over a microdevice substrate. The microdevice substrate may comprise microLEDs, inorganic LEDs, organic LEDs, sensors, solid state devices, integrated circuits, microelectromechanical systems (MEMS), and/or other electronic components.

LEDs and LED arrays can be categorized as vertical solid-state devices. The microdevices may be sensors, LEDs, or any other solid devices grown, deposited, or monolithically fabricated on a substrate. The substrate may be the native substrate of the device layers or a receiver substrate where device layers or solid-state devices are transferred to.

The receiver substrate may be any substrate and can be rigid or flexible. The receiver substrate may include, but is not limited to, a printed circuit board, a thin film transistor (TFT) backplane, an integrated circuit substrate, or in one case of optical microdevices such as LEDs, a component of a display such as a driving circuitry backplane. Microdevice patterning on the device donor and receiving substrates can be used in combination with different transfer technology such as pick and place with different mechanisms (e.g., electrostatic transfer head, elastomer transfer head), or direct transfer mechanisms (e.g., dual function pads).

In this disclosure, contact pads in a receiver substrate refers to a designated area in the receiver substrate where microdevice is transferred to. The contact pad may comprise bonding materials to hold permanently hold the microdevice. The contact pad can be stacked in multiple layers to offer a more mechanically stable structure with improved bonding and conductivity capability.

The system substrate may be made of glass, silicon, plastics, or any other commonly used material. The system substrate may also have active electronic components such as but not limited to transistors, resistors, capacitors, or any other electronic component commonly used in a system substrate. In some cases, the system substrate may be a substrate with electrical signal rows and columns. The system substrate may be a backplane with circuitry to derive micro-LED devices.

Figure 1B:
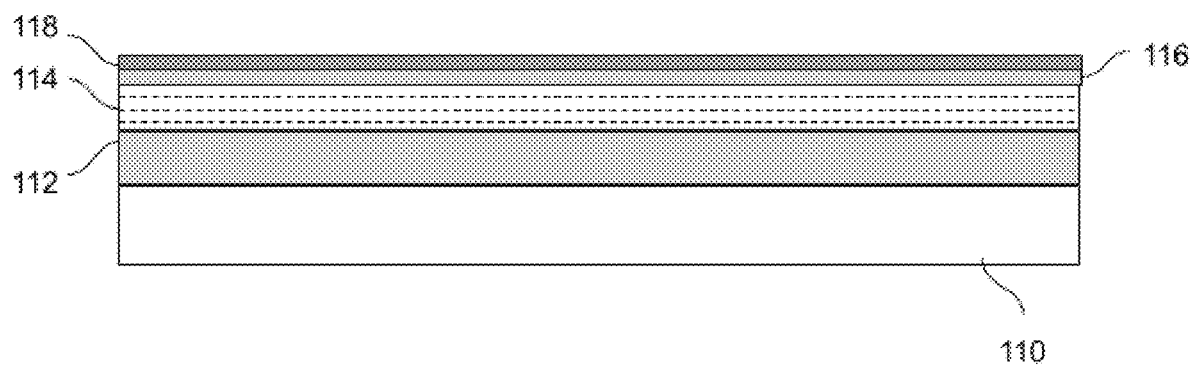
FIG. 1B illustrates a cross-sectional view of the lateral structure of FIG. 1A with a current distribution layer deposited thereon, in accordance with an embodiment of the present invention.
Figure 1C:
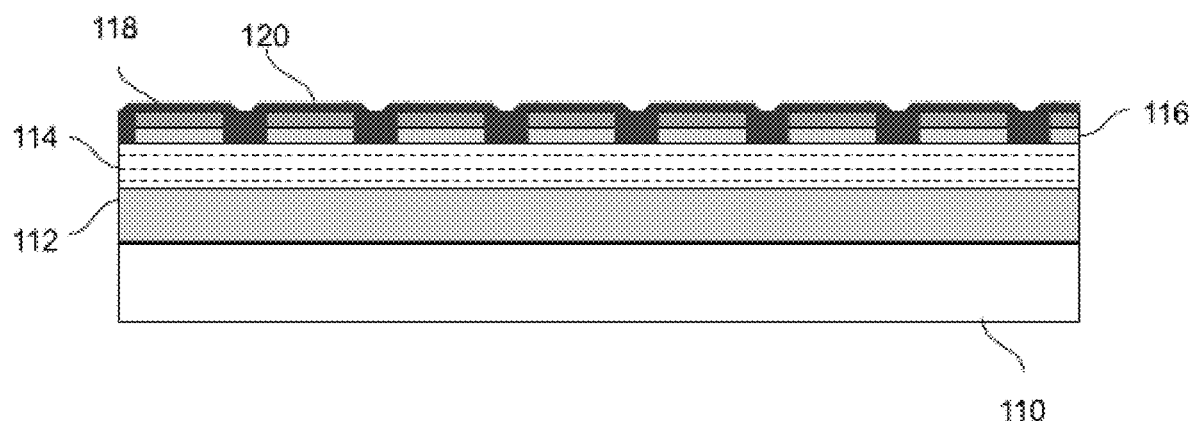
FIG. 1C illustrates a cross-sectional view of the lateral structure of FIG. 1B after patterning the dielectric, top conductive layer, and depositing a second dielectric layer, in accordance with an embodiment of the present invention.
Figure 1D:
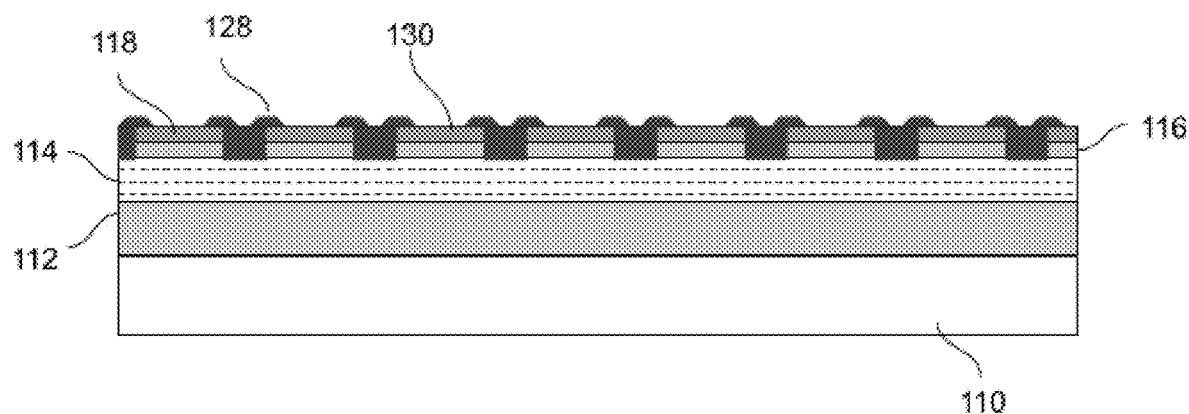
FIG. 1D illustrates a cross-sectional view of the lateral structure after patterning the second dielectric layer, in accordance with an embodiment of the present invention.

FIG. 1A illustrates an embodiment of a donor substrate 110 with a lateral functional structure comprising a bottom planar or sheet conductive layer 112, a functional layer (e.g., light-emitting quantum wells) 114, and a top pixelated conductive layer 116. The conductive layers 112 and 116 may be comprised of doped semiconductor material or other suitable types of conductive layers. The top conductive layer 116 may comprise a few different layers. In one embodiment, as shown in FIG. 1B, a current distribution layer 118 is deposited on top of the conductive layer 116. The current distribution layer 118 may be patterned. In one embodiment, the patterning may be done through lift off. In another case, the patterning may be done through photolithography. In an embodiment, a dielectric layer may be deposited and patterned first and then used as a hard mask to pattern the current distribution layer 118. After patterning the current distribution layer 118, the top conductive layer 116 may be patterned as well to form a pixel structure. A final dielectric layer 120 may be deposited over and between the patterned conductive and current distribution layers 116 and 118, after patterning the current distribution layer 118 and/or conductive layer 116, as shown in FIG. 1C. The dielectric layer 120 can also be patterned to create openings 130 as shown in FIG. 1D to provide access to the patterned current distribution layers 118. Additional leveling layers 128 may also be provided to level the upper surface, as shown in FIG. 1E.

Figure 1E:
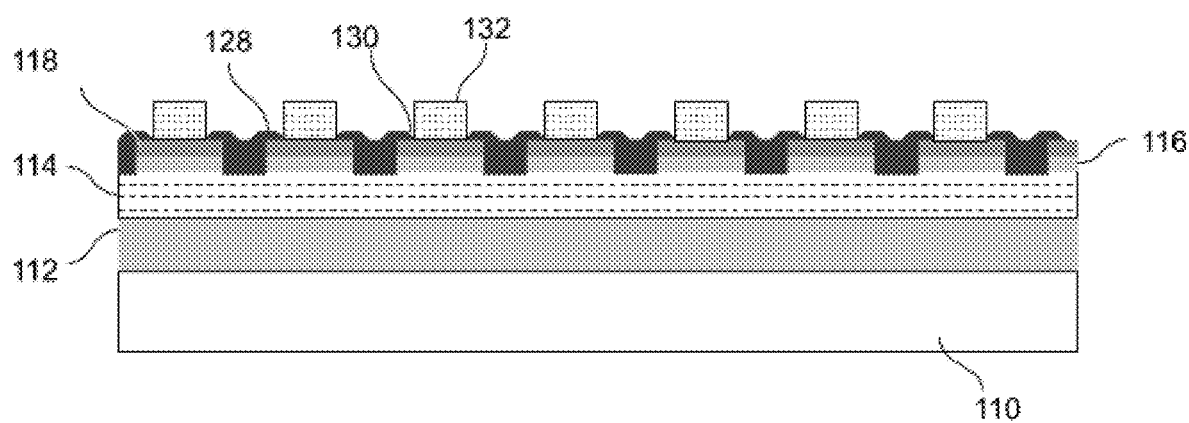
FIG. 1E illustrates a cross-sectional view of the lateral structure after pad deposition and patterning, in accordance with an embodiment of the present invention.
Figure 1F:
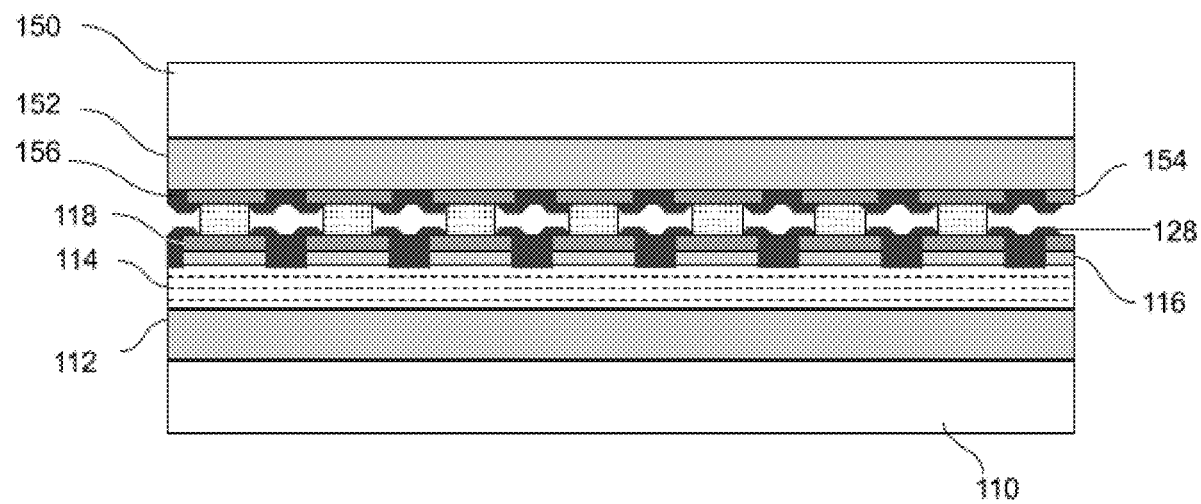
FIG. 1F illustrates a cross-sectional view of the lateral structure after bonding to a system substrate with bonding areas to form an integrated structure, in accordance with an embodiment of the present invention.

As shown in FIG. 1E, a pad 132 is deposited on the top of the current distribution layer 118 in each opening 130. The developed structure with pads 132 is bonded to the system substrate 150 with pads 154, as shown in FIG. 1F. The pads 154 in the system substrate 150 may be separated by a dielectric layer 156. Other layers 152 such as circuitry, planarization layers, or conductive traces may be between the system substrate pads 154 and the system substrate 150. Bonding the substrate system pads 154 to the pads 132 may be done either through fusion, anodic, thermocompression, eutectic, or adhesive bonding. There can also be one or more other layers deposited in between the system and lateral devices.

Figure 1G:
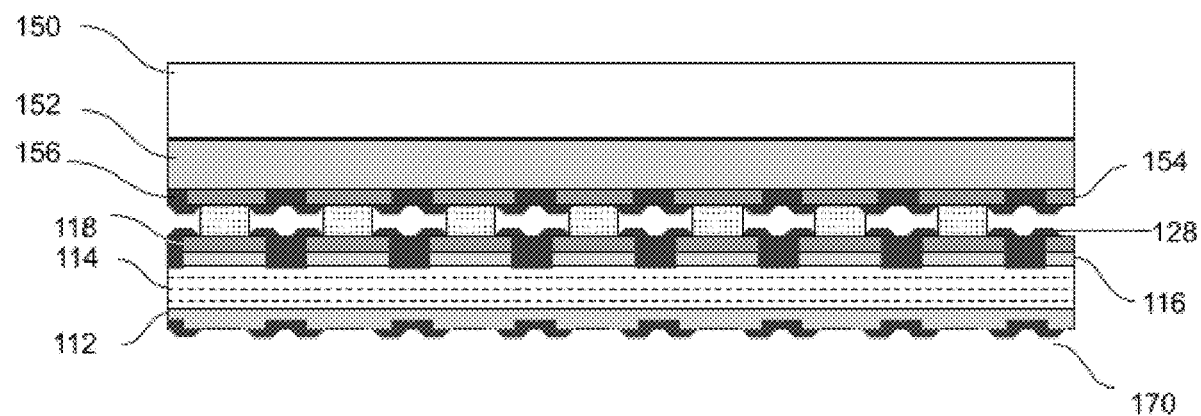
FIG. 1G illustrates a cross-sectional view of the integrated structure after removing the donor substrate and patterning the bottom electrode, in accordance with an embodiment of the present invention.
Figure 1H:
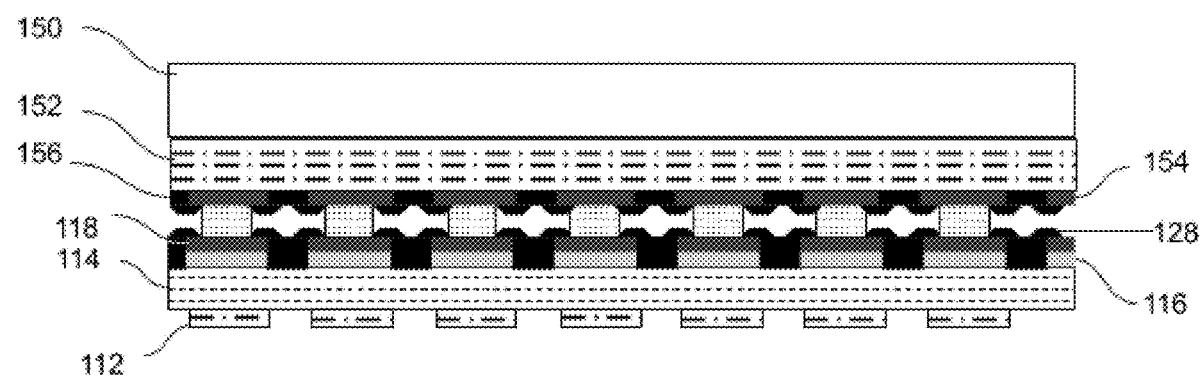
FIG. 1H illustrates a cross-sectional view of the integrated structure after removing the donor substrate and patterning the bottom electrode, in accordance with an embodiment of the present invention.

As shown in FIG. 1G, the donor substrate 110 may be removed from the lateral functional devices, e.g. the conductive layer 112. The conductive layer 112, may be thinned and/or partially or fully patterned. A reflective layer or black matrix 170 may be deposited and patterned to cover the areas on the conductive layer 112 between the pixels. After this stage, other layers may be deposited and patterned depending on the function of the devices. For example, a color conversion layer may be deposited to adjust the color of the light produced by the lateral devices and the pixels in the system substrate 150. One or more color filters may also be deposited before and/or after the color conversion layer. The dielectric layers, e.g. dielectric layer 120, in these devices may be organic, such as polyamide, or inorganic, such as SiN, $SiO_2$, $Al_2O_3$, and others. The deposition may be done with different processes such as plasma-enhanced chemical vapor deposition (PECVD), atomic layer deposition (ALD), and other methods. Each layer may be a composition of one deposited material or different material deposited separately or together. The bonding materials may be deposited only as part of the pads 132 of donor substrate 110 or the system substrate pads 154. There can also be some annealing process for some of the layers. For example, the current distribution layer 118 may be annealed depending on the materials. In one example, the current distribution layer 118 may be annealed at 500° C. for 10 minutes. The annealing may also be done after different steps.

Figure 2A:
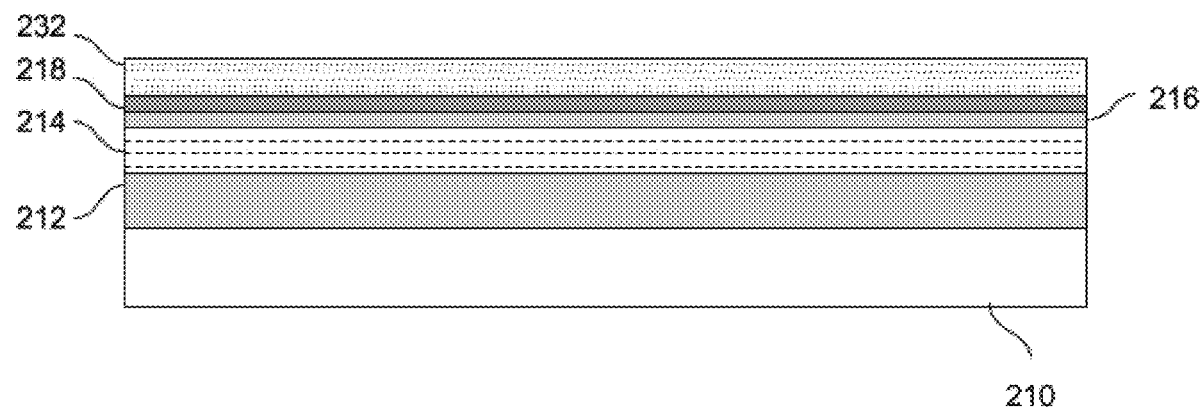
FIG. 2A illustrates a cross-sectional view of another embodiment of a lateral functional structure on a donor substrate with pad layers.
Figure 2B:
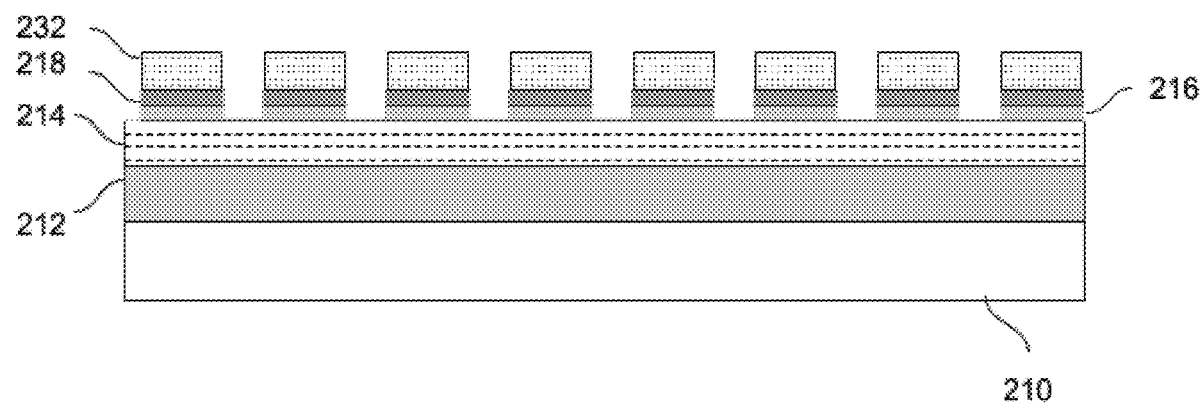
FIG. 2B illustrates a cross-sectional view of the lateral structure of FIG. 2A after patterning the pad layers and the contact and current distribution layers, in accordance with an embodiment of the present invention.
Figure 2C:
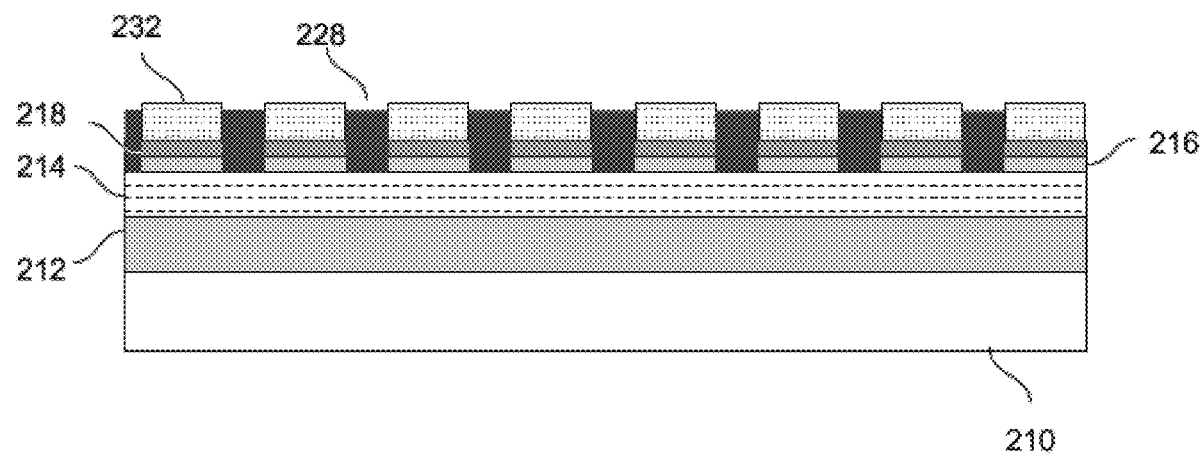
FIG. 2C illustrates a cross-sectional view of the lateral structure of FIG. 2A after the distance between the patterned pads is filled, in accordance with an embodiment of the present invention.
Figure 2D:
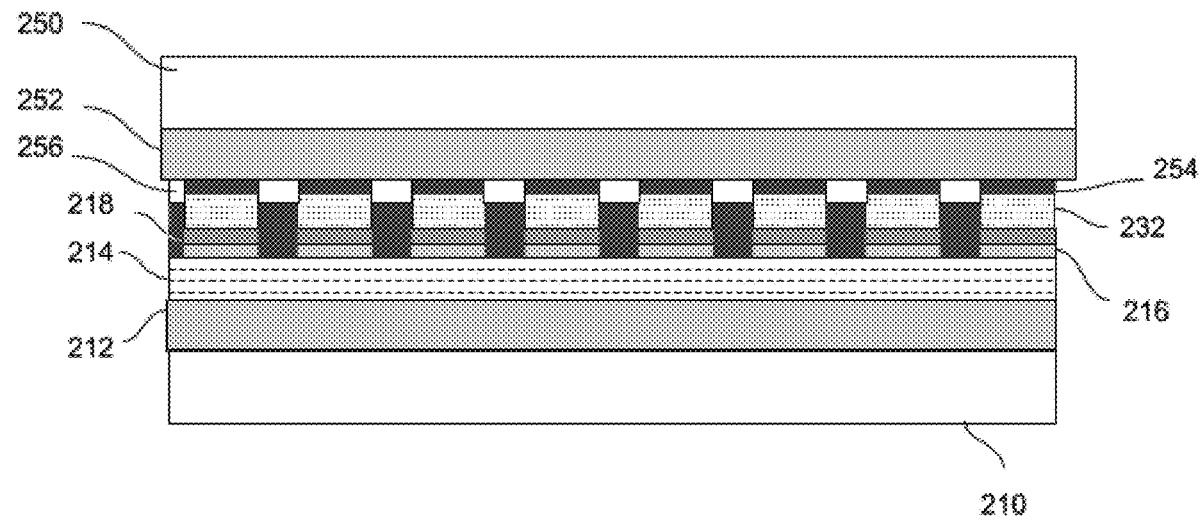
FIG. 2D illustrates a cross-sectional view of the lateral structure of FIG. 2A aligned and bonded to the system substrate through the patterned pads, in accordance with an embodiment of the present invention.
Figure 2E:
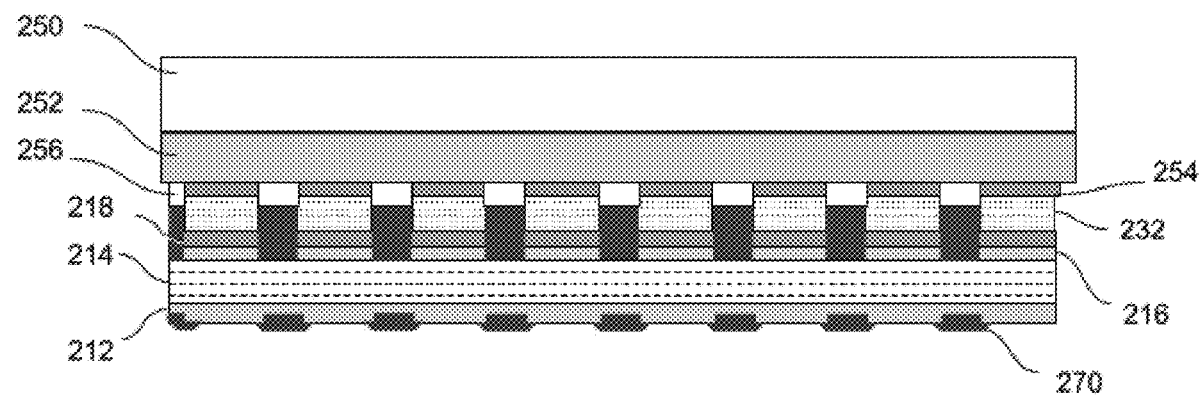
FIG. 2E illustrates a cross-sectional view of the lateral structure of FIG. 2A with the device substrate removed, in accordance with an embodiment of the present invention.

FIG. 2A illustrates an exemplary embodiment of a donor substrate 210 with a lateral functional structure comprising a first top planar or sheet conductive layer 212, functional layers, e.g. light emitting layer, 214, a second bottom pixelated conductive layer 216, a current distribution layer 218, and/or a bonding pad layer 232. FIG. 2B illustrates the patterning of all or one of the layers 216, 218, 232 to form a pixel structure. The conductive layers 212 and 216 may be comprised of a plurality of layers including a highly doped semiconductor layer. Some layers 228, e.g. dielectric, may be used in between the patterned layers 216, 218, and 232 to level the upper surface of the lateral functional structure, as shown in FIG. 2C. The layers 228 can also have other functions, such as a black matrix. The developed structure with pads 232 is bonded to a system substrate 250 with substrate pads 254, as shown in FIG. 2D. The pads 254 in the system substrate may also be separated by a dielectric layer 256. Other layers 252 such as circuitry, planarization layers, and conductive traces may be between the system substrate pads 254 and the system substrate 250. The bonding may be done, for example, through fusion, anodic, thermocompression, eutectic, or adhesive bonding. There may also be other layers deposited in between the system and lateral devices.

The donor substrate 210 may be removed from the lateral functional devices. The conductive layer 212 may be thinned and/or patterned. A reflective layer or black matrix 270 may be deposited and patterned to cover the areas on the conductive layer 212 between the pixels. After this stage, other layers may be deposited and patterned depending on the function of the devices. For example, a color conversion layer may be deposited to adjust the color of the light produced by the lateral devices and the pixels in the system substrate 250. One or more color filters may also be deposited before and/or after the color conversion layer. The dielectric layers, e.g. 228 and 256, in these devices may be organic, such as polyamide, or inorganic, such as SiN, $SiO_2$, Al$_2$O$_3$, and others. The deposition may be done with different process, such as PECVD, ALD, and other methods. Each layer may be a composition of one deposited material or different materials deposited separately or together. The material of the bonding pads 232 may be deposited as part of the pads 232 of the donor substrate 210 or the system substrate pads 254. There can also be some kind of annealing process for some of the layers. For example, the current distribution layer 218 may be annealed depending on the materials. In an example, it may be annealed at 500° C. for 10 minutes. The annealing may also be done after different steps.

Figure 3A:
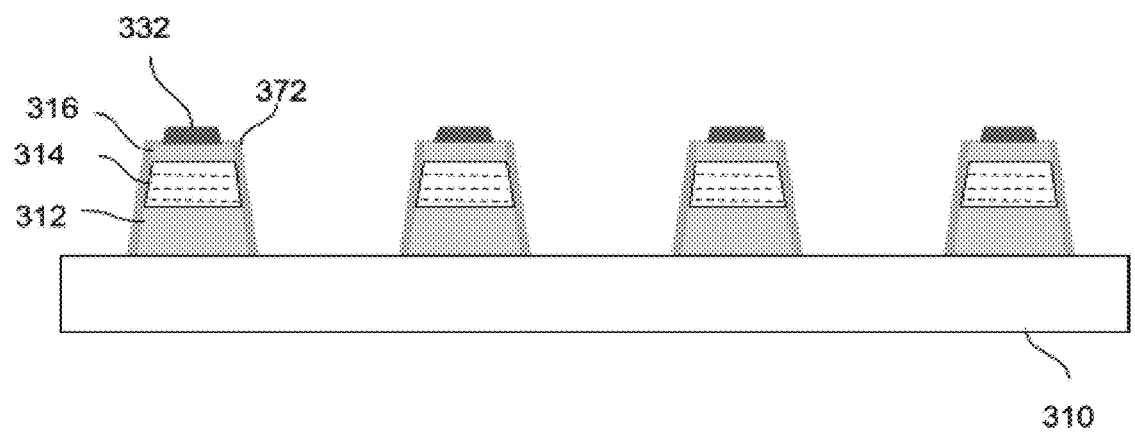
FIG. 3A illustrates a cross-sectional view of a mesa structure on a device (donor) substrate, in accordance with an embodiment of the present invention.
Figure 3B:
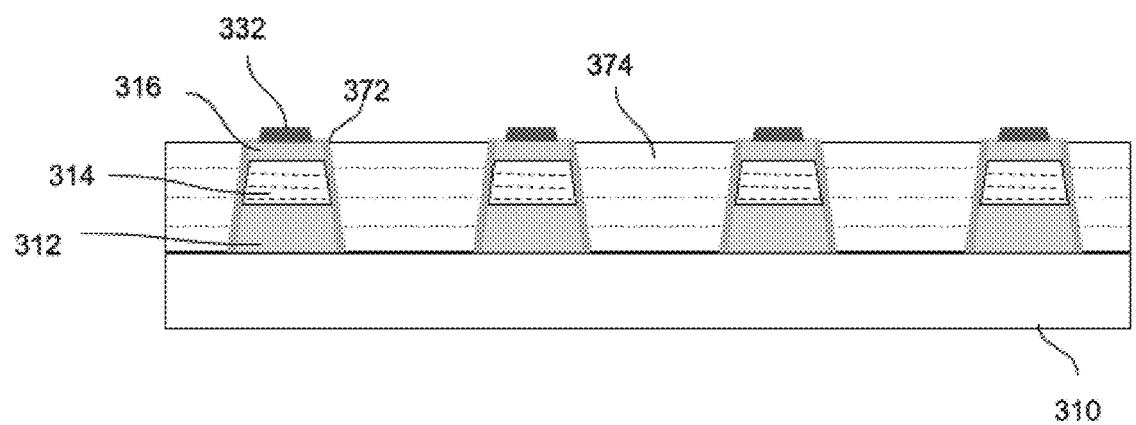
FIG. 3B illustrates a cross-sectional view of the step wherein the empty space between the mesa structures of FIG. 3A is filled, in accordance with an embodiment of the present invention.
Figure 3C:
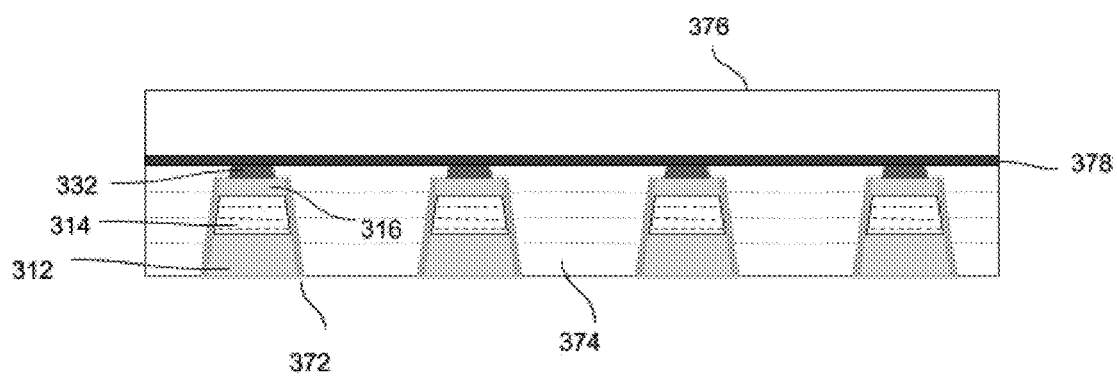
FIG. 3C illustrates a cross-sectional view of the step wherein the devices (mesa structure) of FIG. 3B are transferred to a temporary substrate, in accordance with an embodiment of the present invention.

In another embodiment shown in FIG. 3A, a mesa structure is developed on a donor substrate 310. Microdevice structures are formed by etching through different layers, e.g. a first bottom conductive layer 312, functional layers 314, and a second top conductive layer 316. A top contact 332 may be deposited before or after the etching on top of the top conductive layer 316. In another case a multi-layer contact 332 may be used. In this case, it is possible that part of the contact layers 332 are deposited before etching and part of them after. For example, initial contact layers that create the ohmic contact through annealing with top conductive layer 316 may be deposited first. In one example, the initial contact layer may be gold and nickel. Other layers 372, such as dielectric, or metal insulator structure (MIS), may be also used in between the mesa structures to isolate and/or insulate each structure. After forming the microdevices, a filler layer 374, such as polyamide, may be deposited, as shown in FIG. 3B. The filler layer 374 may also be patterned if only selected microdevices are transferred to the cartridge (temporary) substrate 376 during the next steps. The filler layer 374 also may be deposited after the transfer of the device to a temporary substrate. The filler layer 374 may act as housing for the microdevices. If the filler layer 374 is used before transfer, the lift off process may be more reliable.

Figure 3D:
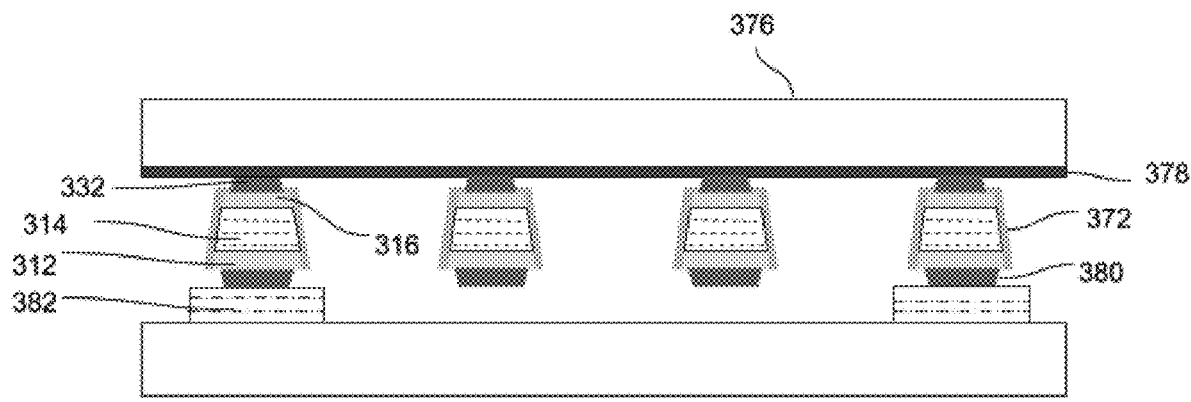
FIG. 3D illustrates a cross-sectional view of the step wherein the devices in FIG. 3C are aligned and bonded to a system substrate, in accordance with an embodiment of the present invention.
Figure 3E:
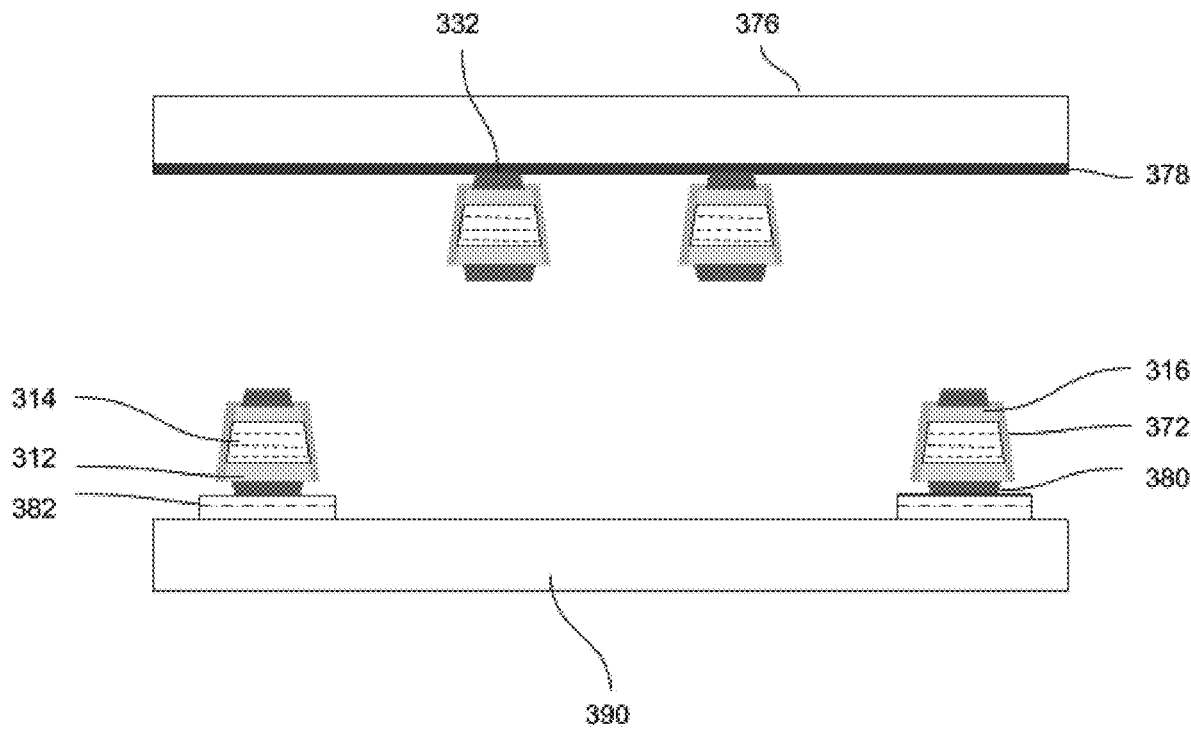
FIG. 3E illustrates a cross-sectional view of the step wherein the devices are transferred to the system substrate, in accordance with an embodiment of the present invention.

The devices are bonded to a temporary substrate (cartridge) 376. The source of bonding may vary, for example, and may comprise one or more of: electrostatic, electromagnetic, adhesive, Van-Der-Waals force, or thermal bonding. For thermal bonding, a substrate bonding layer 378 may be used, which has a melting temperature of T1. The bonding layer 378 may be conductive or comprise a conductive layer and a bonding layer which may be adhesive, thermal, or light assisted. The conductive layer may be used to bias the devices on the substrate 376 to identify defects, and characterize device performance. This structure can be used for other embodiments presented here. To accommodate some surface profile non-uniformity, pressure may be applied during the bonding process. It is possible to remove either the temporary substrate 376 or the donor substrate 310 and leave the device on either of them. The process explained herein is based on leaving the devices in the temporary substrate 376, however, similar steps can be used when the devices are left on the donor substrate 310. After this, an extra process may be done on the microdevices, such as thinning the device, creating a contact bonding layer 380 on the bottom conductive layer 312, or removing the filler layer 374. The devices may be transferred to a system substrate 390 as shown in FIGS. 3D and 3E. The transfer may be done using different techniques. In one case, a thermal bonding is used for transfer. In this case, the contact bonding layer 380 on system substrate contact pads 382 has a melting point of T2 where T2>T1. Here, the temperature higher than T2 will melt both the substrate bonding layer 378 and the contact bonding layer 380 on the pads 382.

In a subsequent step, the temperature is reduced to between T1 and T2. At this point, the device is bonded with the contact bonding layer 380 to the system substrate 390, so that the contact bonding layer 380 is solidified, but the substrate bonding layer 378 melts. Therefore, moving the temporary substrate 376 leaves the microdevices on system substrate 390, as shown in FIG. 3E. This may be selective by applying localized heating to the selected pads 382. Also, a global temperature, e.g. placing the substrates 376 and 390 in an oven and conducting the process by raising the entire atmosphere therein, may be used in addition to the localized heating to improve transfer speed. Here, the global temperature on the temporary substrate 376 or the system substrate 390 may bring the temperature close, e.g. between 5° C. and 10° C., to the melting point of the contact bonding layers 380, and localized temperature can be used to melt the contact bonding layers 380 and the substrate bonding layer 378 corresponding to selected devices. In another case, the temperature may be raised close, e.g. between 5° C. and 10° C., to the melting point of the substrate bonding layer 378 (above the melting point of the contact bonding layers 378) and the temperature transfer from the pads 382 through the device melt the selected areas of the substrate bonding layer 378 for the devices in contact with the heated pads 382.

Figure 3F:
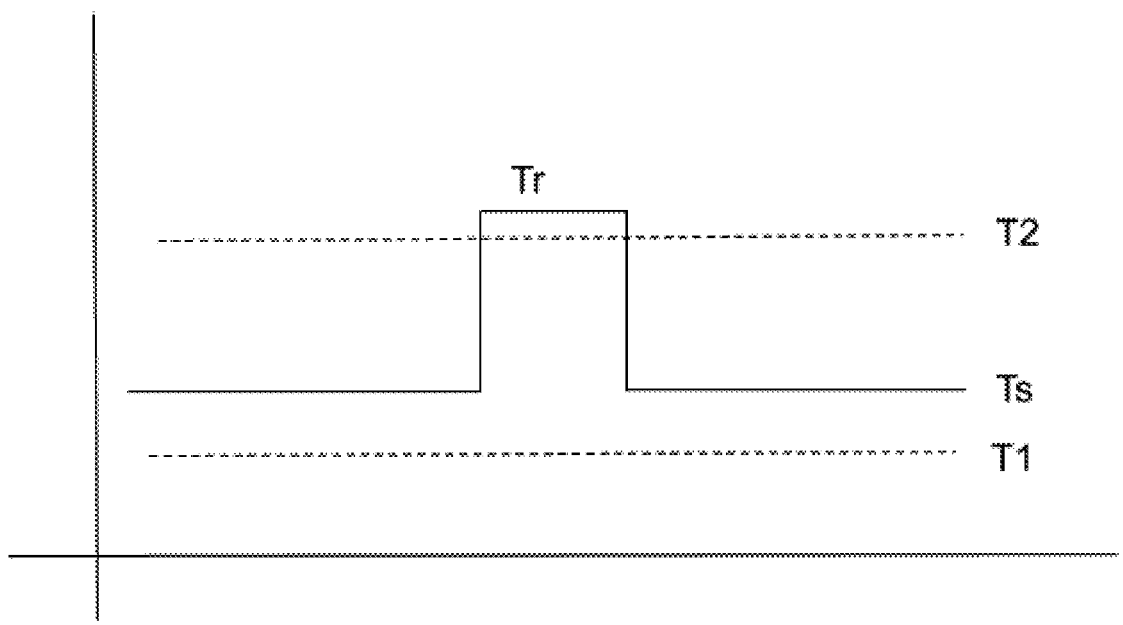
FIG. 3F illustrates a thermal profile for the thermal transfer steps, in accordance with an embodiment of the present invention.

An example of a thermal profile is shown in FIG. 3F where the melting temperature Tr melts both the contact bonding layers 380 and the substrate bonding layer 378 and solidifying temperature Ts solidifies the contact bonding layer 380 with the bond pads 382, while the substrate bonding layer 378 is still melted. The melting may be partial or at least make the bonding layers soft enough to release the microdevice or activate the process to form an alloy. Here, other forces in combination or stand alone may also be used to hold the device on the bond pads 382. In another case, the temperature profile may be created by applying current through the device. As the contact resistance will be higher prior to bonding, the power dissipated across the bond pads 382 and device will be high, melting both the contact bonding layer 380 and the substrate bonding layer 378. As the bonding forms, the resistance will drop and so will the power dissipation, thereby reducing the localized temperature. The voltage or current going through the pads 382 may be used to indicate bonding quality and when to stop the process. The donor substrate 310 and temporary substrate 376 may be the same or different. After the device is transferred to a system substrate 390, different process steps may be done. These extra processing steps may be planarization, electrode deposition, color conversion deposition and patterning, color filter deposition and patterning, and more.

In another embodiment, the temperature to release the microdevice from the cartridge substrate 376 increases as the alloys start to form. In this case, the temperature may be kept constant as the bonding alloy forms on the bonding pads 382 of the receiver substrate 390, and the bonding layers solidify, thereby keeping the microdevice in place on the receiver substrate 390. At the same time, the bonding layer 378 on the cartridge 376 connected to the selected microdevice is still melted (or soft enough) to release the device. Here, the part of the material required to form the alloy may be on the microdevice and the other parts are deposited on the bonding pads 382.

In another embodiment, the filler layer 374 may be deposited on top of the cartridge substrate 376 to form a polymer filler/bonding layer 374/378. The microdevices from the donor substrate 310 may then be pushed into the polymer filler/bonding layer 374/378. The microdevices may then be separated from the donor substrate 310 selectively or generally. The polymer filler/bonding layer 374/378 may be cured before or after the devices are separated from the donor substrate 310. The polymer filler/bonding layer 374/378 may be patterned especially if multiple different devices are integrated into the cartridge substrate 376. In this case, the polymer filler/bonding layer 374/378 may be created for one type, the microdevices buried in the layer and separated from their donor 310. Then another polymer filler/bonding layer 374/378 is deposited and patterned for the next type of microdevices. Then, the second microdevices may be buried in the associated layer 374/378. In all cases, the polymer filler/bonding layer 374/378 may cover part of the microdevices or the entirety of the devices.

Another method to increase the temperature may be using microwaves or lights. Accordingly, a layer may be deposited on the bonding pads 382; on part of the pads 382; on the microdevice; or on part of the cartridge 376 that absorbs the microwave or light and locally heats up the microdevices. Alternatively, the cartridge 376 and/or the receiver substrate 390 may include a heating element that may selectively and/or globally heat up the microdevices.

Other methods may also be used to separate the microdevices from the temporary substrate 376, such as chemical, optical, or mechanical forces. In one example, the microdevices may be covered by a sacrificial layer that may be debonded from the temporary substrate 376 by chemical, optical, thermal, or mechanical forces. The debonding process may be selective or global. Global debonding transfer to the system substrate 390 is selective. If the debonding process of the device from the temporary substrate (cartridge) 376 is selective, the transfer force to the system substrate 390 may be applied either selectively or globally.

The process of transfer from cartridge 376 to receiver substrate 390 may be based on different mechanisms. In one case, the cartridge 376 has bonding materials that release the device at the presence of a light while the same light cures the bonding of the device to the receiver substrate.

In another embodiment, the temperature to cure the bonding layer 380 of the device to the receiver substrate 390 releases the device from the cartridge 376.

In another case, the electrical current or voltage cures the bonding layer 380 of the device to the donor substrate 310. The same current or voltage may release the device from the cartridge 376. Here the release could be a function of piezoelectric effect, or temperature created by the current.

In another method, after curing the bonding of the device to the receiver substrate 390, the bonded devices are pulled out of the cartridge 376. Here, the force holding the device to the cartridge 376 is less than the force bonding the device to the receiver substrate 390.

In another method, the cartridge 376 has vias, which can be used to push devices out of cartridge 376 into the receiver substrate 390. The push can be done with different means, such as using an array of microrods or pneumatically. For a pneumatic structure, the selected devices are disconnected. For microrods, the selected devices are moved toward receiver substrate 390 by passing the microrods through the associated vias with the selected devices. The microrods may have a different temperature to facilitate the transfer. After the transfer of selected devices is finished, the microrods are retracted, either the same rods are aligned with vias of another set of microdevices or a set aligned with the new selected microdevices is used to transfer the new devices.

In one embodiment, the cartridge 376 may be stretched to increase the device pitch in the cartridge 376 to increase the throughput. For example, if the cartridge 376 is 1×1 cm$^2$ with 5 micrometer device pitch, and the receiver substrate 390 (e.g. display) has a 50 micrometer pixel pitch, the cartridge 376 may populate 200×200 (40,000) pixels at once. However, if the cartridge 376 is stretched to 2×2 cm$^2$ with 10 micrometer device pitch, the cartridge 376 may populate 400×400 (160,000) pixels at once. In another case, the cartridge 376 may be stretched so that at least two microdevices on the cartridge 376 become aligned with two corresponding positions in a receiver substrate. The stretch may be done in one or more directions. The cartridge substrate 376 may comprise or consist of a stretchable polymer. The microdevices are also secured in another layer or the same layer as the cartridge substrate 376.

A combination of the methods described above can also be used to transfer microdevices from the cartridge 376 to the receiver substrate 390.

During development of the cartridge (temporary substrate) 376, the devices may be tested to identify different defects and device performance. In one embodiment, before separating the top electrode, the devices may be biased and tested. If the devices are emissive types, a camera (or sensor) may be used to extract the defects and device performance. If the devices are sensors, a stimulus may be applied to the devices to extract defects and performance. In another embodiment, the top electrode 332 may be patterned to group to test before being patterned to individual devices. In another example, a temporary common electrode between more than one device is deposited or coupled to the devices to extract the device performance and/or extract the defects.

The methods described above related to FIGS. 3A-3D including but not limited to separation, formation of filler layers, different roles of filler layers, testing, and other structures may be used for other structures including the ones described hereafter.

The methods discussed here to transfer microdevices from the cartridge (temporary substrate) 376 to the receiver substrate 390 may be applied to all of the cartridge and receiver substrate configurations presented here.

The devices on donor substrate 310 may be developed to have two contacts 332 and 380 on the same side facing away from the donor substrate 310. In this embodiment, the conductive layer on the cartridge 376 can be patterned to bias the two contacts 332 and 380 of the device independently. In one case, the devices may be transferred to the receiver substrate 390 directly from the cartridge substrate 376. Here, the contacts 332 and 380 may not be directly bonded to the receiver substrate 390, i.e. the receiver substrate 390 does not need to have special pads. In this case, conductive layers are deposited and patterned to connect the contacts 332 and 380 to a proper connection in the receiver substrate 390. In another embodiment, the devices may be transferred to a temporary substrate first from the cartridge 376 prior to being transferred to the receiver substrate 390. Here, the contacts 332 and 380 may be bonded directly to the receiver substrate pads 382. The devices may be tested either in the cartridge 376 or in the temporary substrate.

Figure 4A:
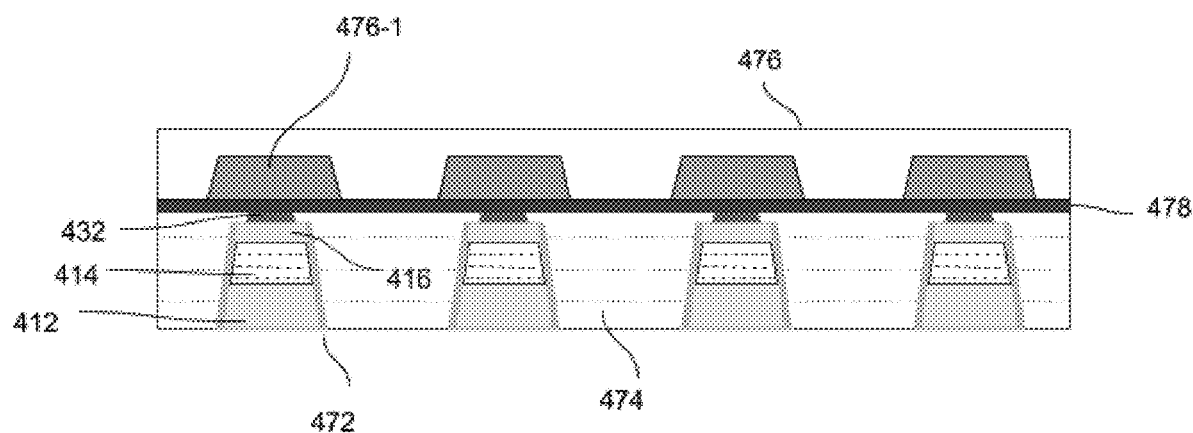
FIG. 4A illustrates a cross-sectional view of a temporary substrate with grooves and devices transferred thereto, in accordance with an embodiment of the present invention.

In another embodiment shown in FIG. 4A, a mesa structure is developed on a donor substrate, as hereinbefore described, with microdevice structures formed by etching through different layers, e.g. a first bottom conductive layer 412, functional layers, e.g. light emitting layer, 414, and a second top conductive layer 416. A top contact 432 may be deposited before or after the etching on top of the top conductive layer 416.

Figure 4B:
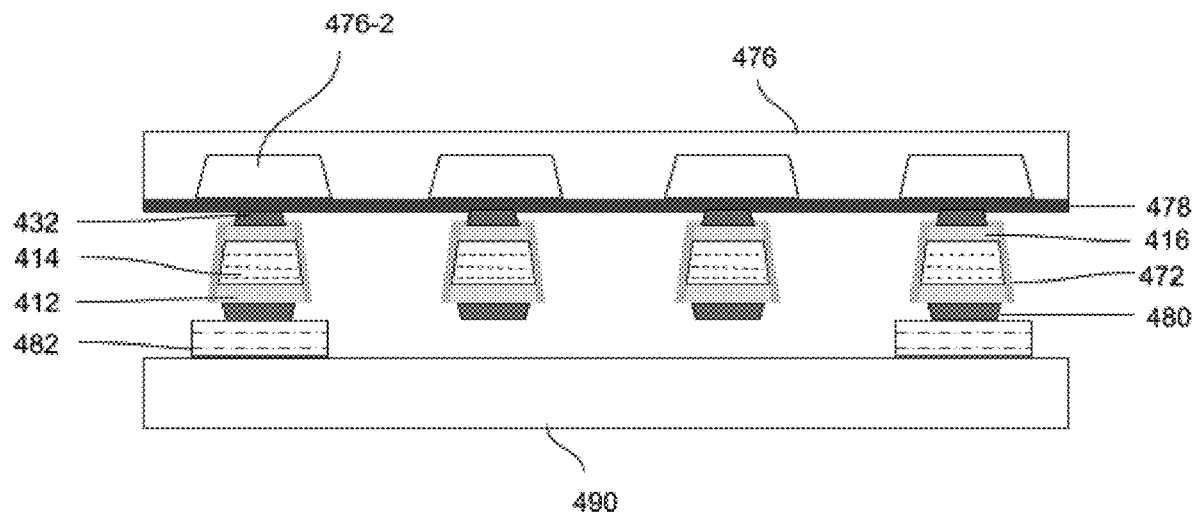
FIG. 4B illustrates a cross-sectional view of the temporary substrate of FIG. 4A after cleaning the filling between the device space and the grooves, in accordance with an embodiment of the present invention.
Figure 4C:
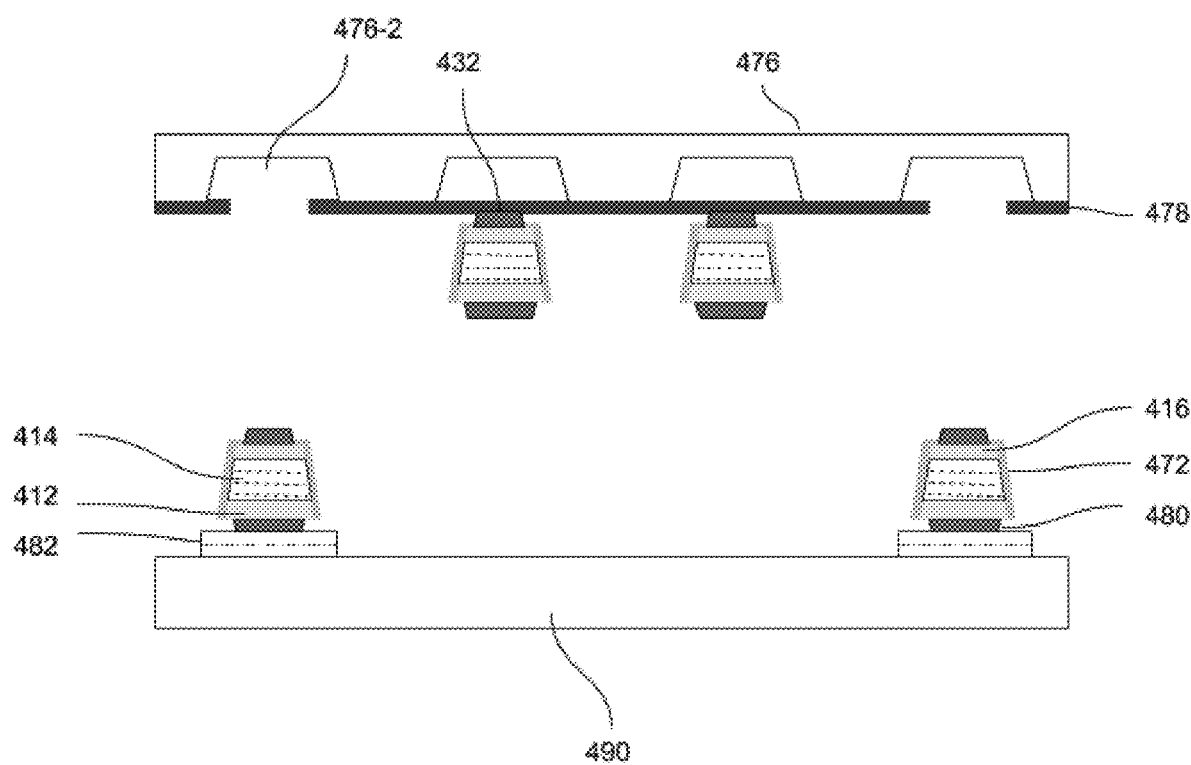
FIG. 4C illustrates a cross-sectional view of the step wherein the devices are transferred to a system substrate by breaking the released surface, in accordance with an embodiment of the present invention.

A temporary substrate 476 includes a plurality of grooves 476-2 that are initially filled with filler materials, e.g. soft materials, such as polymers, or solid materials, such as SiO$_2$, SiN, etc. The grooves 476-2 are underneath the surface and/or the substrate bonding layer 478. The devices are transferred to the temporary substrate 476 on top of the grooves 476-2, and the devices include a contact pad 432. Also, each microdevice may include other passivation layers and/or MIS layer 472 surrounding each microdevice for isolation and/or protection. The space between the devices may be filled with filling material 474. After post processing the devices, another lower contact pad 480 may be deposited on the opposite surface of the device. The contact layer 412 may be thinned prior to the deposition of the lower contact pad 480. The filling material 474 may then be removed and the grooves may be emptied by various suitable means, for example chemical etching or evaporation, to cause or facilitate the release of the surface and/or selected sections of the bonding layer 478. A similar process as previously described above may be used to transfer the devices to the system (receiver) substrate 490. In addition, in another embodiment, forces applied from the pads 432, e.g. a pushing or pulling force, may break the surface and/or bonding layer 478 above the evacuated grooves 476-2, while maintaining the unselected mesa structures attached to the temporary substrate. This force can release the devices from the temporary substrate 476 as well, as shown in FIG. 4B and FIG. 4C. The depth of the grooves 476-2 may be selected to manage some of the microdevice height differences. For example, if the height difference is H, the depth of the groove may be larger than H.

The devices on substrate 310 can be developed to have two contacts 432 and 480 on the same side facing away from the substrate 310. In this case, the conductive layer on the cartridge 476 can be patterned to bias the two contacts of the device independently. In one case, the devices may be transferred to the receiver substrate directly from the cartridge substrate 476. Here, the contacts 432 and 480 will not be directly bonded to the receiver substrate (receiver substrate does not need to have special pads). In this case, conductive layers are deposited and patterned to connect the contacts 432 and 380 to a proper connection in the receiver substrate. In another case, the devices may be transferred to a temporary substrate first from the cartridge 476 prior to being transferred to the receiver substrate. Here, the contacts 432 and 480 can be bonded directly to the receiver substrate pads. The devices can be tested either in the cartridge or in the temporary substrate.

Figure 5A:
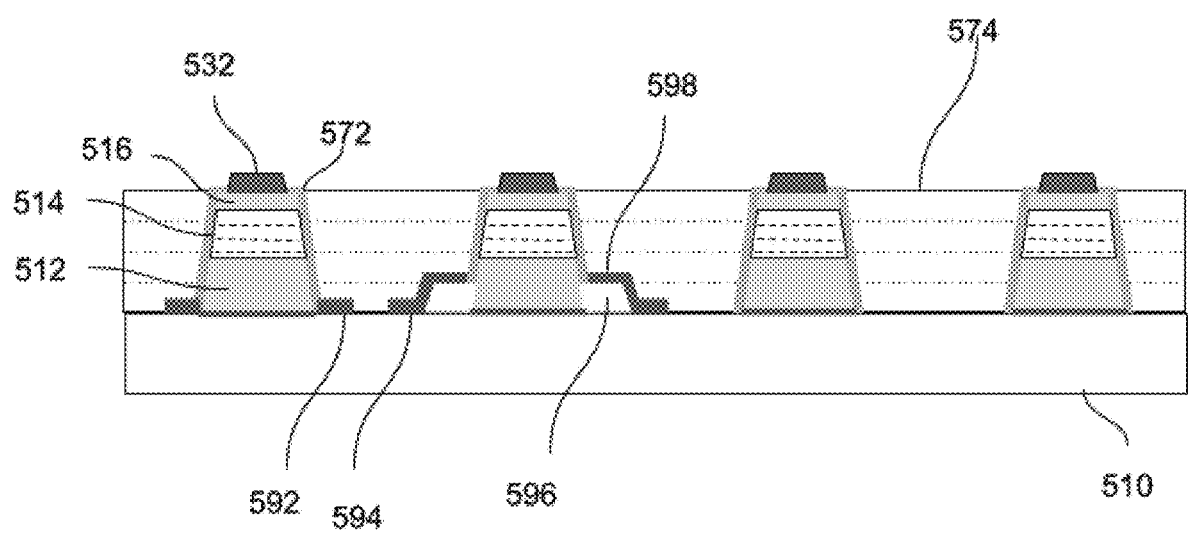
FIG. 5A illustrates a cross-sectional view of microdevices with different anchors in a filling layer, in accordance with an embodiment of the present invention.

In another embodiment shown in FIG. 5A, a mesa structure is developed on a donor substrate 510, as hereinbefore described, with microdevice structures formed by etching through different layers, e.g. a first bottom conductive layer 512, functional layers, e.g. light-emitting layer, 514, and a second top conductive layer 516. A top contact pad 532 may be deposited before or after the etching on top of the top conductive layer 516. Also, each microdevice may include other passivation layers and/or MIS layer 572 surrounding each microdevice for isolation and/or protection. In this embodiment the devices may be provided with different anchors, whereby after liftoff of the devices, the anchor holds the device to the donor substrate 510. The lift off may be done by laser. In an example, only the devices are scanned by a laser. In an embodiment a mask may be used that has an opening for the device only at the back of the donor substrate 510 to block the laser from the other area. The mask can be separate or part of the donor substrate 510. In another case, another substrate can be connected to the devices before the liftoff process to hold the devices. In another case, a filler layer 574, e.g. dielectric, may be used between the devices.

In a first illustrated case, a layer 592 is provided to hold the device to the donor substrate 510. The layer 592 may be a separate layer or part of the layers of the microdevices that are not etched during mesa structure development. In another case, the layer 592 may be a continuation of one of the layers 572. In this case, the layer 592 may be either a metal or dielectric layer (SiN or $SiO_2$, or other materials). In another case, the anchor is developed as a separate structure comprising extensions 594, a void/gap 596, and/or a bridge 598. Here, a sacrificial layer is deposited and patterned with the same shape as the gap/void 596. Then the anchor layer is deposited and patterned to form the bridge 598 and/or the extension 594. The sacrificial material may be removed later to create the void/gap 596. One can avoid the extension 594 as well. Similar to the previous anchor 592, another anchor may be made of different structural layers. In another case, the filling layers 574 act as anchor. In this case, the filling layers 574 can be etched or patterned or left as is.

Figure 5B:
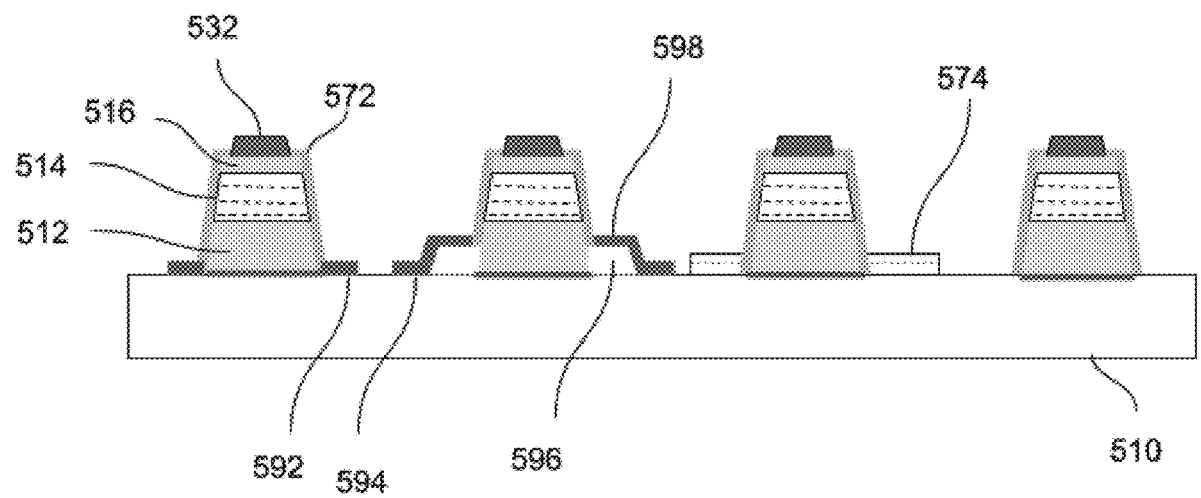
FIG. 5B illustrates a cross-sectional view of microdevices after post processing the filling layer, in accordance with an embodiment of the present invention.

FIG. 5B illustrates the samples after removing the filler layer 574 and/or etching the filler layer to create the anchor. In another case, the adhesive force of the bridge layer 598 after liftoff is enough to hold the device in place and act as an anchor. The final device on the right side of FIG. 5B is shown in one substrate 510 for illustration purposes only. One can use either one or a combination of them in a substrate.

Figure 5C:
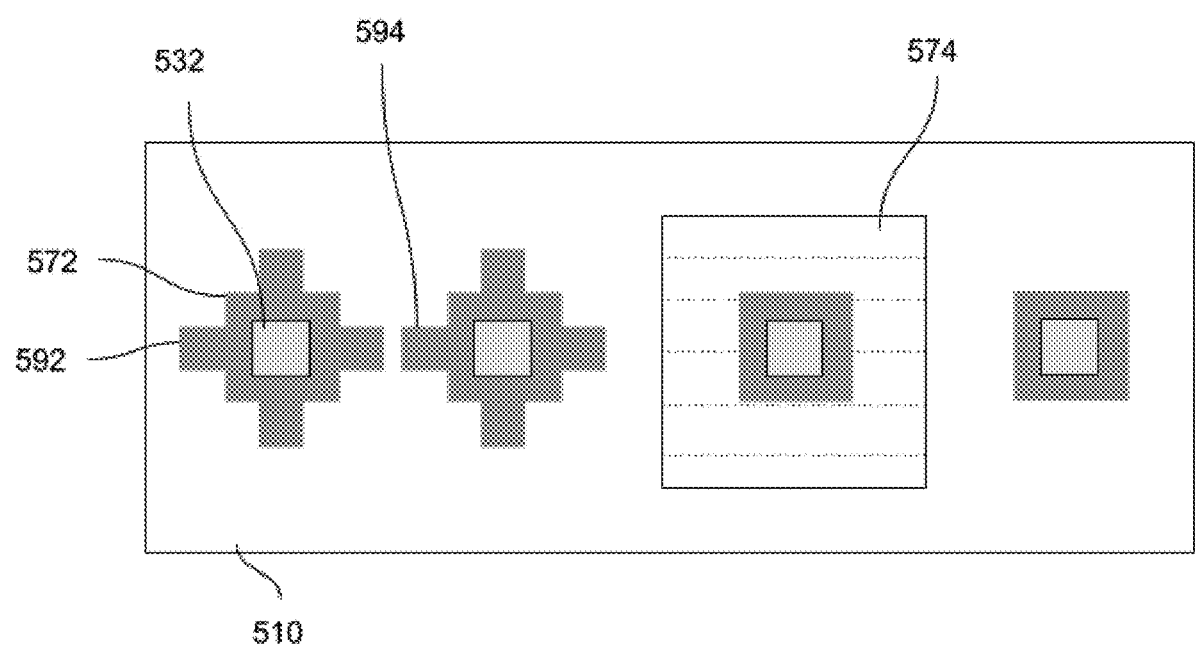
FIG. 5C illustrates a top view of the microdevices of FIG. 5B, in accordance with an embodiment of the present invention.

As shown in FIG. 5C, the anchor may cover at least a portion of or the entire periphery of the device, or it can be patterned to form arms 594 and 592. Either of the structures may be used for any of the anchor structures.

Figure 5D:
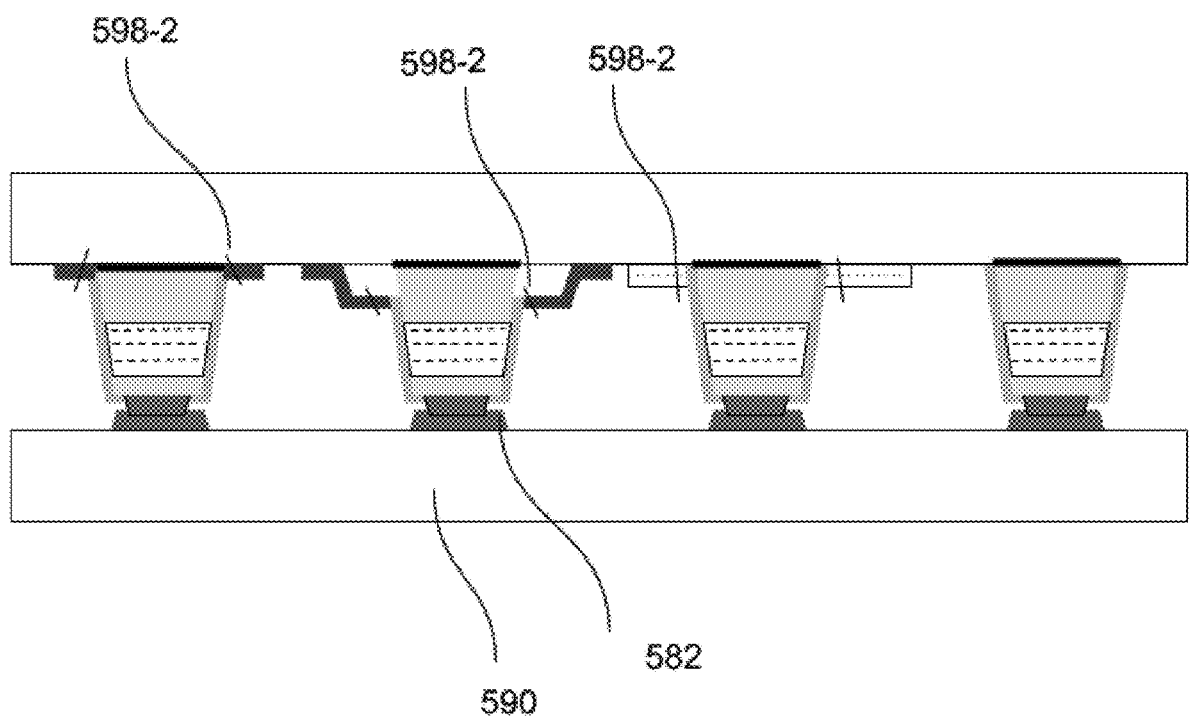
FIG. 5D illustrates a cross-sectional view of the transfer step used to transfer the microdevices to another substrate, in accordance with an embodiment of the present invention.
Figure 5E:
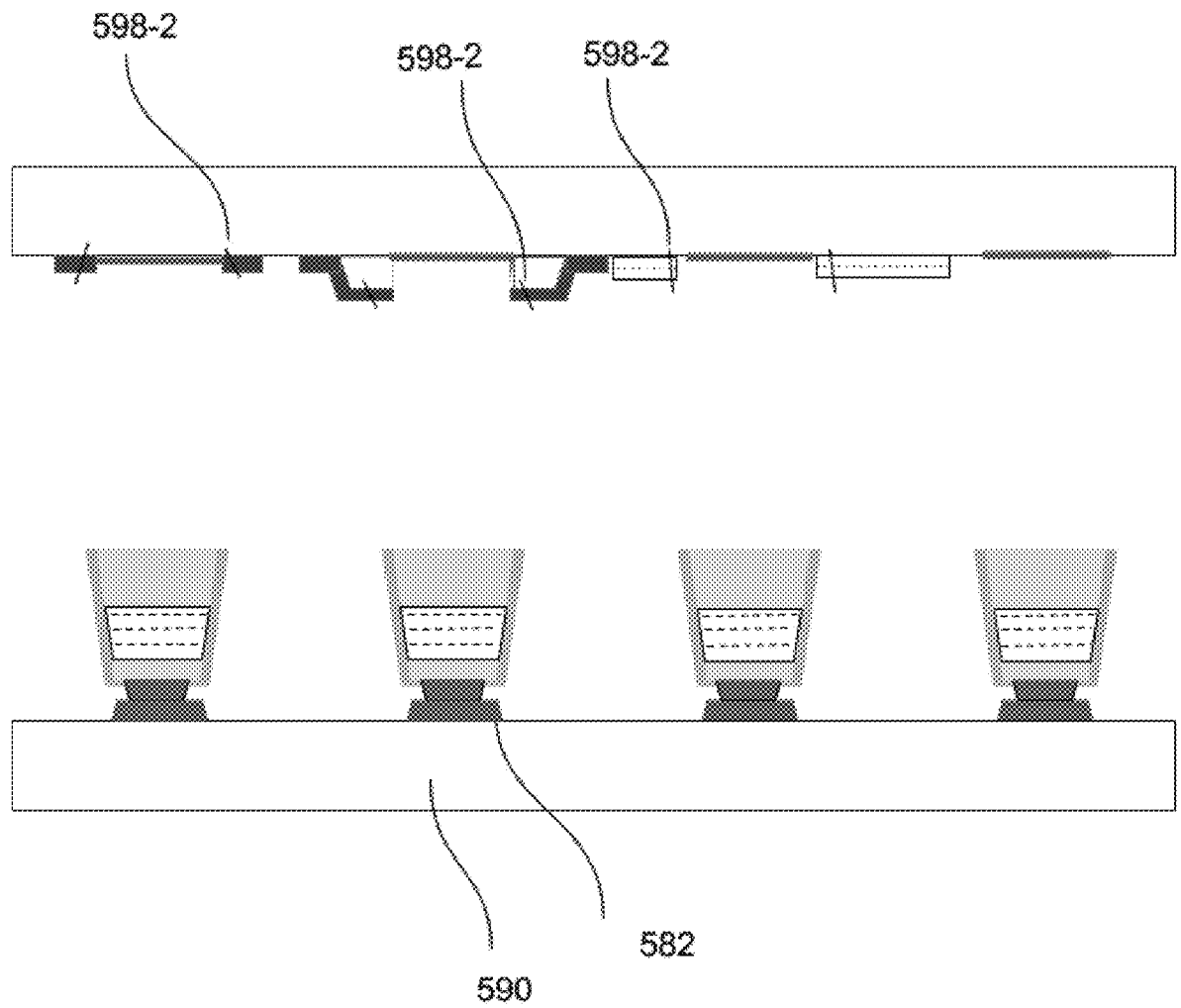
FIG. 5E illustrates a cross-sectional view of transferring microdevices to the substrate, in accordance with an embodiment of the present invention.

FIG. 5D illustrates one example of transferring the devices to a receiver substrate 590. Here the microdevices are bonded to the pads 582 or placed in a predefined area without any pads. The pressure force or separation force may release the anchor by breaking them. In another case, temperature may also be used to release the anchor. The viscosity of the layer between the lift off of the microdevice and the donor substrate 510 may be increased to act as an anchor by controlling the temperature. FIG. 5E illustrates the devices after they are transferred to the receiver substrate 590 and shows the possible release point 598-2 in the anchors. The anchor may also be directly connected to the donor substrate 510 or indirectly through other layers.

The devices on donor substrate 510 may be developed to have two contacts 532 and 480 on the same side facing away from the donor substrate 510. In one case, the devices may be transferred to the receiver substrate 590 directly from the donor substrate 510. Here, the contacts 532 and 480 may be bonded directly to the receiver substrate pads 582. The devices may be tested either in the donor substrate 510 or in the cartridge. In another embodiment, the devices may be transferred to a cartridge substrate first from the donor substrate 510 prior to being transferred to the receiver substrate 590. Here, the contacts 532 will not be directly bonded to the receiver substrate 590, i.e. the receiver substrate 590 does not need to have special pads 582. In this case, conductive layers are deposited and patterned to connect the contacts 532 to a proper connection in the receiver substrate 590.

The system or receiver substrate 390, 490 and 590 may comprise microLEDs, organic LEDs, sensors, solid state devices, integrated circuits, MEMS (microelectromechanical systems), and/or other electronic components. Other embodiments are related to patterning and placing microdevices in respect to the pixel arrays to optimize the microdevice utilizations in the selective transfer process. The system or receiver substrate 390, 490 and 590 may be, but is not limited to, a printed circuit board (PCB), thin film transistor backplane, integrated circuit substrate, or, in one case of optical microdevices such as LEDs, a component of a display, for example a driving circuitry backplane. Patterning microdevice donor and receiver substrates can be used in combination with different transfer technology including but not limited to pick and place with different mechanisms (e.g. electrostatic transfer head, elastomer transfer head), or direct transfer mechanism such as dual function pads and more.

Figure 6A:
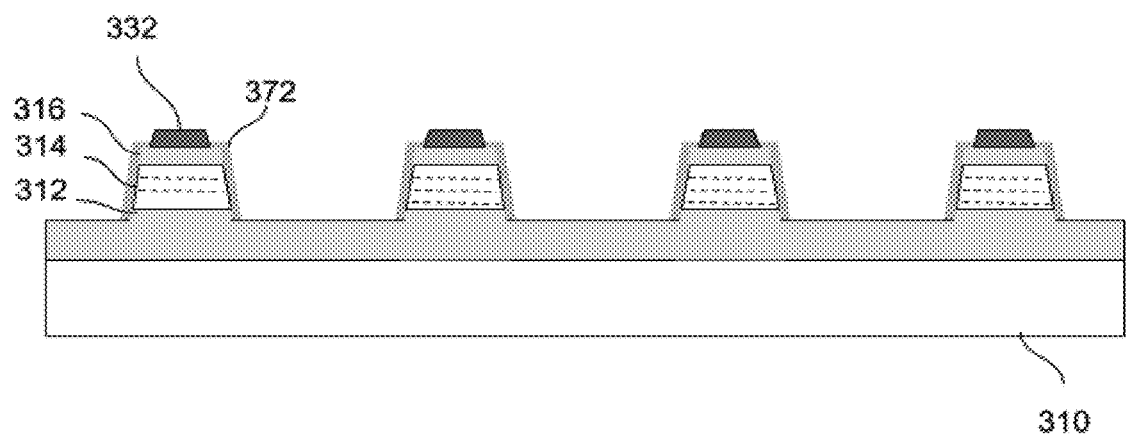
FIG. 6A illustrates a cross-sectional view of a mesa structure on a device (donor) substrate, in accordance with another embodiment of the present invention.
Figure 6B:
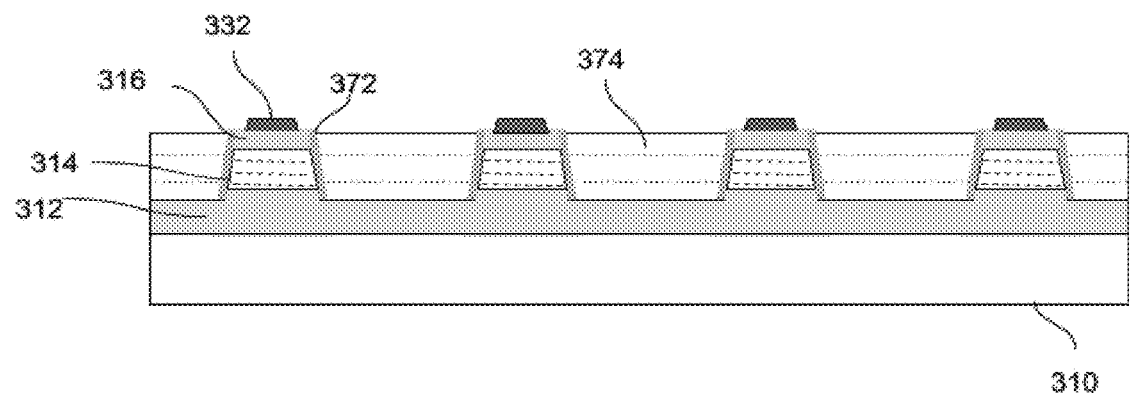
FIG. 6B illustrates a cross-sectional view of the step wherein the empty space between the mesa structures of FIG. 6A is filled.
Figure 6C:
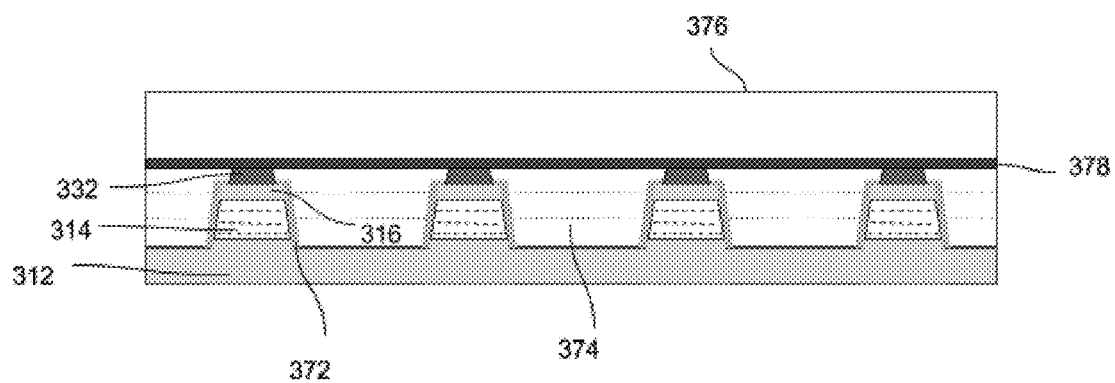
FIG. 6C illustrates a cross-sectional view of the step wherein the devices (mesa structure) of FIG. 6B are transferred to a temporary substrate, in accordance with an embodiment of the present invention.
Figure 6D:
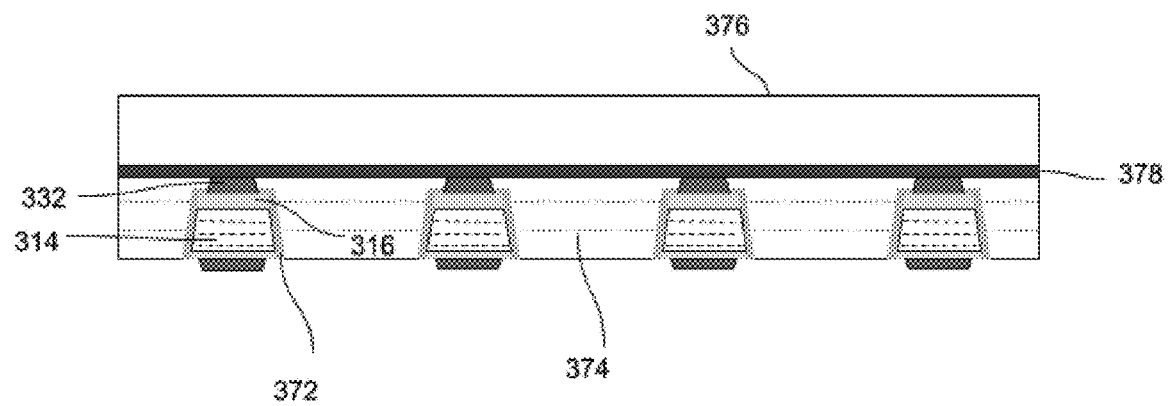
FIG. 6D illustrates a cross-sectional view of the step wherein the portions of the bottom conductive layer of FIG. 6C are removed, in accordance with an embodiment of the present invention.
Figure 6E:
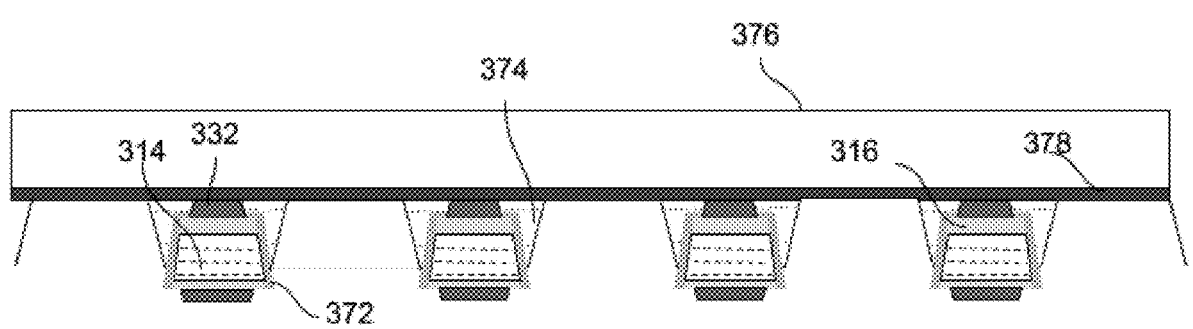
FIG. 6E illustrates a cross-sectional view of microdevices with anchors in a filling layer, in accordance with an embodiment of the present invention.
Figure 6F:
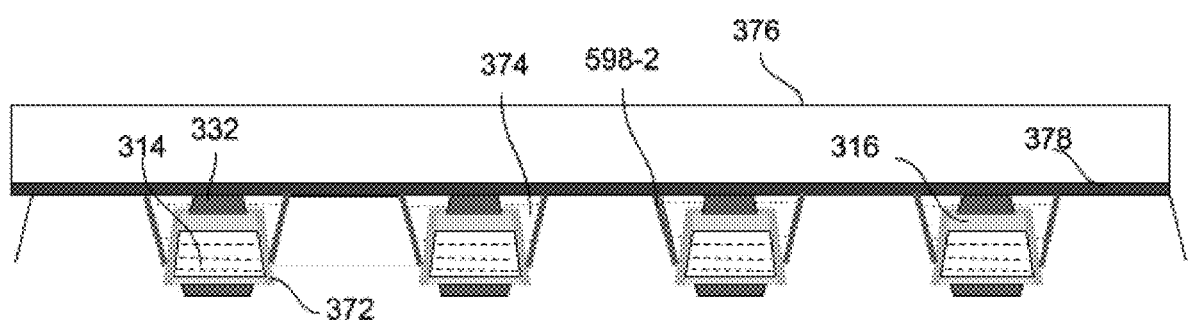
FIG. 6F illustrates a cross-sectional view of microdevices with anchors in a filling layer, in accordance with an embodiment of the present invention.
Figure 6G:
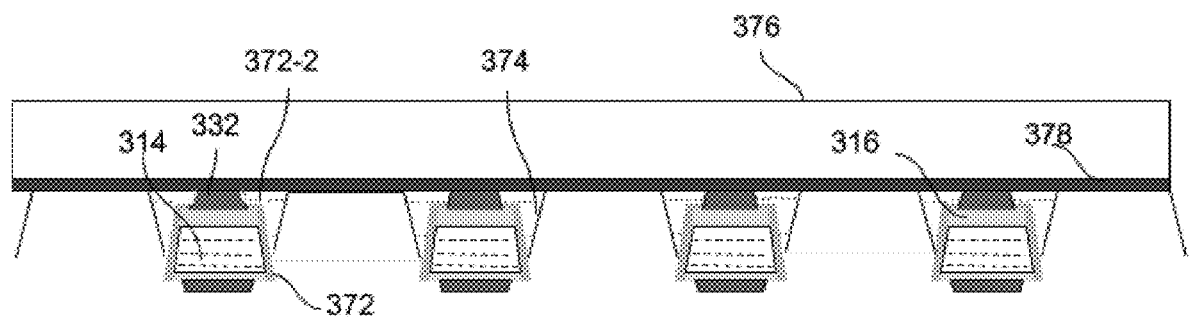
FIG. 6G illustrates a cross-sectional view of microdevices with anchors in a filling layer, in accordance with an embodiment of the present invention.

FIG. 6A illustrates an alternative embodiment of the mesa structure of FIGS. 3A to 3F, in which the mesa structure is not etched through all of the layers initially. Here, the buffer layers 312 and/or some portion of the contact layer 312 may remain during the initial steps. The mesa structure is developed on the donor substrate 310. Microdevice structures are formed by etching through different layers, e.g. a first bottom conductive layer 312, functional layers 314, and the second top conductive layer 316. A top contact 332 may be deposited before or after the etching on top of the top conductive layer 316 The mesa structure can include other layers 372 that will be deposited and patterned before or after forming the mesa structure. These layers may be dielectric, MIS, contact, sacrificial, and more. After the mesa structure development, filler layer(s), e.g. dielectric material, 374 is used in between and around the microdevices to secure the microdevices together. The microdevices are bonded to a temporary substrate 376 by substrate bonding layer(s) 378. Bonding layer(s) 378 may provide one or more different forces, such as electrostatic, chemical, physical, thermal, and so on. After the devices are removed from the donor substrate 310, as hereinbefore described, the extra portion of the bottom conductive layers 312 may be etched away or patterned to separate the devices (FIG. 6C). Other layers may be deposited and patterned, such as the contact bonding layer 380. Here, one can etch the filler layer 374 to separate microdevices, or remove the sacrificial layer to separate the devices. In another embodiment, temperature may be applied to separate the devices from the filler layer 374 and ready them for transfer to the receiver substrate 390. The separation may be done selectively, as hereinbefore described. In another embodiment, the filler layer 374 may be etched to form a housing, base, or anchor 375, at least partially surrounding each microdevice, e.g. in a frustum or frusto-pyramidal shape, as shown in FIG. 6E. Another layer may be deposited over the base 375, and used to make anchors 598-2. The filler base layer 375 may be left or be removed from the anchor setup after the extra layers 598-2 are formed. FIG. 6G shows a device with a sacrificial layer 372-2. The sacrificial layer 372-2 may be either removed by etching or can be thermally deformed or removed.

In another embodiment, the anchor is the same as housing 375 and is built by polymer, organic, or other layers after the microdevices are transferred to the cartridge 376. The housing 375 may have different shapes. In one case the housing may match the device shape. The housing sidewalls may be shorter than the microdevice height. The housing sidewall may be connected to the microdevice prior to the transfer cycle to provide support for different microdevice post processing in the cartridge 376 and packaging microdevice cartridges for shipment and storage. The housing sidewalls may be separated or the connection to the microdevice may be weakened from the device prior to or during the transfer cycle by different means such as heating, etching, or light exposure.

The devices on the donor substrate 310 may be developed to have two contacts 332 and 380 on the same side facing away from the donor substrate 310. In this case, the conductive layer on the cartridge 376 may be patterned to bias the two contacts 332 and 380 of the device independently. In one case, the devices may be transferred to the receiver substrate 390 directly from the cartridge substrate 376. Here, the contacts 332 and 380 will not be directly bonded to the receiver substrate 390, i.e. the receiver substrate 390 does not need to have special pads. In this case, conductive layers are deposited and patterned to connect the contacts 332 and 380 to a proper connection in the receiver substrate 390. In another embodiment, the devices may be transferred to a temporary substrate first from the cartridge 376 prior to being transferred to the receiver substrate 390. Accordingly, the contacts 332 and 380 may be bonded directly to the receiver substrate pads. The devices can be tested either in the cartridge 376 or in the temporary substrate.

Figure 6H:
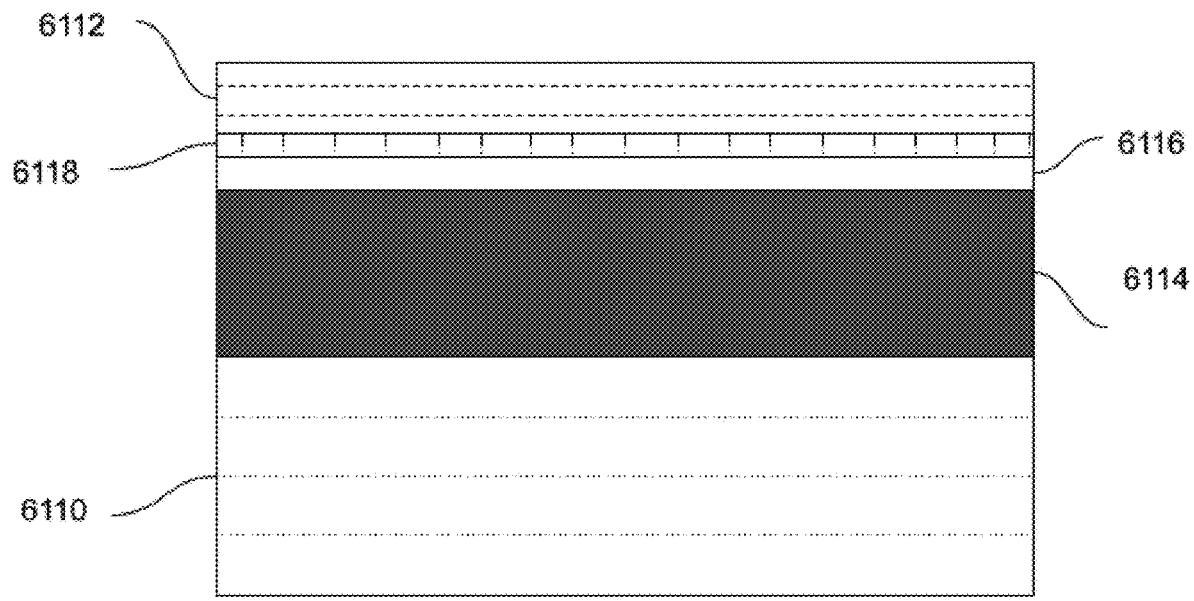
FIG. 6H illustrates a cross-sectional view of a preliminary step in another embodiment of the present invention.

Due to a mismatch between the substrate crystal lattice and the microdevice layers, the growth of the layers contains several defects, such as dislocation, void, and others. To reduce the defects, at least one first and/or second buffer layer 6114 and 6118 with a separation layer 6116 therebetween or adjacent to may be deposited first on a donor substrate 6110, and the active layers 6112 are subsequently deposited over the buffer layers 6114 and/or 6118. The thickness of the buffer layers 6114 and 6118 may be substantial, e.g. as thick as the donor substrate 6110. During the separation (lift off) of the microdevice from the donor substrate 6110, the buffer layer 6114/6118 may also be separated. Therefore, the buffer layer deposition should be repeated every time. FIG. 6H illustrates a structure on the substrate 6110 in which the separation layer 6116 is between the first buffer layer 6114 and the actual device layers 6112. There may be a second buffer layer 6118 between the separation layer 6116 and the device layers 6112. The second buffer layer 6118 may also block the contamination from the separation layer 6116 from penetrating the device layers 6112. Both buffer layers, 6114 and 6118 may comprise more than one layer. The separation layer 6116 may also comprise a stack of different materials. In one example, the separation layer 6116 reacts to a wavelength of light that other layers are not responding to. This light source may be used to separate the actual device 6112 from the buffer layer(s) 6114/6118 and the donor substrate 6110. In another example, the separation layer 6116 reacts to chemicals while the same chemicals do not affect other layers. This chemical can be used to remove or change the property of the separation layer 6116 to separate the device from the buffer layer(s) 6114/6118 and the substrate 6110. This method leaves the first buffer layer 6114 intact on the donor substrate 6110 and therefore it can be reused for the next device development. Before the next device deposition, some surface treatment, such as cleaning or buffering, may be done. In another example, the buffer layer(s) 6114/6118 may comprise zinc-oxide.

Figure 6I:
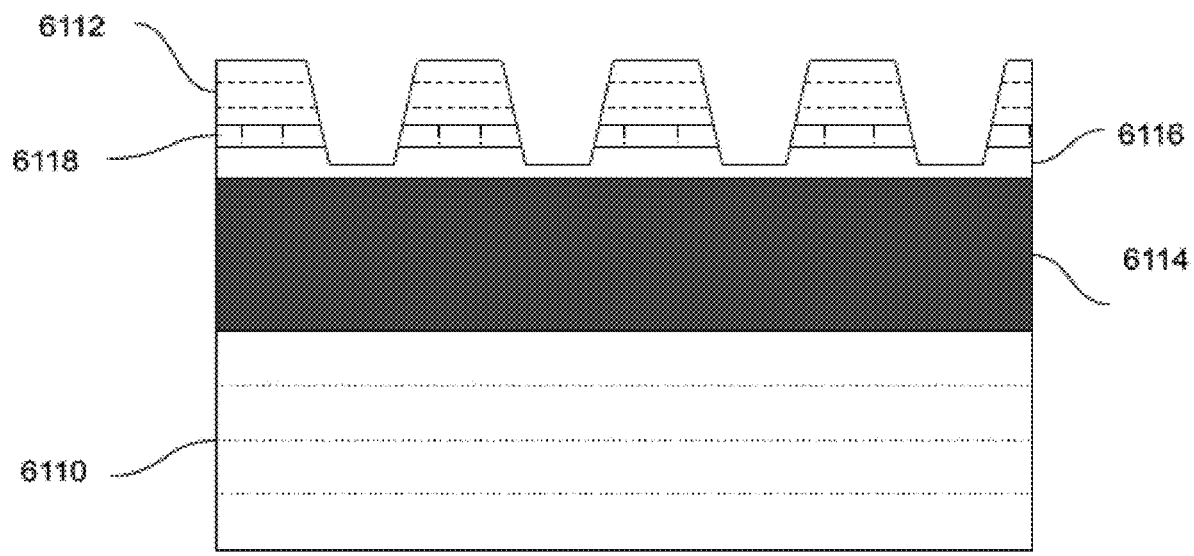
FIG. 6I illustrates a cross-sectional view of an etching step in the embodiment of FIG. 6H, in accordance with an embodiment of the present invention.
Figure 6J:
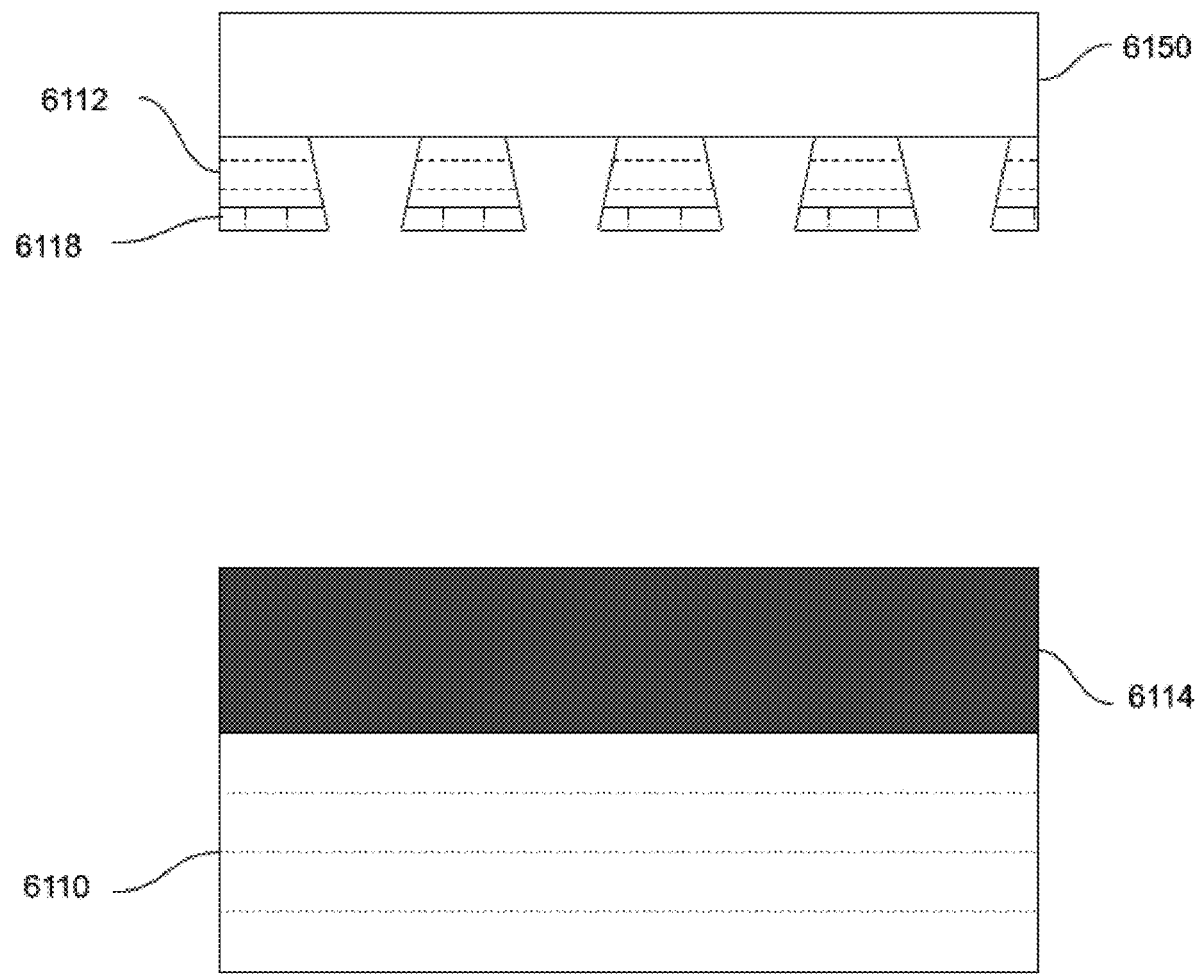
FIG. 6J illustrates a cross-sectional view of a separation step in the embodiment of FIG. 6H, in accordance with an embodiment of the present invention.

The microdevices may be separated by different etching processes, as demonstrated in FIG. 6I, prior to the separation process (lift off). The etching may etch the second buffer layer (if existing) 6118 and also part or all of the separation layer 6116, as well as the device layers 6112. In another example, either the second buffer layer 6118 or the separation layer 6116 are not etched. After the etching step, the microdevices are temporarily (or permanently) bonded to another substrate 6150 and the separation layer 6116 is removed or modified to separate the microdevices from the first and second buffer layer(s) 6114/6118. As demonstrated in FIG. 6J, the first buffer layer 6114 may stay substantially intact on the donor substrate 6110.

Figure 6K:
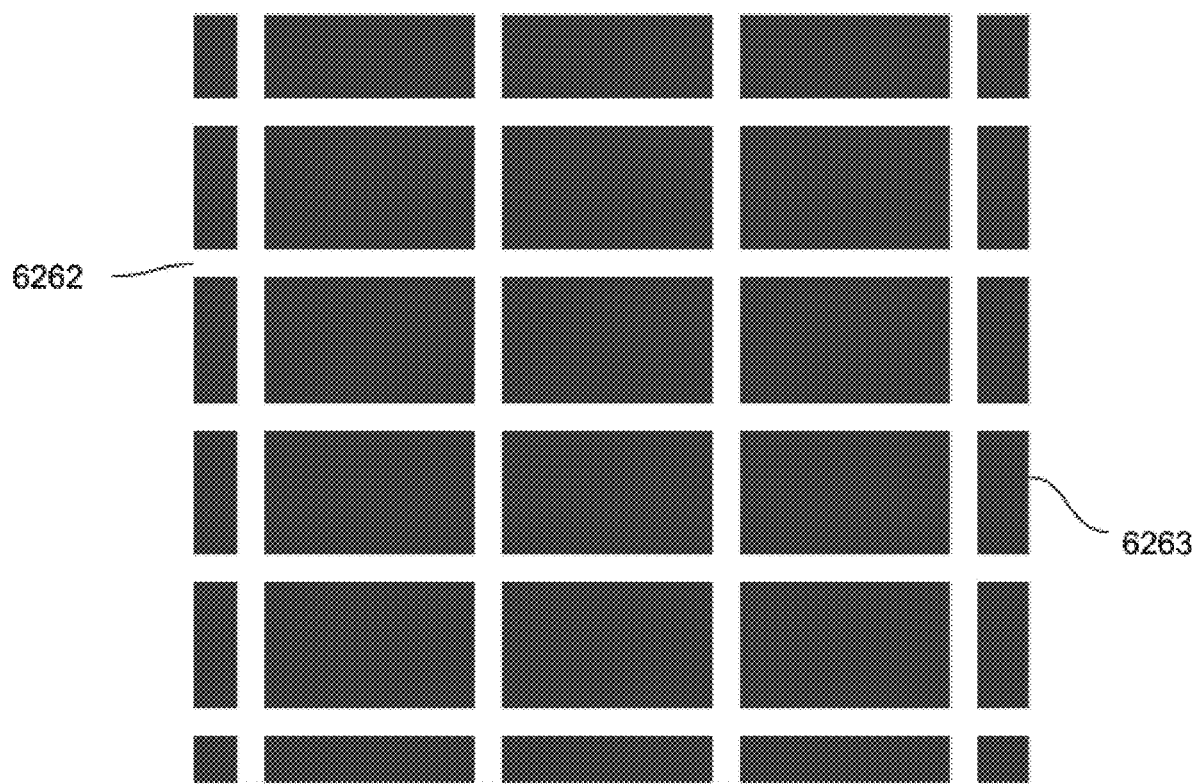
FIG. 6K illustrates a top view of another embodiment of the present invention, in accordance with an embodiment of the present invention.
Figure 6L:
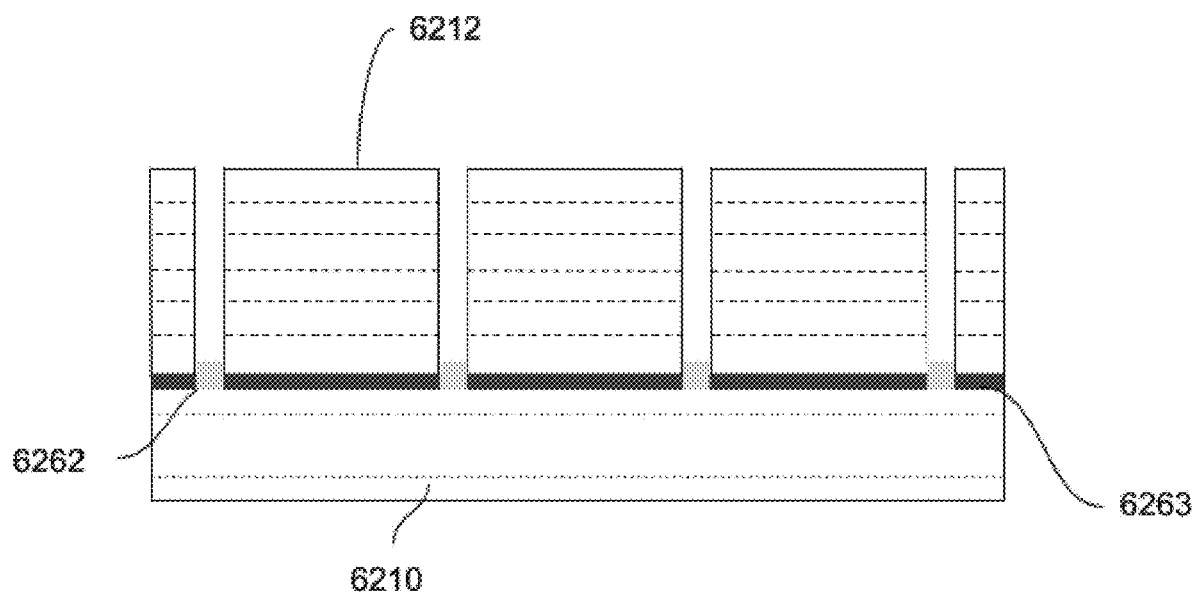
FIG. 6L illustrates a cross-sectional view of the embodiment of FIG. 6K, in accordance with an embodiment of the present invention.
Figure 6M:
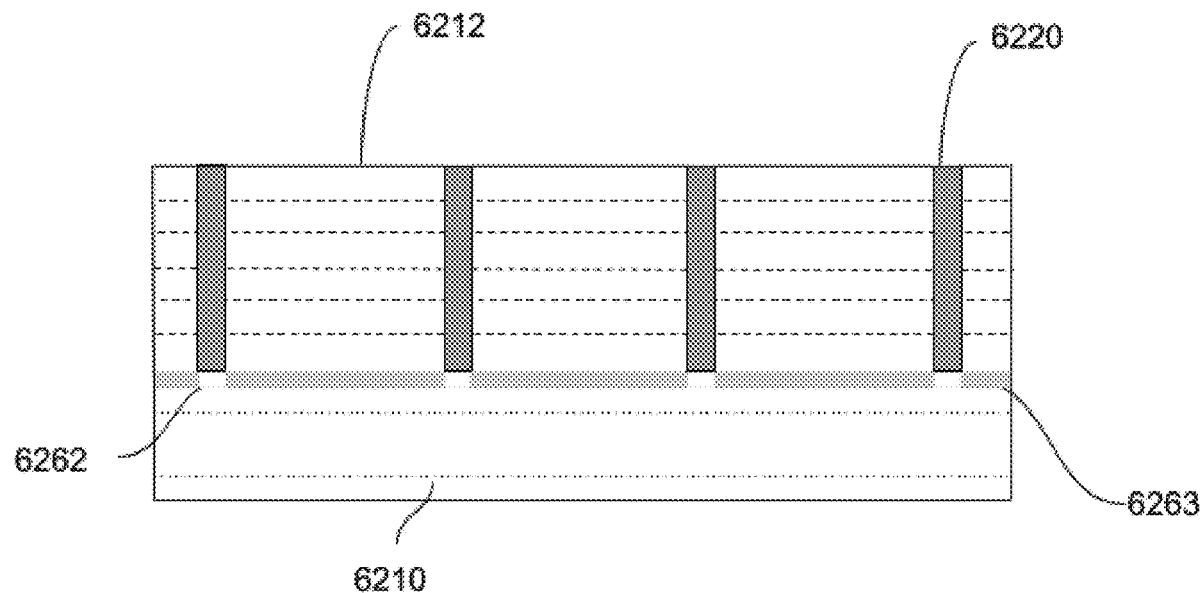
FIG. 6M illustrates a cross-sectional view of the embodiment of FIGS. 6K and 6L with filler material, in accordance with an embodiment of the present invention.

In another embodiment illustrated in FIGS. 6K-6M, the layers, e.g. the first bottom conductive layer 312, the functional layers 314, and the second top conductive layer 316, may be formed on the donor substrate 6210 as islands 6212. FIG. 6K illustrates a top view of the islands 6212 formed into an array of microdevices. The islands 6212 may be the same size or a multiple of the cartridge size. The islands 6212 may be formed starting from the buffer layers 6114/6118 or after the buffer layers. Here surface treatment or gaps 6262, 6263 may be formed on the surface to initiate the growth of the films as islands (FIG. 6L). To process the microdevices, the gaps may be filled by filler layers 6220, as shown in FIG. 6M. The filler 6220 may be comprised of polymer, metals, or dielectric layers. After processing the microdevices, the filler layers 6220 may be removed.

Figure 7:
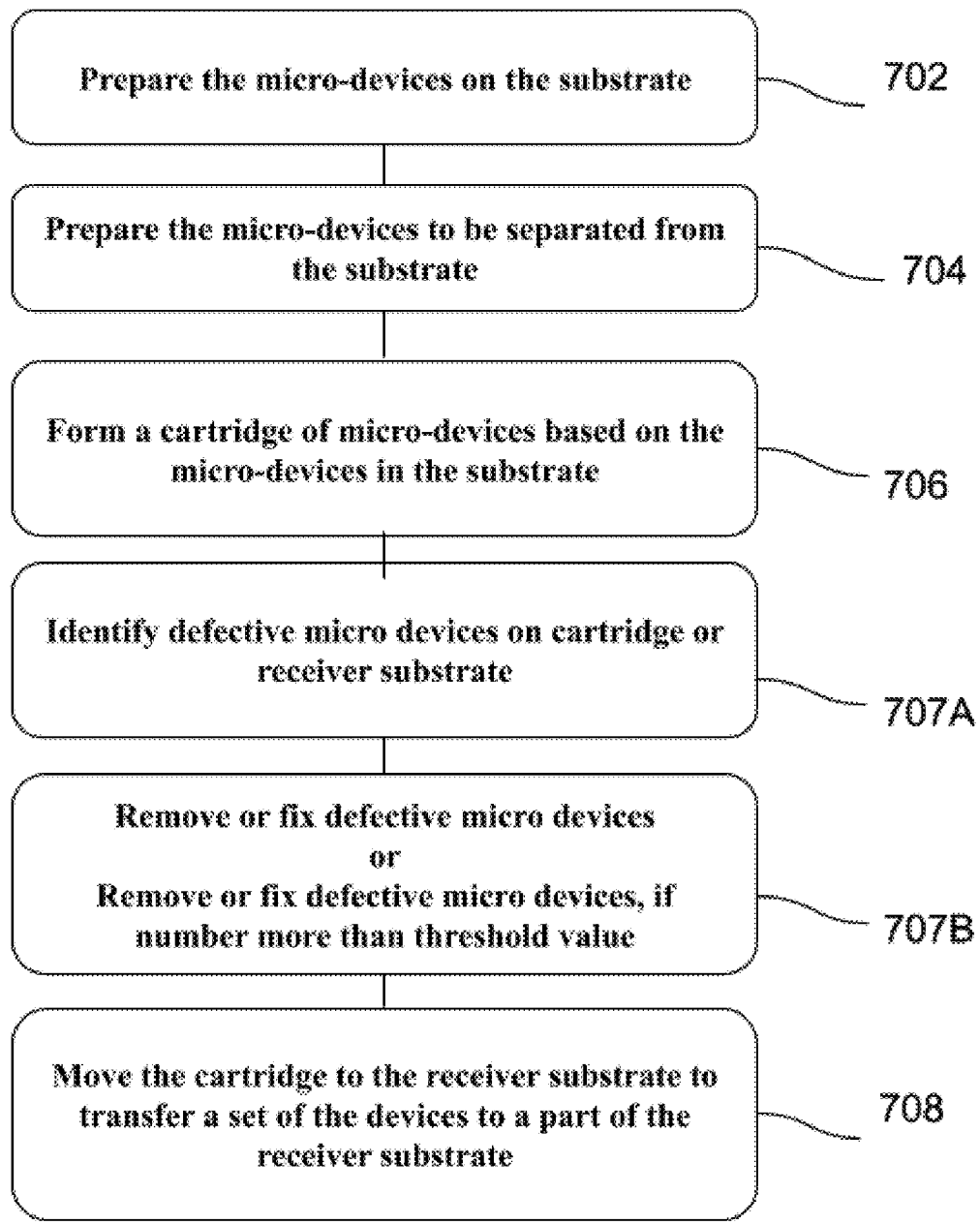
FIG. 7 is a flowchart of the process of an embodiment of the present invention.

FIG. 7 highlights the process to develop microdevice cartridges. During the first step 702, the microdevices are prepared on a donor substrate, e.g. 310 or 510. During this step, the devices are formed and post processing is performed on the devices. During the second step 704, the devices are prepared to be separated from the donor substrate 310 or 510. This step can involve securing the microdevices by using anchor, e.g. 375, 476-1, 592, 594, 598, or 598-2, or fillers, e.g. 374, 472 and 574. During the third step 706, the cartridge or temporary substrate, e.g. 376 or 476, is formed from the preprocessed microdevices from first and second steps 702, 704. In one case, during this step, the microdevices are bonded to the cartridge substrate 376 or 476 through a bonding layer, e.g. 378 or 478, directly or indirectly. Then the microdevices are separated from the microdevice cartridge substrates 376 or 476. In another embodiment, the cartridge is formed on the microdevice donor substrate, e.g. 510. After the devices are secured on the cartridge substrate 376, 476 or 510, other processing steps can be done, such as removing some layers, e.g. 312, 374, 472, 574, or adding electrical (e.g. contact 380 or 480) or optical (lens, reflectors) layers. During the fourth step 708, the cartridge 376 or 476 is moved to the receiver substrate, e.g. 390, 490 or 590, to transfer the devices to the receiver substrate 390, 490 or 590. Some these steps can be rearranged or merged. A testing step 707A may be performed on the microdevices while they are still on the cartridge substrate, e.g. 376 or 476, or after the microdevices have been transferred to the receiver substrate, e.g. 390, 490 or 590, to determine whether the microdevices are defective. Defective microdevices may be removed or fixed in-situ step 707B. For example, a set of microdevices with a predetermined number may be tested, and if the number of defects exceeds a predetermined threshold, then the entire set of microdevices may be removed, at least some of the defective microdevices may be removed, and/or at least some of the defective microdevices may be fixed.

Figure 8:
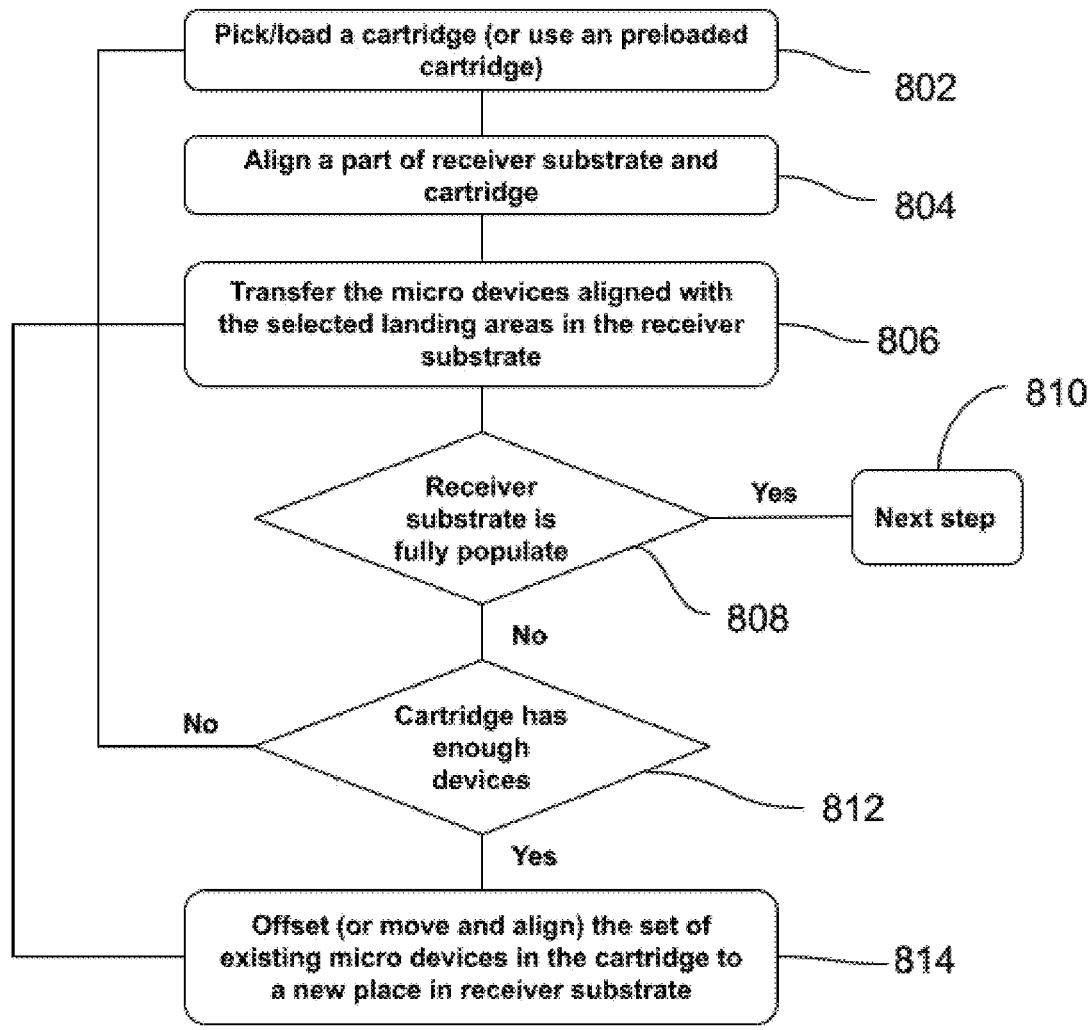
FIG. 8 is a flowchart of the microdevice mounting process, in accordance with an embodiment of the present invention.

FIG. 8 illustrates the steps to transfer the devices from the cartridge 376, 476, or 510, to the receiver substrate 390, 490, or 590. Here, during the first step 802, a cartridge 376, 476, or 510 is loaded (or picked) or in another embodiment, a spare equipment arm is pre-loaded with the cartridge 376, 476, or 510. During the second step 804, the cartridge 376, 476, or 510 is aligned with part (or all) of the receiver substrate. The alignment can be done using dedicated alignment marks on cartridge 376, 476, or 510 and the receiver substrate 390, 490, or 590, or using the microdevices and the landing areas on the receiver substrate 390, 490, or 590. The microdevices are transferred to the selected landing areas during the third steps. During the fourth step 808, if the receiver substrate 390, 490 or 590 is fully populated, the cartridge substrate 376, 476 or 510 is moved to the next steps in step 810, e.g. another receiver substrate 390, 490, or 590. If further population is needed for the current receiver substrate 390, 490, or 590, further transfer steps with one or more additional cartridges 376, 476, or 510 are conducted. Before a new transfer cycle, if the cartridge 376, 476, or 510 does not have enough devices, the cycle starts from first step 802. If the cartridge 376, 476, or 510 has enough devices in step 812, the cartridge 376, 476, or 510 is offset (or moved and aligned) to a new area of the receiver substrate 390, 490, or 590 in step 814 and the new cycle continues to step 806. Some of these steps can be merged and/or rearranged.

Figure 9:
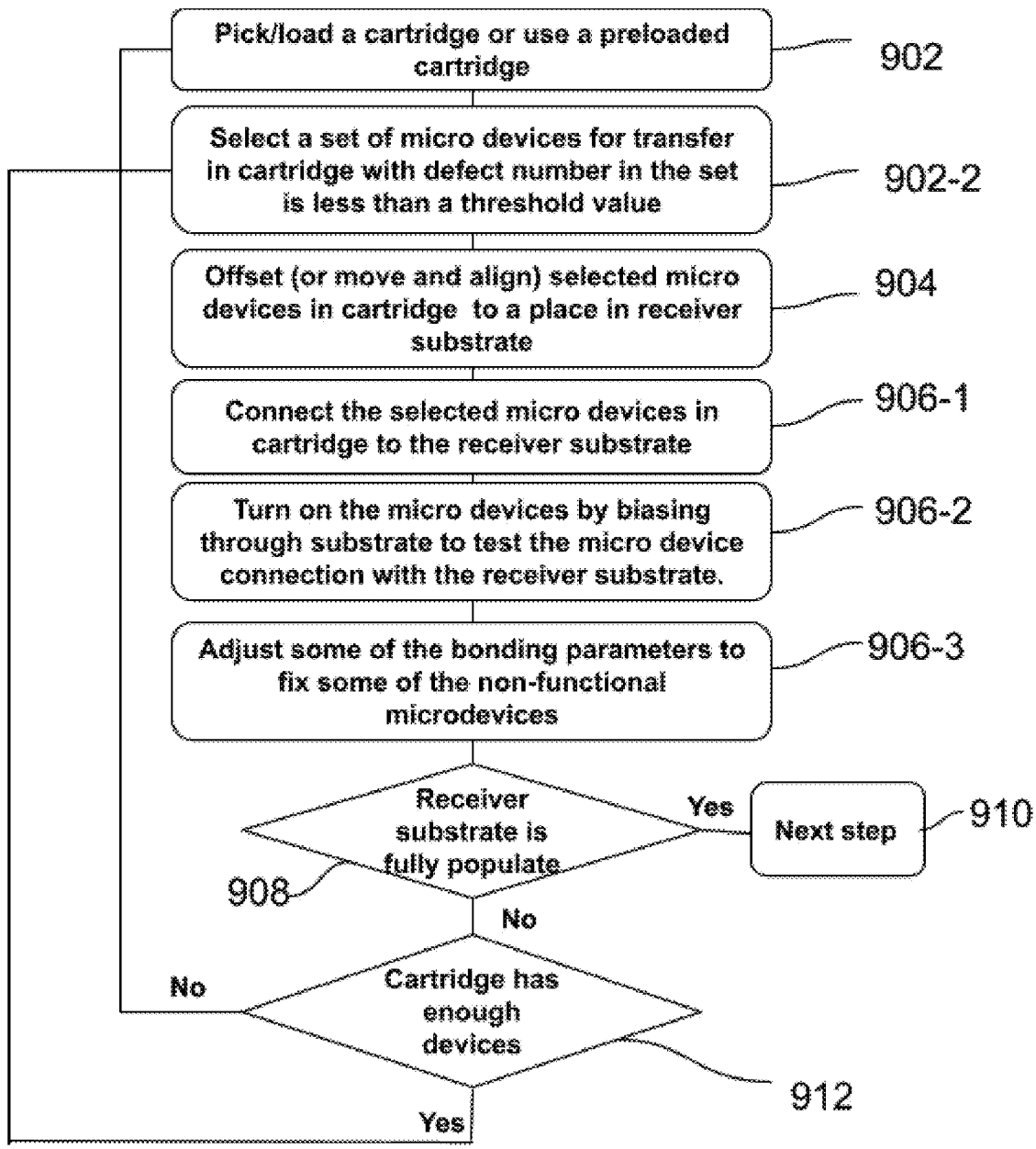
FIG. 9 is a flowchart of the microdevice mounting process, in accordance with an embodiment of the present invention.

FIG. 9 illustrates the steps to transfer the devices from the cartridge, e.g. temporary substrate 376, 476, or 510, to the receiver substrate, e.g. 390, 490, or 590. Here, during the first step 902, a cartridge 376 or 476 is loaded (or picked) or in another embodiment, a spare equipment arm is pre-loaded with the cartridge. During the second step 902-2, a set of microdevices is selected in cartridge 376, 476, or 510 so that the number of defects in them is less than a threshold. During the third step 904, the cartridge 376, 476, or 510 is aligned with part (or all) of the receiver substrate. The alignment can be done using dedicated alignment marks on the cartridge 376, 476, or 510 and/or the receiver substrate 390, 490, or 590, or using the microdevices and the landing areas on the receiver substrate 390, 490, or 590. The microdevices may then be transferred to the selected landing areas during the third step 906. In an optional step 906-1, the selected microdevices in the cartridge may connect to the receiver substrate. In another optional step 906-2, the microdevices may be turned on, e.g. by biasing through the receiver substrate 390, 490, or 590, to test the microdevice connections with the receiver substrate. If individual microdevices are found to be defective or non-functional, an additional adjustment step 906-3 may be performed to correct or fix some or all of the non-functioning microdevices.

If the receiver substrate is fully populated, the receiver substrate 390, 490, or 590 is moved to the next steps. If further population is needed for the receiver substrate 390, 490, or 590, further transfer steps from one or more additional cartridges 376, 476, or 510 are conducted. Before a new transfer cycle, if the cartridge 376, 476, or 510 does not have enough devices, the cycle starts from first step 902. If the cartridge 376, 476, or 510 has enough devices, the cartridge 376, 476, or 510 is offset (or moved and aligned) to a new area of the receiver substrate 390, 490, or 590 in step 902-2.

Figure 10:
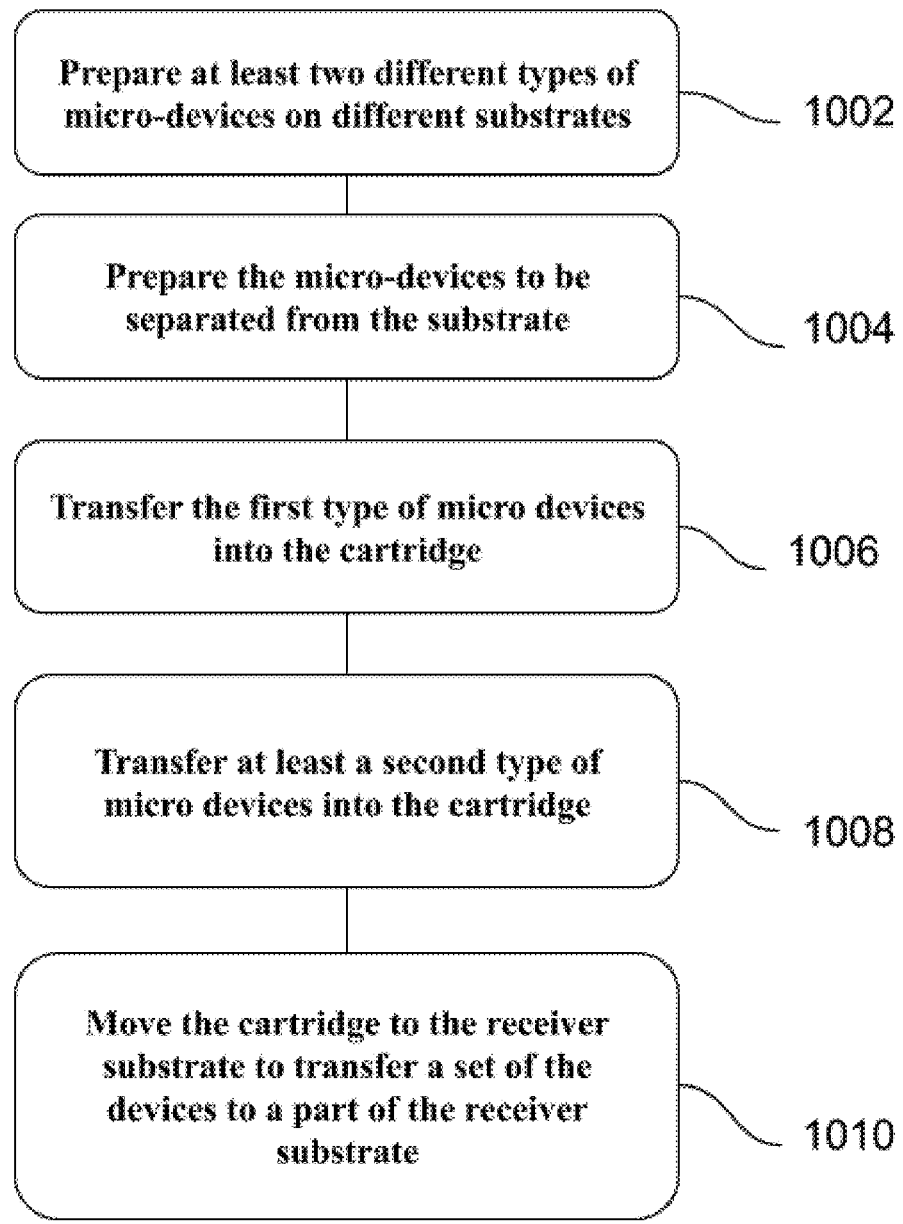
FIG. 10 is a flowchart of the microdevice mounting process, in accordance with an embodiment of the present invention.

FIG. 10 illustrates exemplary processing steps to develop multitype microdevice cartridges 376, 476, 510, or 1108. During the first step 1002, at least two different microdevices are prepared on different donor substrates, e.g. 310 or 510. During this step, the devices are formed and post processing is performed on the devices. During the second step 1004, the devices are prepared to be separated from the donor substrates e.g. 310 or 510. This step can involve securing the microdevices by using anchor, e.g. 375, 476-1, 592, 594, 598, and 598-2 or fillers, e.g. 374, 472, and 574. During the third step 1006, the first devices are moved to the cartridge 376, 476, 510, or 1108. During the fourth step 1008, at least the second microdevices are moved to the cartridge 376, 476, 510, or 1108. In one case, during this step, the microdevices are bonded to the cartridge substrate 376, 476, 510, or 1108 through a bonding layer, e.g. 378 or 478, directly or indirectly. Then the microdevices are separated from the microdevice donor substrates 310 or 510. For direct transfer, the different types of microdevices can have different heights. For example, the second type of microdevice being transferred to the cartridge 376, 476, 510, or 1108 can be slightly taller than the first one (or the location on the cartridge 376, 476, 510, or 1108 can be slightly higher for the second microdevice types). Here, after the cartridge 376, 476, 510, or 1108 is fully populated, the microdevice height can be adjusted to make the surface of the cartridge 376, 476, 510, or 1108 planar. This can be done by either adding materials to the shorter microdevices or removing material from taller microdevices. In another case, the landing area on the receiver substrate 390, 490, or 590 can have different height associated with the difference in the cartridge 376, 476, 510, or 1108. Another method to populate the cartridge 376, 476, 510, or 1108 is based on pick and place. The microdevices can be moved to the cartridge 376, 476, 510, or 1108 with a pick-and-place process. Here, the force element on the pick-and-place head can be unified for the microdevices in one cluster in the cartridge 376, 476, 510, or 1108 or it can be single for each microdevice. Also, they can be moved to the cartridge 376, 476, 510, or 1108 with other means. In another embodiment, the extra devices are moved away from the cartridge substrate 376, 476, 510, or 1108, of the first or second (or third or other) microdevices, and the other types of microdevices are transferred into the empty areas on the cartridge 376, 476, 510, or 1108. After the devices are secured on the cartridge substrate 376, 476, 510, or 1108, other processing steps can be done such as adding filler layer 374, 474, or 574, removing some layers, or adding electrical (e.g. contact 380, 480 or 580) or optical (lens, reflectors) layers. The devices can be tested after or before being used to populate the receiver substrate 390, 490, or 590. The test can be electrical or optical or a combination of the two. The test can identify defects and/or performance of the devices on the cartridge. The cartridge 376, 476, 510, or 1108 is moved to the receiver substrate 390, 490, or 590 during the last step 1010 to transfer the devices to the receiver substrate 390, 490, or 590. Some of these steps can be rearranged or merged.

The transferring processes described here (e.g. FIGS. 7, 8, 9, and 10) may include a stretching step to increase the pitch of the microdevices on the cartridge 376, 476, 510, or 1108. This step may be done prior to alignment or as part of the alignment step. This step can increase the number of microdevices aligned with the landing area (or pad) on the receiver substrate 390, 490, or 590. Moreover, it can match the pitch between the array of microdevices on the cartridge 376, 476, 510, or 1108 that comprises at least two microdevices to match the pitch of landing area (or pads 382) on the receiver substrate 390, 490, or 590.

Figure 11:
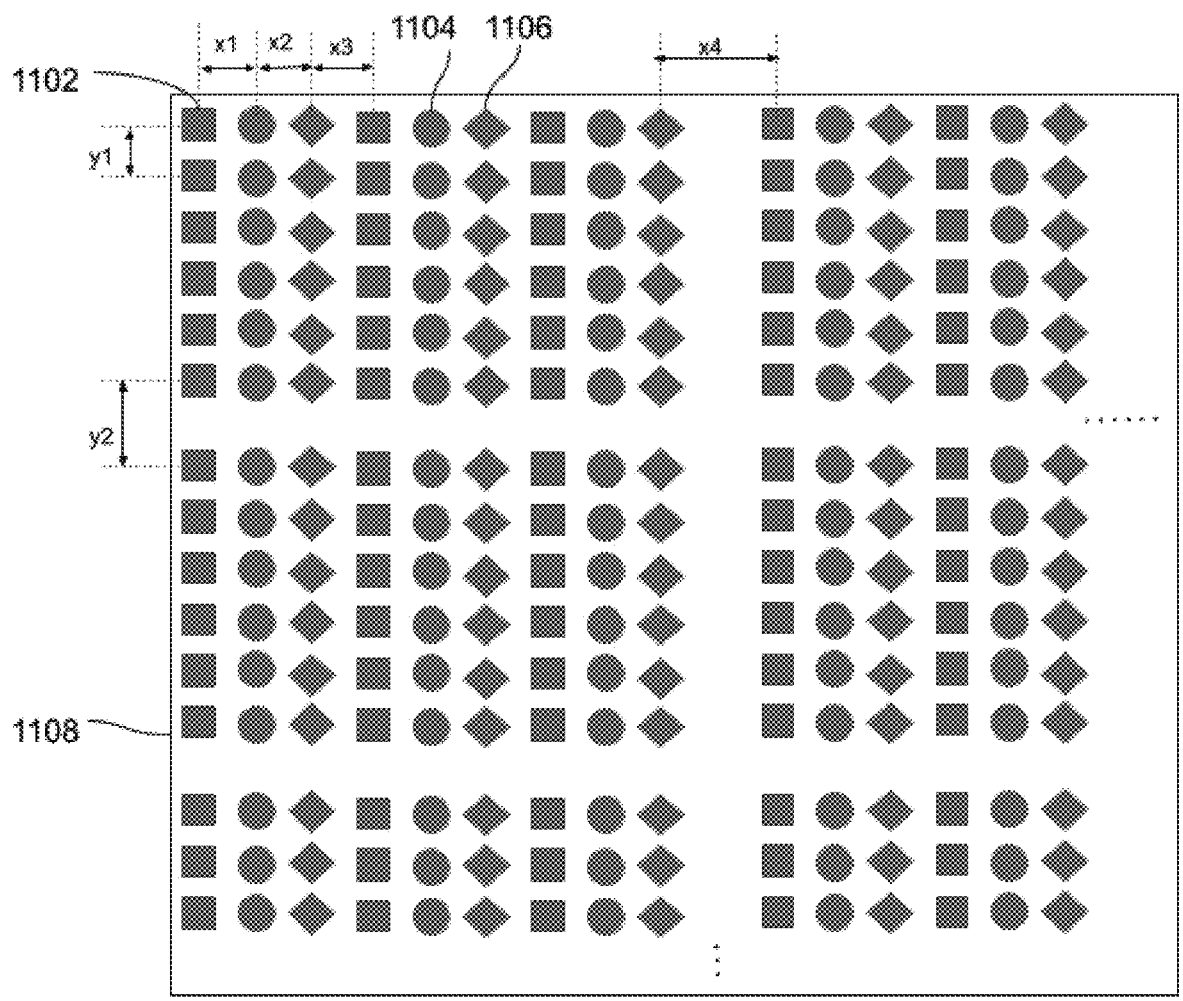
FIG. 11 illustrates an example of a donor or temporary (cartridge) substrate with different types of pixelated microdevices, in accordance with an embodiment of the present invention.

FIG. 11 illustrates one example of multitype microdevice cartridge 1108, similar to temporary substrates 376, 476, or 510. The cartridge 1108 includes three different types, e.g. colors (red, green, and blue), of microdevices 1102, 1104, 1106, although there may be more device types. The distance between microdevices x1, x2, x3 is related to the pitch of the landing areas in the receiver substrate 390, 490, or 590. After a few devices, which can be related to the pixel pitch in the receiver substrate 390, 490, or 590, there may be a different pitch x4, y2. This pitch is compensating for a mismatch between the pixel pitch and the microdevice pitch (landing area pitch). In this case, if pick and place is used to develop the cartridge 1108, the force elements can be in the form of columns corresponding to the column of each microdevice type or it can be a separate element for each microdevice.

Figure 12:
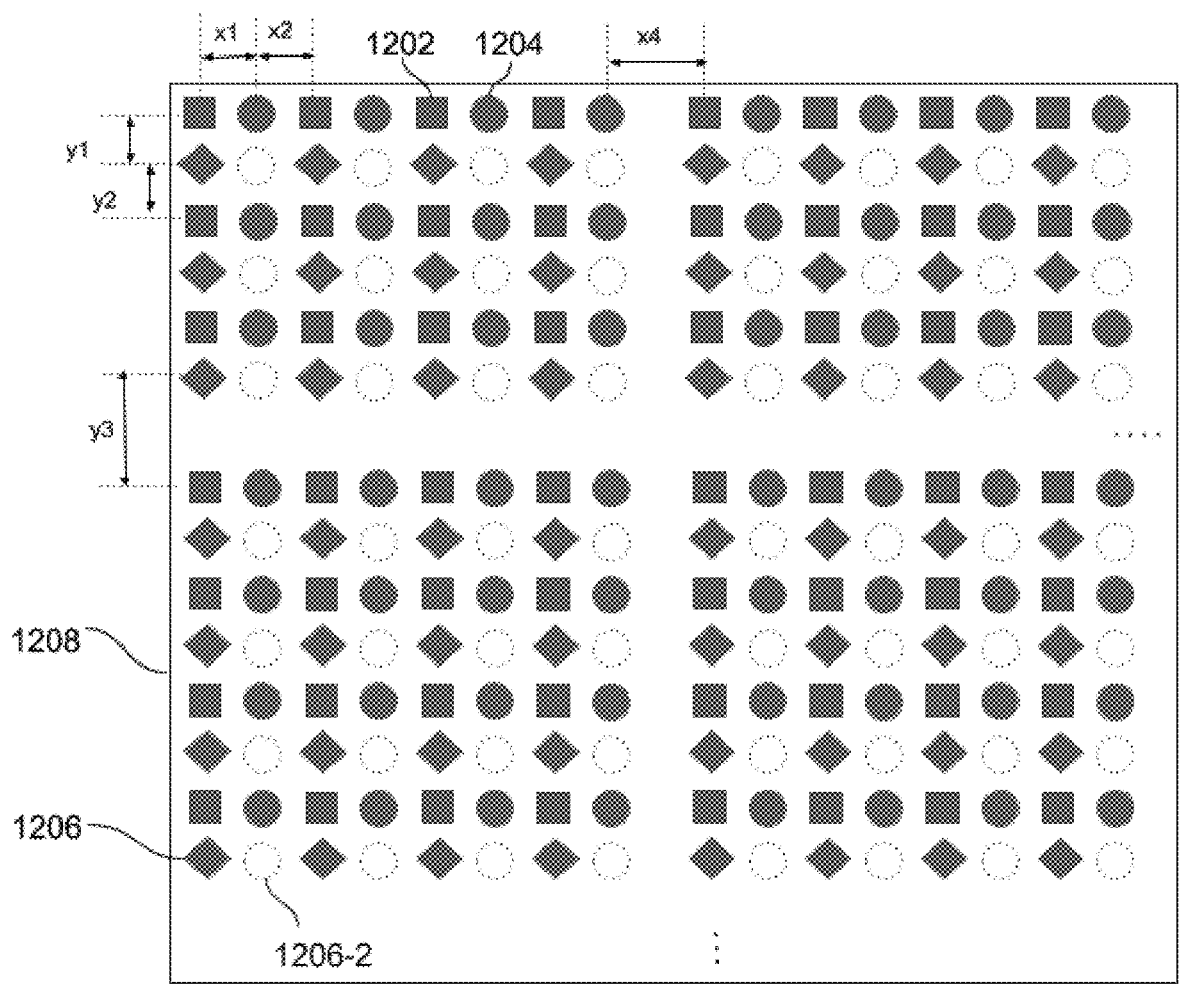
FIG. 12 illustrates an example of a donor or temporary (cartridge) substrate with different types of pixelated microdevices, in accordance with an embodiment of the present invention.

FIG. 12 illustrates one example of a multitype microdevice cartridge 1208, similar to temporary substrates 376, 476, or 510. The cartridge 1208 includes three different types, e.g. colors (red, green, and blue), of microdevices 1202, 1204, 1206. The other area 1206-2 may be empty, populated with spare microdevices, or include a fourth different type of microdevice. The distance between microdevices x1, x2, x3 is related to the pitch of the landing areas in the receiver substrate 390, 490, or 590. After a few arrays of devices, which may be related to the pixel pitch in the receiver substrate 390, 490, or 590, there may be a different pitch x4, y2. This pitch is compensating for a mismatch between the pixel pitch and the microdevice pitch (landing area pitch).

Figure 13:
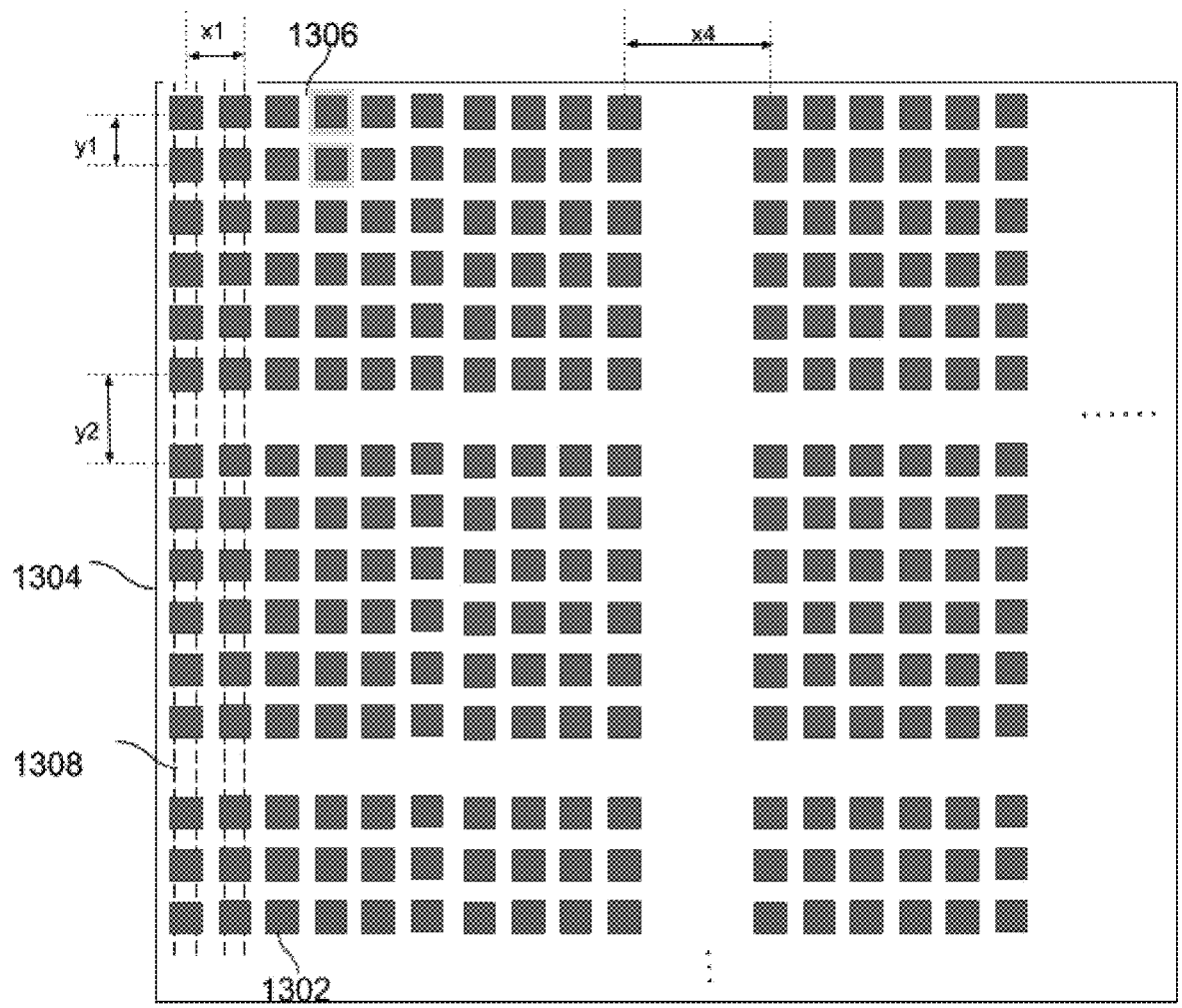
FIG. 13 illustrates an example of a donor substrate for the same type of microdevices, but with a different pitch between sets of microdevices, in accordance with an embodiment of the present invention.

FIG. 13 illustrates one example of microdevices 1302 prepared on a donor substrate 1304, similar to donor substrates 310 or 510 before they are transferred to multi-type microdevice cartridge 376, 476, 510, 1108, 1208. Here, one can use supporting layers 1306 and 1308 for individual devices or for a group of devices. Here, the pitch can match the pitch in the cartridge 376, 476, 510, 1108, 1208 or it can be a multiple of the cartridge pitch.

In all the structures above, it is possible to move the microdevices from the first cartridge to a second one prior to using them to populate a substrate. Extra processing steps can be done after transfer or some of the processing steps can be divided between first and secondary cartridge structures.

Figure 14A:
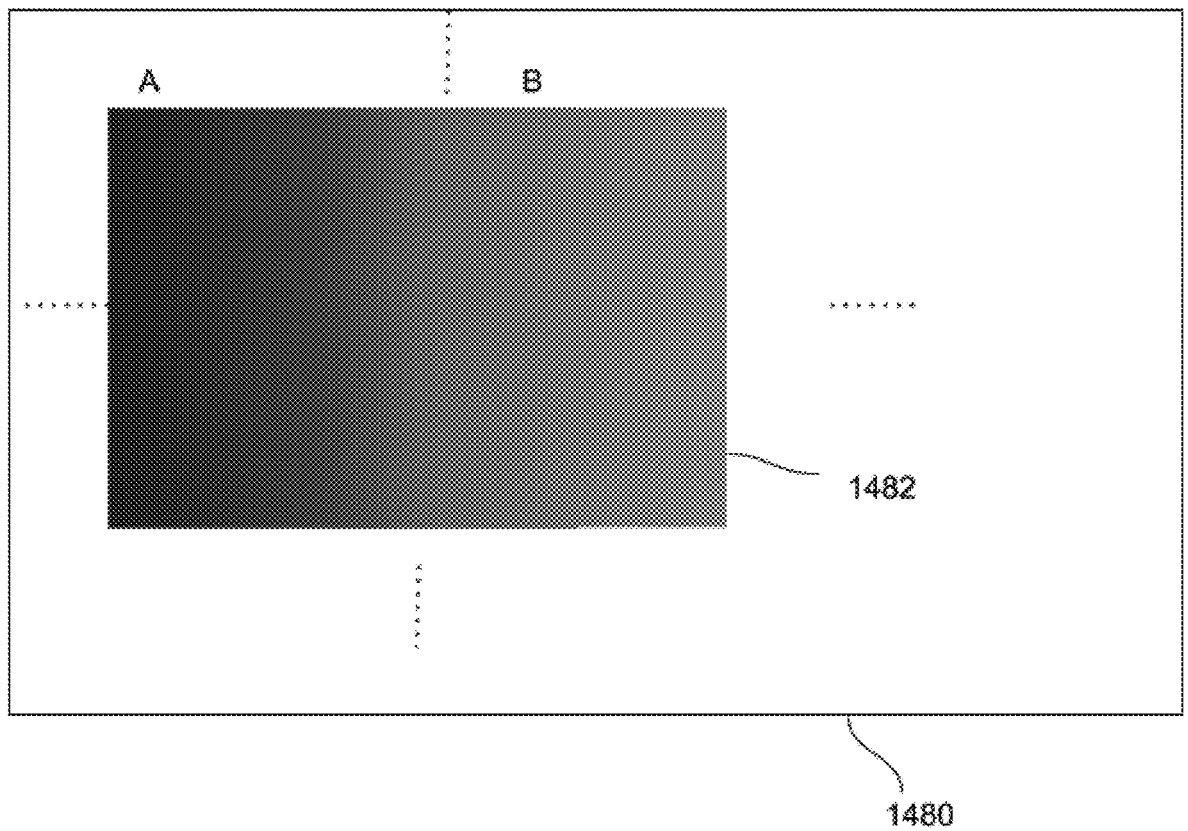
FIG. 14A illustrates an example of a donor or temporary substrate with non-uniform output across a block of microdevices, in accordance with an embodiment of the present invention.
Figure 14B:
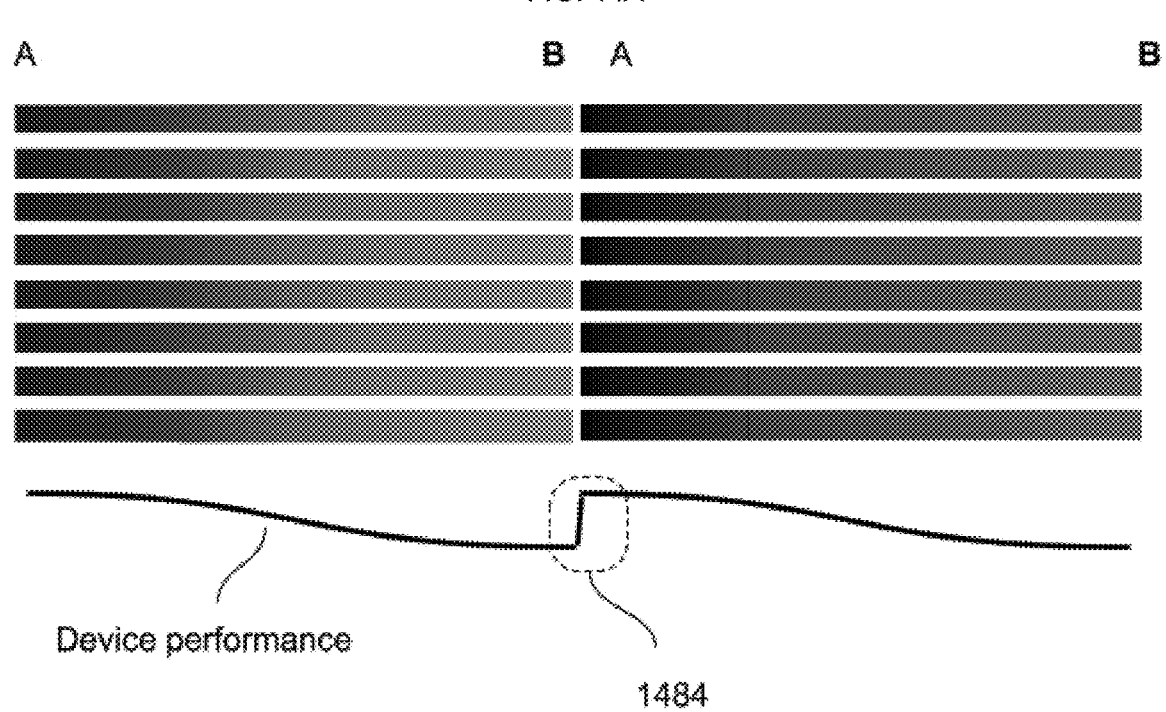
FIG. 14B illustrates an example of a receiver or system substrate with non-uniform output across a plurality of a block of microdevices, in accordance with an embodiment of the present invention.

FIG. 14A illustrates an embodiment of microdevices in a donor substrate 1480, similar to donor substrates 310 or 510. As a result of manufacturing and material flaws, the microdevices may have a gradual decrease or increase in output power, i.e. non-uniformity, across the donor substrate 1480, as illustrated with darker to lighter coloring. Since the devices may be transferred together in a block, e.g. block 1482, or one or more at a time in sequence into the receiver substrates 390, 490, or 590, the adjacent devices in the receiver substrate 390, 490, or 590 gradually degrade. However, a worse problem may occur where one block, e.g. 1482, or a series of adjacent blocks ends and another one, e.g. block 1483, or series of blocks starts, e.g. along an intersection line 1484, which may result in an abrupt change in output performance as demonstrated in FIG. 14B. The abrupt change may result in visual artifacts for optoelectronic devices, such as displays.

Figure 14C:
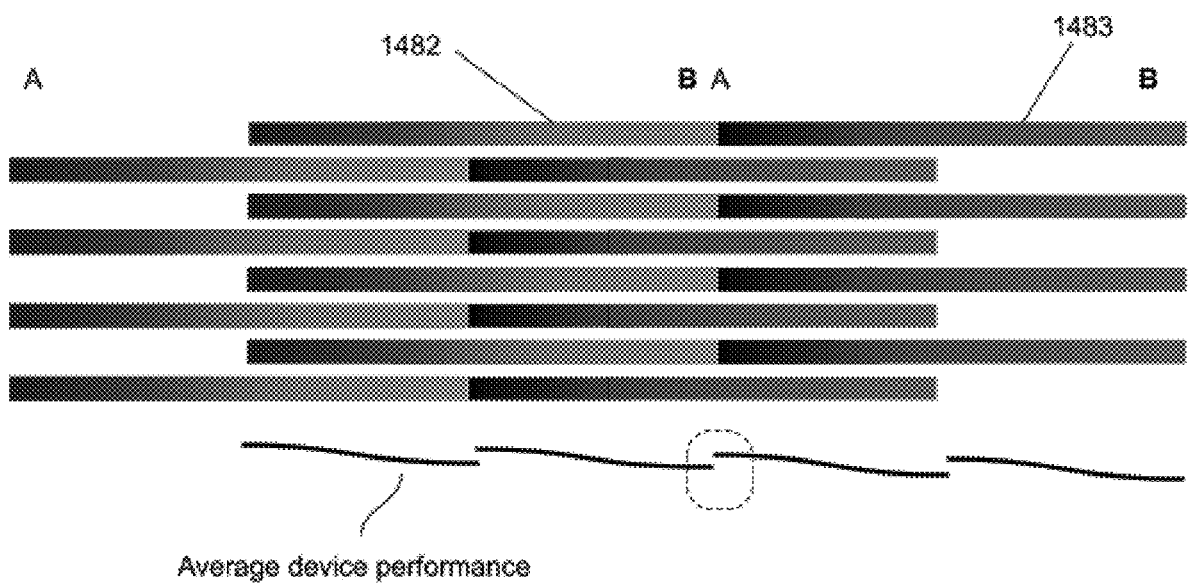
FIG. 14C illustrates an example of a system substrate with skewed blocks of microdevices, in accordance with an embodiment of the present invention.

To solve the problem of non-uniformity, one embodiment, illustrated in FIG. 14C, includes skewing or staggering the individual blocks 1482 and 1483 with blocks below and above them in the display, so that the edges or intersection lines of the blocks are not sharp lines, eliminating intersection line 1484, and whereby the blocks of devices form a skewed pattern on the display. Therefore, the average impact of the sharp transition is reduced significantly. The skew may be random and may have different profiles.

Figure 14D:
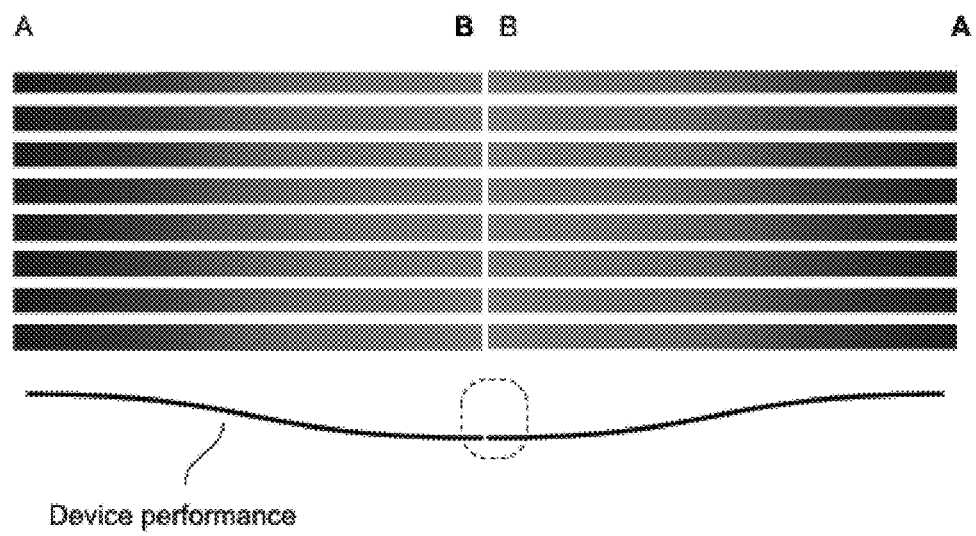
FIG. 14D illustrates an example of a system substrate with flipped blocks of microdevices, in accordance with an embodiment of the present invention.

FIG. 14D illustrates another embodiment in which the microdevices in adjacent blocks are flipped so that the devices with similar performance are adjacent one another, e.g. the performance in a first block 1482 decreases from a first outer side. A to a first inner side B, while the performance of a second adjacent block 1483 increases from a second inner side B, adjacent to the first inner side B to a second outer side A, which may keep the changes and transitions between blocks very smooth and eliminate the long abrupt intersection 1484.

Figure 14E:
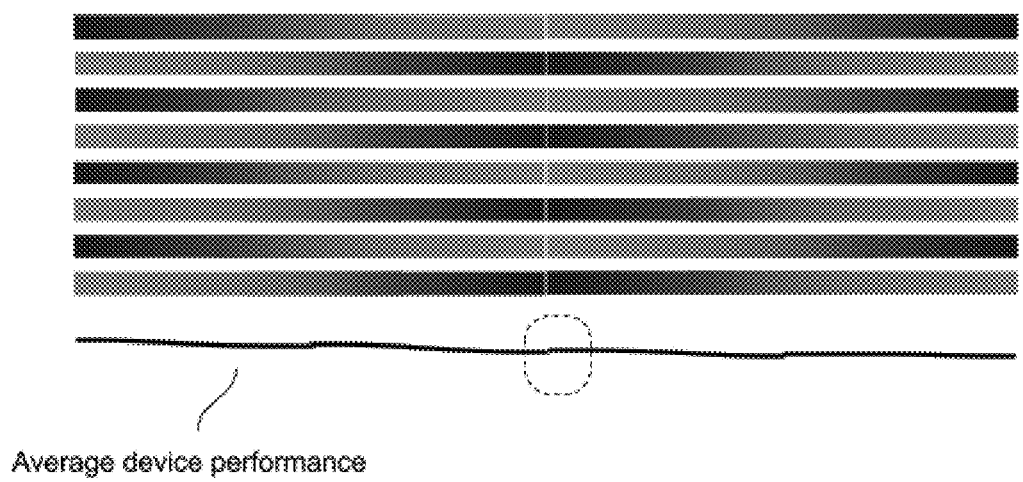
FIG. 14E illustrates an example of a system substrate with flipped and alternating blocks of microdevices, in accordance with an embodiment of the present invention.

FIG. 14E illustrates an exemplary combination of flipping the devices, e.g., alternating high and low performing devices at the inner sides, and skewing the edges to improve the average uniformity furthermore. In the illustrated embodiment the device performance alternates between high and low in both directions, i.e. in adjacent horizontal blocks and in adjacent vertical blocks.

In one case, the performance of microdevices at the edges of the blocks is matched for adjacent transferred blocks (arrays) prior to the transfer to the receiver substrate 390, 490, or 590.

Figure 15A:
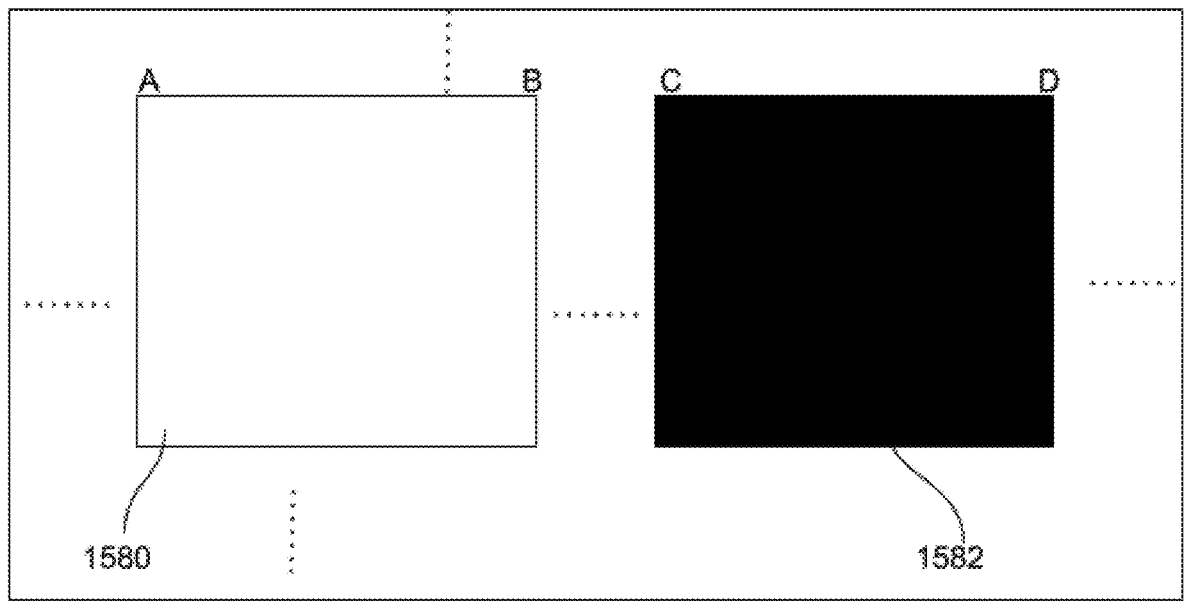
FIG. 15A illustrates an example of a donor substrate with two different blocks of microdevices, in accordance with an embodiment of the present invention.
Figure 15B:
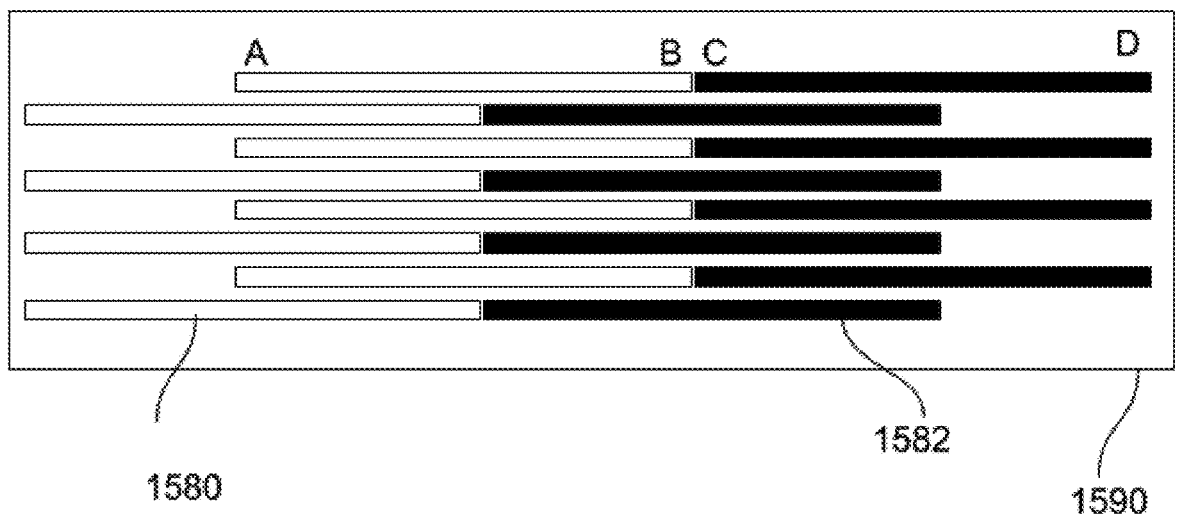
FIG. 15B illustrates an example of a system substrate with skewed blocks of different microdevices, in accordance with an embodiment of the present invention.

FIG. 15A illustrates using two or more blocks 1580, 1582, to populate a block in the receiver substrate 1590. In the illustrated embodiment, the skewing or flipping method may be used to further improve the average uniformity as demonstrated in FIG. 15B. Higher (or lower) output power sides B and C from blocks 1580 and 1582, respectively, may be positioned adjacent each other, as well as staggering or skewing the connection between blocks with the connection of the blocks thereabove and therebelow. Also, a random or defined pattern may be used to populate the cartridge or receiver substrate 1590 with more than one block.

Figure 16A:
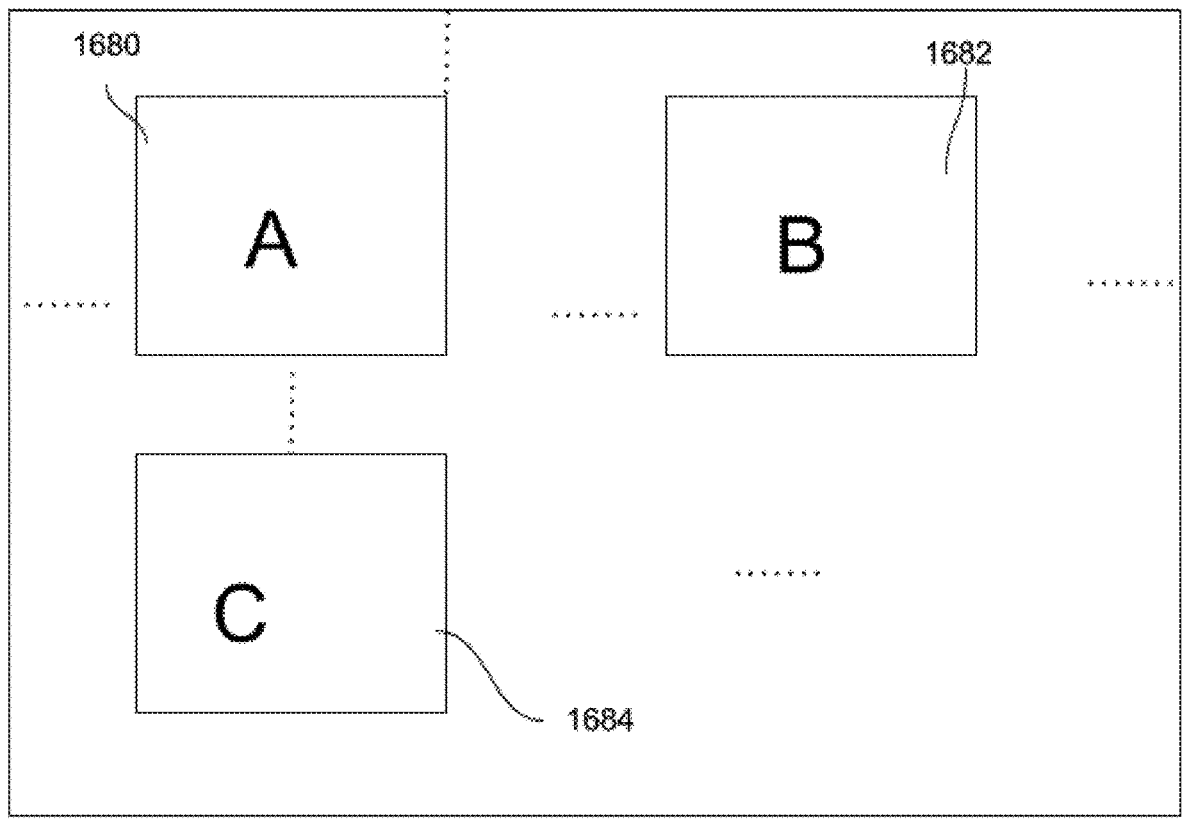
FIG. 16A illustrates an example of a donor substrate with three different types of blocks of pixelated microdevices, in accordance with an embodiment of the present invention.
Figure 16B:
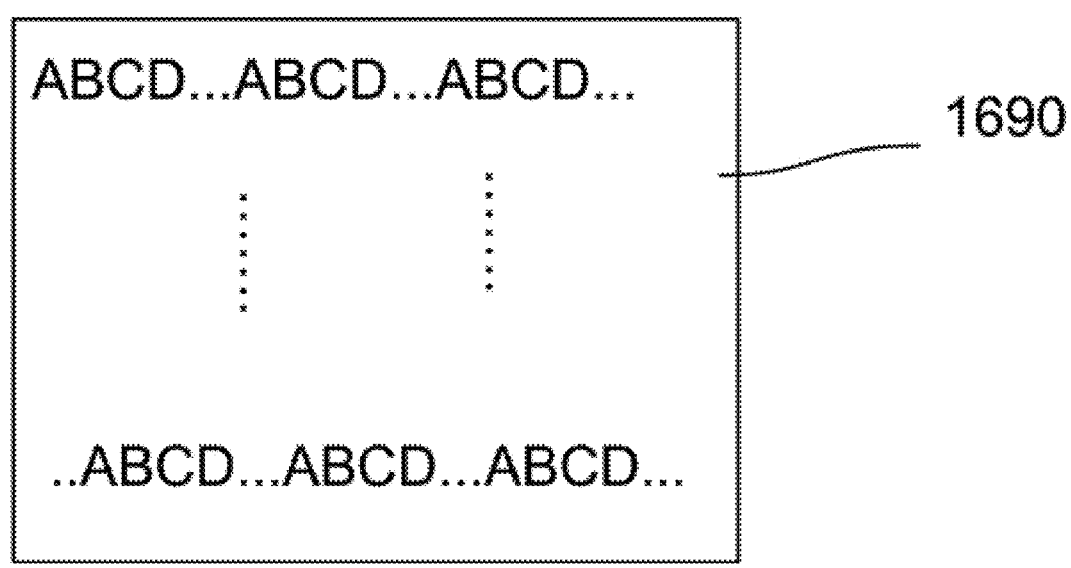
FIG. 16B illustrates an example of a system substrate with a plurality of different types of individual microdevices from each block, in accordance with an embodiment of the present invention.

FIG. 16A illustrates a sample with more than one block 1680, 1682, and 1684. The blocks 1680, 1682, and 1684 may be from the same donor substrate 310 or 510 or from different donor substrates 310 or 510. FIG. 16B illustrates an example of populating a cartridge 1690 from different blocks 1680, 1682, and 1684 to eliminate the non-uniformity found in any one block.

Figure 17A:
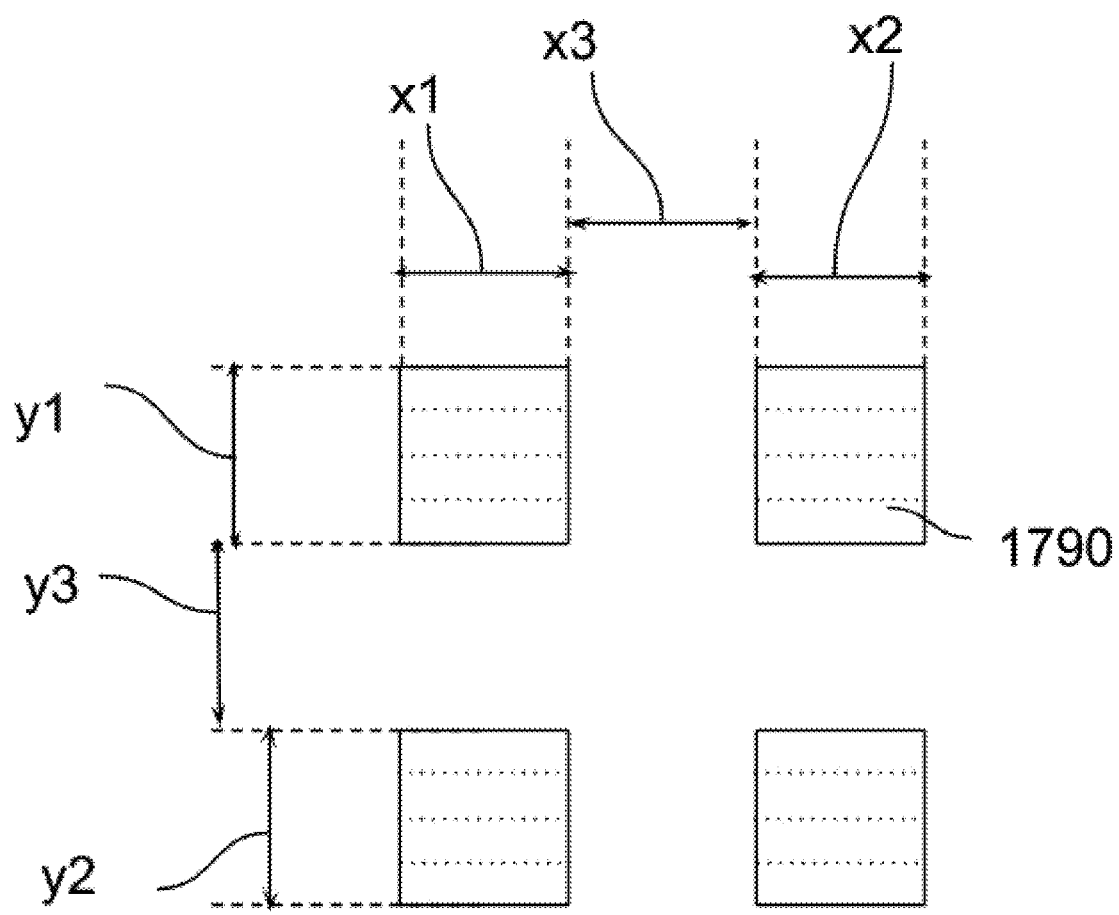
FIG. 17A illustrates an example of a cartridge substrate with a plurality of different types of blocks of pixelated microdevices, in accordance with an embodiment of the present invention.
Figure 17B:
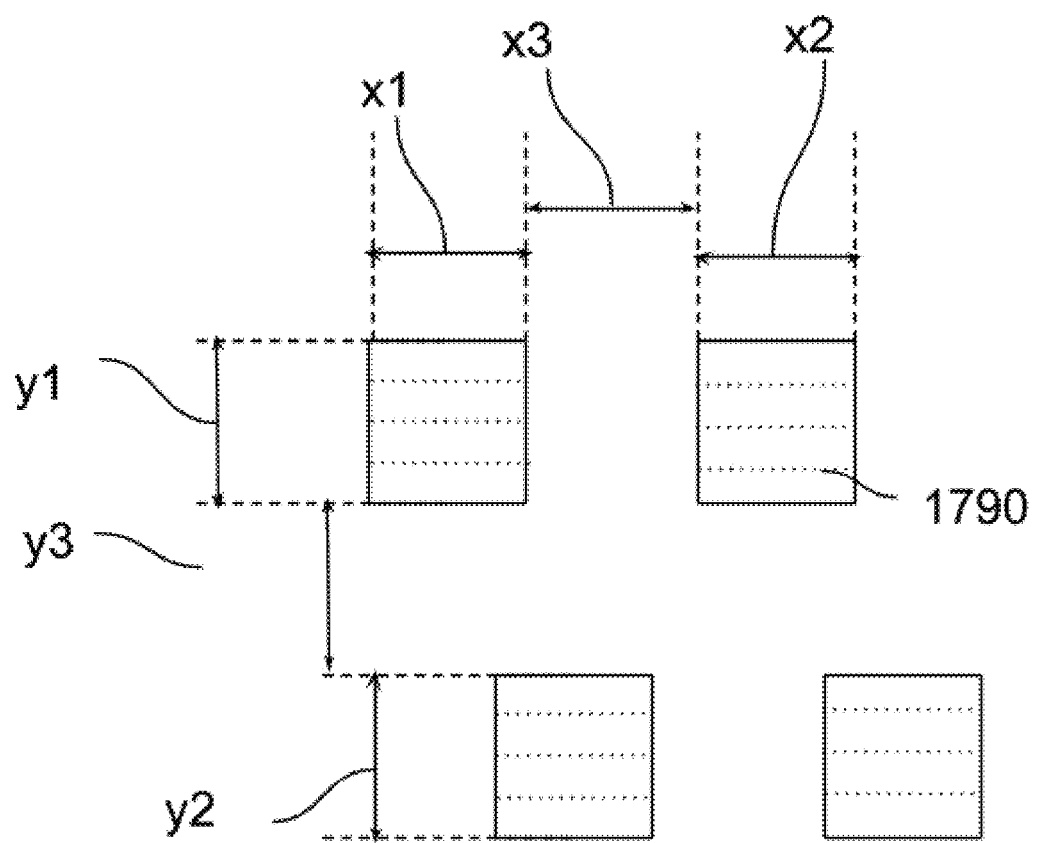
FIG. 17B illustrates an example of a cartridge substrate with a plurality of different types of offset blocks of pixelated microdevices, in accordance with an embodiment of the present invention.

FIGS. 17A and 17B illustrate structures with multiple cartridges 1790. The position of the cartridges 1790, as hereinbefore described, are chosen in a way to eliminate overlapping the same area in the receiver substrate 390, 490, 590, or 1590 with cartridges 1790 with the same microdevices during different transfer cycles. In one example, the cartridge 1790 may be independent, which means separate arms or a controller handles each cartridge independently. In another embodiment, the alignment may be done independently, but the other actions may be synchronized. In this embodiment, the receiver substrate 390, 490, 590, or 1590 may move to facilitate the transfer after the alignment. In another example, the cartridges 1790 move together to facilitate the transfer after the alignment. In another example, both the cartridges 1790 and the receiver substrate 390, 490, 590, or 1590 may move to facilitate the transfer. In another case, the cartridges 1790 may be assembled in advance. In this case, a frame or substrate may hold the assembled cartridges 1790.

The distance X3, Y3 between cartridges 1790 may be a multiple of the width X1, X2 or length Y1, Y2 of the cartridge 1790. The distance may be a function of the moving steps in the different directions. For example, X3=KX1+HX2, where K is the movement step to left (directly or indirectly) and H is the movement steps to the right (directly or indirectly) to populate a receiver substrate 390, 490, 590, or 1590. The same may be used for the distance Y3 between the cartridges 1790 and the lengths Y1 and Y2. As shown in FIG. 17A, the cartridges 1790 may be aligned in one or two directions. In another example, shown in FIG. 17B, the cartridges 1790 are not aligned in at least one direction. Each cartridge 1790 may have independent control to apply pressure and temperature toward the receiver substrate 390, 490, 590, or 1590. Other arrangements are also possible depending on the direction of movement between the receiver substrate 390, 490, 590, or 1590 and the cartridges 1790.

In another example, the cartridges 1790 may have different devices and therefore populate different areas in the receiver substrate 390, 490, 590, or 1590 with different devices. In this case, relative position of the cartridges 1790 and the receiver substrate 390, 490, 590, or 1590 changes after each transfer cycle to populate different areas with all the required microdevices from different cartridges 1790.

In another embodiment, several arrays of cartridges 1790 are prepared. Here, after devices are transferred to the receiver substrate 390, 490, 590 or 1590 from a first array of cartridges, the receiver substrate 390, 490, 590, or 1590 is moved to the next array of microdevices to fill the remaining areas in the receiver substrate 390, 490, 590, or 1590 or receive different devices.

In another example, the cartridges 1790 may be on a curved surface and therefore circular movement would provide contact to transfer microdevices into the receiver substrate 390, 490, 590, or 1590.

A vertical optoelectronic stack layer includes a substrate, active layers, at least one buffer layer between the active layers and the substrate, and at least one separation layer between the buffer layer and the active layers, wherein the active layers may be physically removed from the substrate by means of changing the property of the separation layer while the buffer layer remains on the substrate.

In one embodiment, the process to change the property of the separation layer(s) includes chemical reaction etches or deforming the separation layer.

In another embodiment, the process to change the property of the separation layer(s) includes exposure to an optoelectronic wave to deform the separation layer.

In another embodiment, the process to change the property of the separation layer(s) includes a change in the temperature to deform the separation layer.

In one embodiment, reusing the buffer layers to develop new optoelectronic stack layers, includes surface treatment.

In one embodiment, the surface treatment uses chemical or physical etching or polishing.

In another embodiment, the surface treatment uses deposition of an extra thin layer of buffer layer to resurface.

In one embodiment, the optoelectronic device is an LED.

In one embodiment, the separation layer may be zinc oxide.

An embodiment of this invention comprises a continuous pixelated structure that includes fully or partially continuous active layers, pixelated contact, and/or current spreading layers.

In this embodiment, a pad and/or bonding layers may exist on top of a pixelated contact and/or current spreading layer.

In the above embodiment, a dielectric opening may exist on top of each pixelated contact and/or current spreading layer.

Another embodiment comprises a donor substrate that includes microdevices with bonding pads and filler layers filling the space between the microdevices.

Another embodiment comprises a temporary substrate that includes a bond layer that the microdevices from the donor substrate are bonded to.

Another embodiment comprises a thermal transfer technique which includes the following steps:
1) aligning the microdevices on a temporary substrate to the bonding pads of a system substrate;
2) verifying that the melting point of the bonding pads on the system substrate is higher than the melting point of the bonding layer in the temporary substrate;
3) creating a thermal profile that melts both said bonding pads and layer and after that keeps the bond layer melted and bond pad solidified; and
4) separating the temporary substrate from the system substrate.

In another embodiment in the transfer technique, the thermal profile is created by both localized or global thermal sources or both.

Another embodiment comprises a microdevice structure wherein at least one anchor holds the microdevice to the donor substrate after the device is released from the donor substrate by a form of lift off process.

Another embodiment comprises a transfer technology for the microdevice structure in which the anchor releases the microdevice after or during the microdevice bonding to a pad in a receiver substrate either by the push or pull force.

In another embodiment, the anchor according to the microdevice structure is comprised of at least one layer that extends to the substrate from the side of the microdevice.

In another embodiment, the anchor according to the microdevice structure is comprised of a void and at least one layer on top of the void.

In another embodiment, the anchor according to the microdevice structure is comprised of filling layers surrounding the devices.

Another embodiment comprises a structure according to the microdevice structure where the viscosity of the layer between the lifted off microdevice and the donor substrate is increased to act as an anchor by controlling the temperature.

Another embodiment comprises a release process for the anchor in the microdevice structure, in which the temperature is adjusted to reduce the force between the anchor and the microdevice.

Another embodiment comprises a process to transfer microdevices into a receiver substrate wherein microdevices are formed into a cartridge; aligning the cartridge with selected landing areas in the receiver substrate; and transferring microdevices in the cartridge associated with selected landing areas to the receiver substrate.

Another embodiment comprises a process to transfer microdevices into a receiver substrate wherein microdevices are formed into a cartridge; selecting a set of microdevices with defective microdevices less than a threshold; aligning the selected set of microdevices in the cartridge with selected landing areas in the receiver substrate; and transferring microdevices in the cartridge associated with selected landing areas to the receiver substrate.

An embodiment includes the cartridge that has multitype microdevices transferred therein.

An embodiment comprises a microdevice cartridge wherein a sacrificial layer separates at least one side of the microdevice from the filler or bonding layer.

An embodiment wherein the sacrificial layer is removed to release the microdevices from the filler or bonding layer.

An embodiment wherein the sacrificial layer releases the microdevices from the filler under some conditions, such as high temperature.

The microdevices may be tested to extract information related to microdevices including but not limited to defects, uniformity, operation condition, and more. In one embodiment, the microdevice(s) are temporarily bonded to a cartridge, which has one or more electrodes to test the microdevices. In one embodiment, another electrode is deposited after microdevices are located in the cartridge. This electrode can be used to test the microdevices before or after patterning. In one embodiment, the cartridge is placed in a predefined position (it could be a holder). Either the cartridge and/or the receiver substrate are moved to become aligned. At least one selected microdevice is transferred to the receiver substrate. If more microdevices are available on/in the cartridge, either the cartridge or the receiver substrate are moved to become aligned with a new area in the same receiver substrate or a new receiver substrate and at least another selected device is transferred to the new place. This process may continue until the cartridge does not have enough microdevices, at which time a new cartridge may be placed in the predefined position. In one example, transfer of the selected devices is controlled based on the information extracted from the cartridge. In one example, the defect information extracted from the cartridge may be used to limit the number of defective devices transferred to the receiver substrate to below a threshold number by eliminating the transfer of a set of microdevices which have a defect number more than a threshold value or the cumulative number of transferred defects will be more than a threshold value. In another example, the cartridges will be binned based on one or more extracted parameters and each bin will be used for different applications. In another case, cartridges with close performance based on one or more parameters will be used in one receiver substrate. The examples presented here may be combined to improve the cartridge transfer performance.

In an embodiment, physical contact and pressure and/or temperature may be used to transfer the devices from the cartridge into the receiver substrate. Here, the pressure and/or temperature may create a bonding force (or grip force) to hold the microdevices to the receiver substrate and/or also the temperature may reduce the contact force between the microdevices and the cartridge. Thus, enabling the transfer of microdevices to the receiver substrate. In this case, the positions allocated to the microdevices on the receiver substrate have a higher profile compared to the rest of the receiver substrate to enhance the transfer process. In an embodiment, the cartridge does not have microdevices in areas that may be in contact with unwanted areas of the receiver substrate, such as the positions allocated to the other type of microdevices during the transfer process. These two examples may be combined. In an embodiment, the allocated positions for the microdevices on the substrate may have been selectively wetted with adhesive, or covered with bonding alloys, or an extra structure is placed on the allocated position. In a stamping process, a separate cartridge, printing, or other process may be used. In an embodiment, the selected microdevices on the cartridge may be moved closer to the receiver substrate to enhance the selective transfer. In another case, the receiver substrate applies a pull force to assist or initiate the microdevice transfer from the cartridge. The pull force can be in combination with other forces.

In one embodiment, a housing will support the microdevices in the cartridge. The housing may be fabricated around the microdevice on the donor substrate or cartridge substrate, or fabricated separately and then microdevices are moved inside and bonded to the cartridge. In one embodiment, there may be at least one polymer (or another type of material) deposited on top of the cartridge substrate. The microdevices from the donor substrate are pushed into the polymer layer. The microdevices are separated from the donor substrate selectively or generally. The layer may be cured before or after the devices are separated from the donor substrate. This layer may be patterned especially if multiple different devices are integrated into the cartridge. In this case, the layer may be created for one type, the microdevices buried in the layer and separated from their donor. Then, another layer is deposited and patterned for the next type of microdevices. Then, the second microdevices are buried in the associated layer. In all cases, this layer may cover part of the microdevices or the entirety of the devices. In another case, the housing is built by polymer, organic or other layers after the microdevices are transferred to the cartridge. The housing may have different shapes. In one case the housing may match the device shape. The housing sidewalls may be shorter than the microdevice height. The housing sidewall may be connected to the microdevice prior to the transfer cycle to provide support for different microdevice post processing in the cartridge and microdevice cartridge packaging for shipment and storage. The housing sidewalls may be separated or the connection to the microdevice may be weakened from the device prior to or during the transfer cycle by different means such as heating, etching, or light exposure. There may be a contact point that holds the microdevice to the cartridge substrate. The contact point to the cartridge may be either a bottom or a top side of the device. The contact point may be weakened or eliminated prior to or during the transfer by different means such as heat, chemical process, or light exposure. This process may be performed for some selected devices or globally for all the microdevices on the cartridge. The contact may also be electrically conductive to enable testing the microdevices by biasing the devices at the contact point and other electrodes connected to the microdevices. The cartridge may be beneath the receiver substrate during the transfer cycle to prevent the microdevice from falling off from the housing if the contact point is removed or weakened globally.

In one embodiment, the microdevice cartridge may include at least one anchor that holds the microdevices to the cartridge surface. The cartridge and/or receiver substrates are moved so that some of the microdevices in the cartridge become aligned with some positions in the receiver substrate. This anchor may break under pressure during either the pushing of the cartridge and the receiver substrate toward each other or the pulling of the device by the receiver substrate. The microdevices may stay on the receiver substrate permanently. The anchor may be on the side of the microdevice or at the top (or bottom) of the microdevice.

The top side is the side of the device facing the cartridge and bottom is the opposite side of the microdevice. The other sides are referred as sides or sidewalls.

In one embodiment, the microdevices may be tested to extract information related to the microdevices, including but not limited to defects, uniformity, operation condition, and more. The cartridge may be placed in a predefined position (it could be a holder). Either the cartridge and/or the receiver substrate may be moved to become aligned. At least one selected microdevice may be transferred to the receiver substrate. If more microdevices are available on/in the cartridge, either the cartridge or receiver substrate may be moved to become aligned with a new area in the same receiver substrate or a new receiver substrate and at least another selected device may be transferred to the new place. This process may continue until the cartridge does not have enough microdevices, at which time a new cartridge will be placed in the predefined position. In one case, transfer of the selected devices may be controlled based on the information extracted from the cartridge. In one case, the defect information extracted from the cartridge may be used to limit the number of defective devices transferred to the receiver substrate to below a threshold number by eliminating the transfer of a set of microdevices, which have a defect number more than a threshold value or the cumulative number of transferred defects are more than a threshold value. In another case, the cartridges will be binned based on one or more extracted parameters and each bin may be used for different applications. In another case, cartridges with close performance based on one or more parameters may be used in one receiver substrate. The examples presented here may be combined to improve the cartridge transfer performance.

One embodiment comprises a method to transfer the microdevices to a receiver substrate. The method includes:
a) Preparing a cartridge which has a substrate in which microdevices are located on at least one surface of the cartridge substrate, and has more microdevices in an area than microdevice locations in the same size corresponding area in the receiver substrate.
b) Testing the devices on the cartridge by extracting at least one parameter.
c) Picking or transferring the cartridge to a position with microdevices facing the receiver substrate.
d) Using the test data to select a set of microdevices on the cartridge.
e) Aligning the selected set of microdevices on the cartridge and a selected position on the receiver substrate. The set of microdevices is transferred to the receiver substrate from the cartridge.
f) The process d and e may continue until the cartridge does not have any useful devices or the receiver substrate is fully populated.

One embodiment comprises a cartridge which has more than one type of microdevice that are located in the cartridge in the same pitch as in the receiver substrate.

One embodiment comprises a cartridge which has a substrate, wherein the microdevices are located on the surface (directly or indirectly) thereof, and the microdevices are skewed in either rows or columns so that at least the edge of either one row or a column is not aligned with the edge of at least another row or a column.

One embodiment is a method to transfer the microdevices to a receiver substrate. The method includes transferring an array of microdevices into a substrate where at least the edge of either one row or a column of the transferred microdevices is not aligned with the edge of at least another row or a column of transferred devices.

One embodiment comprises a method to transfer the microdevices to a receiver substrate. The method includes transferring an array of devices from a donor substrate to a receiver substrate, wherein in any area on the receiver substrate similar to the size of the transferred array there is at least either one row or column that has microdevices from two different areas from the donor substrate corresponding to the transferred array.

One embodiment comprises a process to transfer arrays of microdevices into a receiver substrate, wherein the microdevices are skewed at the edges of the array to eliminate abrupt change.

Another embodiment comprises a process to transfer arrays of microdevices into a receiver substrate, wherein the performance of the microdevices at the adjacent edges of two arrays of microdevices is matched prior to the transfer.

Another embodiment comprises a process to transfer arrays of microdevices into a receiver substrate where the array of microdevices is populated from at least two different areas of microdevice donor substrates.

Another embodiment comprises a process to transfer an array of microdevices into a receiver substrate from a cartridge where several microdevice cartridges are placed in different positions corresponding to different areas of the receiver substrate, and then the cartridges are aligned with the receiver substrate, and the microdevices are transferred from cartridges to the receiver substrate.

Different Anchor Schemes for Securing Microdevices on a Donor Substrate

The process of integration of microdevices into a system substrate involve development and preparation of donor substrate, transferring of a pre-selected array of micro devices to the receiver substrate, followed (or in parallel) by electrically or mechanically bonding of the microdevices with the system substrate. During bonding between two substrates, application of curing agents before or after alignment of micro devices and system substrates assists with formation of strong bonds. The curing agent comprises one of: polyamide, SUB, PMMA, BCB thin film layers, epoxies, and UV curable adhesives, and the curing is performed in one of a: current, light, thermal, or mechanical force, or chemical reaction. However, the current/voltage requirement for curing might be higher than what a microdevice can handle.

To avoid damaging the microdevices, there is a need for structures and methods to integrate microdevices into a system substrate with enhanced bonding and conductivity capability. Also, another/alternative paths for current/voltage can be created to avoid damaging the microdevices.

According to one embodiment, a bonding structure may be provided. The bonding structure may comprising a plurality of microdevices on a donor substrate, each micro device comprises one or more conductive pads formed on a surface of the microdevice; and a temporary material to cover at least a part of each microdevice or the one or more conductive pads.

In one case, the temporary material act as an anchor holding the plurality of microdevices inside a housing structure in the donor substrate.

In another case, the entire or part of the microdevice may be covered by temporary conductive materials that may redirect the current through the temporary conductive materials instead of the microdevice and therefore, avoid damaging the microdevice.

In one case, the microdevices may have one conductive pad on each side of the microdevice. In another case, the microdevice may have more than one conductive pad on one side.

Figure 18:
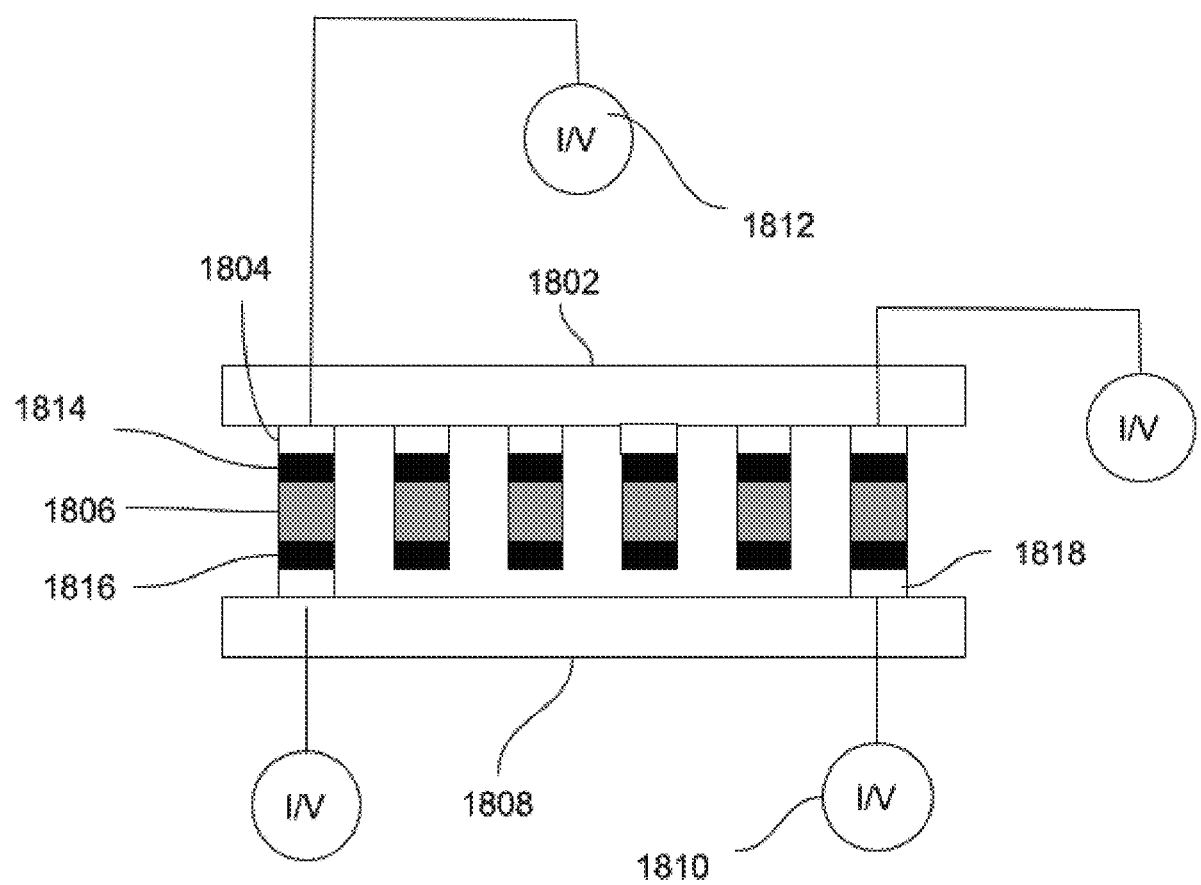
FIG. 18 shows a donor substrate that holds microdevices through a donor force element, in accordance with an embodiment of the invention.

FIG. 18 shows a donor substrate 1802 that holds a plurality of microdevices through a donor force element, in accordance with an embodiment of the invention. The donor substrate 1802 can be a growth substrate (where microdevices are manufactured or grown) or another temporary substrate onto which they have been transferred. The following is described with reference to a gallium nitride based (GaN) LED, however the presently described structure can be used for any type of LED with different material systems.

In general, GaN-based microLEDs are fabricated by depositing a stack of material on a sapphire substrate. A conventional GaN LED device which includes a substrate, such as sapphire, an n-type GaN layer formed on the substrate or a buffer layer (for example GaN), active layers/semiconductor layers such as multiple quantum well (MQW) layer and a p-type GaN layer.

As shown in FIG. 18, the plurality of microdevices on the donor substrate 1802 may have conductive pads 1814, 1816 on both the top and bottom of a stack of semiconductor layers 1806. The receiver substrate 1808 has at least one receiving force element 1818 for each selected microdevice chosen to be transferred to the receiver substrate 1808. In one case, the receiving force element is a current/voltage curable component. Here a current/voltage 1810 is applied to the selected receiving force element (e.g., 1818), causing it to harden and hold the microdevices in place. In one example, the receiving force element may comprise monomers that form polymers under an applicable charge. In another example, the receiving force element is a medium with high resistance traces generating heat under applicable current/voltage and the generated heat cures the medium locally.

The donor substrate 1802 has at least one donor force element 1804. The donor force element 1804 is an element that loses its adhesion property under current or voltage. Here, a voltage/current 1812 is applied to the donor force element 1804 that holds the selected device for transfer. In one example, the donor force element is a polymer that decomposes (oxidize) under the charge application. In another example, the donor force element is highly resistive traces that burn under applicable current/voltage.

Figure 19:
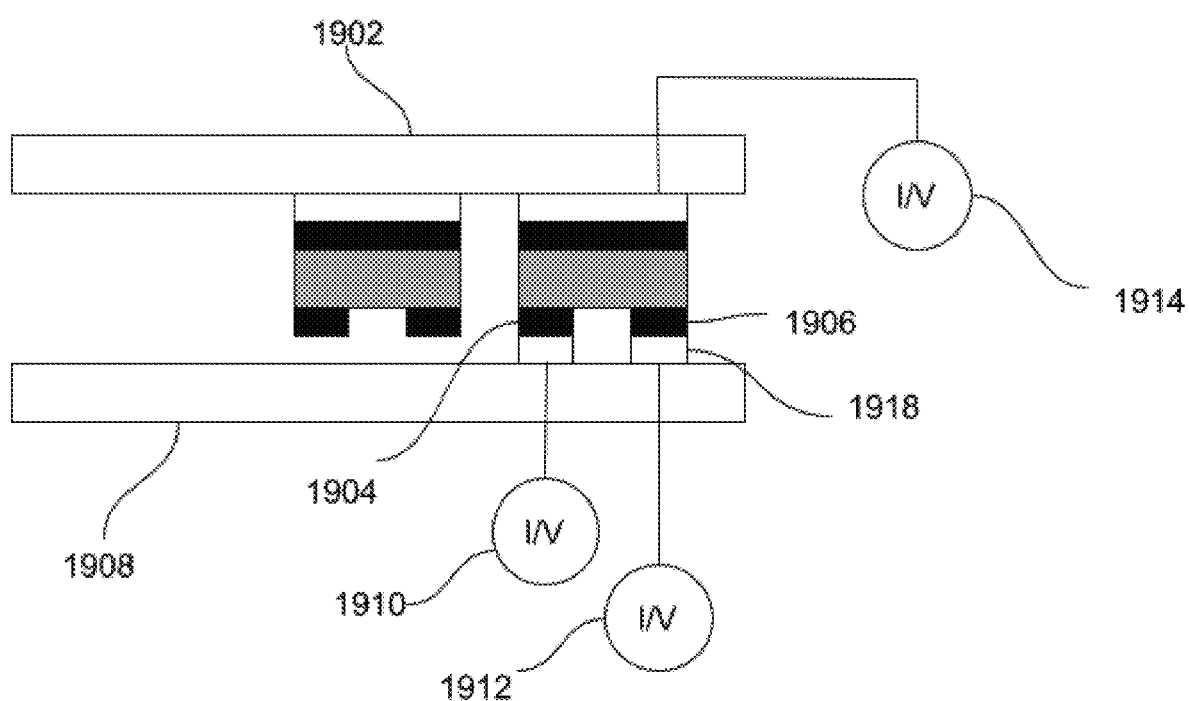
FIG. 19 shows an example of a microdevice that has more than one contact pad on one side, in accordance with an embodiment of the invention.

FIG. 19 shows a microdevice that has more than one conductive pad on one side, in accordance with an embodiment of the invention. Here, in one example, the microdevice may have two conductive/contact pads 1904, 1906 at the bottom of the stack of semiconductor layers on the donor substrate 1902. The receiver substrate 1908 has one receiving force element 1918 that corresponds to the contact pad for each microdevice chosen to be transferred to the receiver substrate 1908. The receiving force element is a current/voltage curable component. Here, a current/voltage 1910 is applied to the selected receiving force element (e.g., 1918), causing it to harden and hold the microdevices in place.

The voltage/current 1910, 1912 can be applied to the selected receiving force element (e.g., 1918) to cure it, causing it to harden and hold the microdevices in place.

In one case, the microdevice can be used as a part of the biasing loop. Here, a voltage/current 1914 may be applied through the donor substrate 1902 or a voltage/current 1910, 1912 may be applied to a receiver substrate 1908, which passes through the microdevice and goes through either the donor substrate 1902 or the receiver substrate 1908.

However, the current/voltage requirement to cure the receiving force element might be higher than what the microdevice can handle. To avoid damaging the microdevice, another/alternative paths for current/voltage can be created. In another case, part of or the entire microdevice may be covered by temporary conductive materials that may redirect the current through the temporary conductive materials instead of the microdevice and avoid damaging the microdevice.

FIGS. 20A-20I show examples of microdevices partially/fully covered by the temporary conductive materials, in accordance with some embodiments of the invention.

A part or the entirety of the microdevice may be covered by temporary conductive materials that may redirect the current through the temporary conductive materials instead of the microdevice and therefore avoid damaging the microdevice. In one case, the temporary material can be a temporary conductive material. The conductive materials can be connected as a sheet or traces with the same conductive material or different conductive materials on the donor substrate.

In one embodiment, the microdevices can be inside a housing structure. There can be some sacrificial layer between the housing walls and the microdevices. In another embodiment, there can also be a bonding material between the donor substrate and the microdevice and conductive pads, a similar material as housing walls, or a combination of them.

In one embodiment, the temporary layer can act as an anchor to hold the device in place as well. In another embodiment, there can be an anchors holding the microdevices into the donor substrate. The anchors can be the same as the housing materials or different materials. In one case, the housing can extend to almost the edge of the microdevices. In another case, the housing walls are shorter than the microdevices. It is also possible to have housing that is taller than the microdevice.

In another case, the temporary conductive materials can be replaced by non-conductive materials.

For a case with both conductive and non-conductive temporary material, the temporary material can hold the microdevice in place after the sacrificial layer is removed or released. The microdevice can be transferred to another substrate. During the transfer process, the temporary material is either removed or separated from the housing structure. The separation process can be mechanical (e.g., push or pull), optical, thermal, or chemical.

The microdevice can be covered by the temporary material/layer before being transferred to the receiver substrate, or it can be covered after being transferred to the receiver substrate. In one case, housing material is coated on the substrate between the microdevices. It can be bonded to a donor substrate, and then the housing material can be cured. In another case, there can be a different material used on the surface of the donor substrate that can be electrically coupled to the microdevice or temporary layer. In another case, the housing material is coated on top of the donor substrate. Then, the microdevice is bonded and pushed into the materials, and then the materials are cured. The housing materials can be epoxy, polymers, or other types of materials. In one case, BCB or polyamide can be used as a housing material.

The temporary materials can be patterned to create openings on top of the donor substrate. This opening can facilitate some processing such as removing the sacrificial layers to separate the microdevice from the housing sidewalls.

FIGS. 20A1-20A2 show an example highlighting the temporary conductive material covering the surface of the microdevice, in accordance with some embodiments of the invention.

Referring to FIG. 20A1, here, the microdevices are inside a housing structure 2006a. There can be some sacrificial layer between the housing structure/walls 2006a and the microdevices 2016. In one case, the sacrificial layer 2008a can be a patterned sacrificial layer to cover to the length of the housing. In another case, the sacrificial layer 2008b can be provided to the length of the microdevices. Between the donor substrate and the microdevice can be a bonding material 2010a, conductive pads 2004a, or a similar material as housing walls or a combination of them. Also, anchors 2014a can hold the microdevices in the donor substrate. The anchors can be the same as the housing materials or different materials. The temporary conductive material 2002a may cover the surface of the microdevices 2016 including the conductive pads 2004a and housing 2006a. This structure facilitates transferring the microdevices inspecting defective microdevices on system substrate.

In another embodiment, the housing walls can extend to almost the edge of the microdevice.

FIG. 20A2 illustrates a cross-sectional view of microdevices on a device (donor) substrate, wherein the temporary conductive material does not cover the entire surface of the microdevices, in accordance with an embodiment of the invention. Here, the housing 200b and sacrificial layer 2008b can extend to almost the edge of the microdevices 2016. The temporary conductive material 2002a may include the conductive pad 2004a. The traces on the donor substrate or a conductive layer between the donor substrate can couple the conductive material to the current/voltage source.

FIG. 20B1 illustrates a cross-sectional view of microdevices on a device (donor) substrate wherein the temporary conductive material covers a part of a conductive pad of microdevices, in accordance with an embodiment of the invention. Here, the conductive pads e.g., 2004c are patterned conductive pads and the sacrificial layer 2008c is also a patterned sacrificial layer deposited around the microdevice and the conductive pad. The temporary conductive material 2002a may cover the surface of the microdevice 2016 including a part of the conductive pads 2004a and housing 2006a. In another case, the sacrificial layer can be extended only to a part of microdevice. The temporary conductive material 2002a can be coupled to a current source/voltage to facilitate the curing or debonding. The traces on the donor substrate or a conductive layer between the donor substrate can couple the conductive material to the current/voltage source.

FIG. 20B2 illustrates a cross-sectional view of microdevices on a device (donor) substrate wherein the temporary conductive material does not cover the entire surface of the microdevices, in accordance with an embodiment of the invention. Here, the housing 2006b can be extended almost at the edge of microdevices. The temporary conductive material 2002a may include a part of the conductive pad 2004b.

FIG. 20C1 shows an example of the temporary conductive material creating a current/voltage path between the conductive pads 2004c, 2006c, where the conductive pads can be on the top and bottom or the same side of the microdevice. Here, the temporary conductive material 2002c also covers the microdevices which facilitates selective transfer of microdevices to the system substrate. This structure helps redirect the current through the temporary conductive materials instead of the microdevice and therefore avoid damaging the microdevice.

FIG. 20C2 shows an example where there is no bonding material between the donor substrate and the microdevice. The temporary conductive material creates a current/voltage path between the conductive pads 2004c, 2006c, where the conductive pads can be on the top and bottom or the same side of the microdevice. The temporary conductive material 2002c also covers one of the surfaces of the microdevice. Here, the temporary conductive material acts as a bonding material to the microdevices.

Figure 20D:
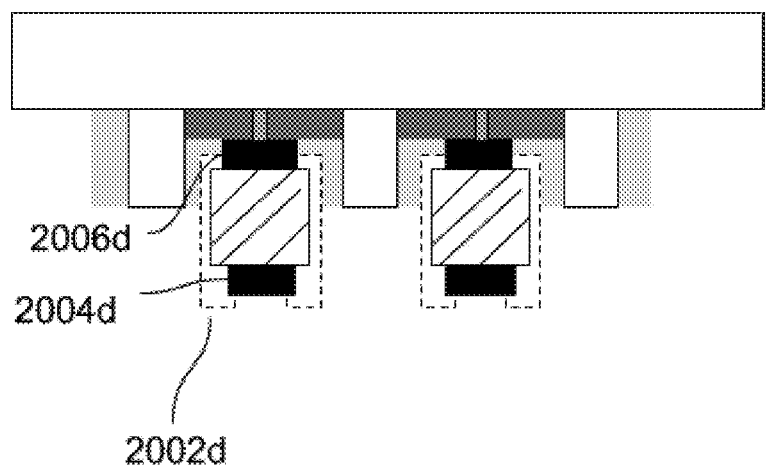
FIGS. 20D-20H show another example highlighting the temporary conductive material covering microdevices, in accordance with some embodiments of the invention.

FIG. 20D shows another example of the temporary conductive material 2002d creating a current/voltage path between the conductive pads 2004d, 2006d of the microdevice while the temporary conductive material 2002d and conductive pads do not cover the entire surface of the microdevice. Here, the conductive pads e.g., 2004d are patterned conductive pads and temporary material is deposited on the patterned conductive pads.

Figure 20E:
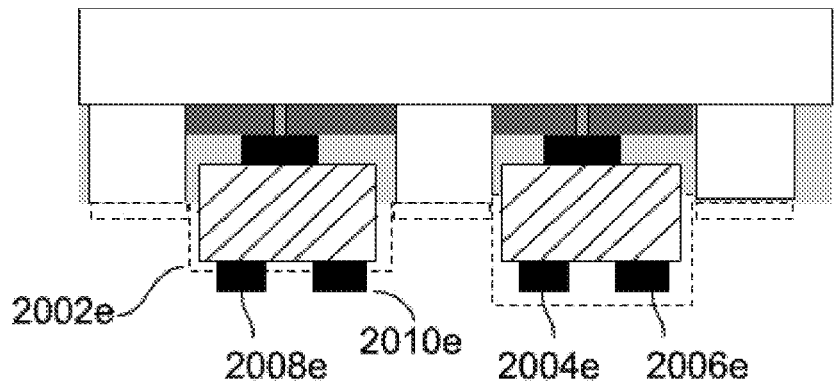

FIG. 20E shows another example where the temporary conductive material 2002e creates a current/voltage path for more than one pad on the surface of the microdevice. Here, the conductive material shorts the conductive pads on the surface of the microdevices. The conductive material covers the pads 2004e, 2006e or connects to the pads 2008e, 2010e. Also, a trace (directly or indirectly) on the donor substrate can connect some of the conductive materials together. Here, the conductive material can cover the conductive pads partially or fully according to the voltage and current requirements.

Figure 20F:
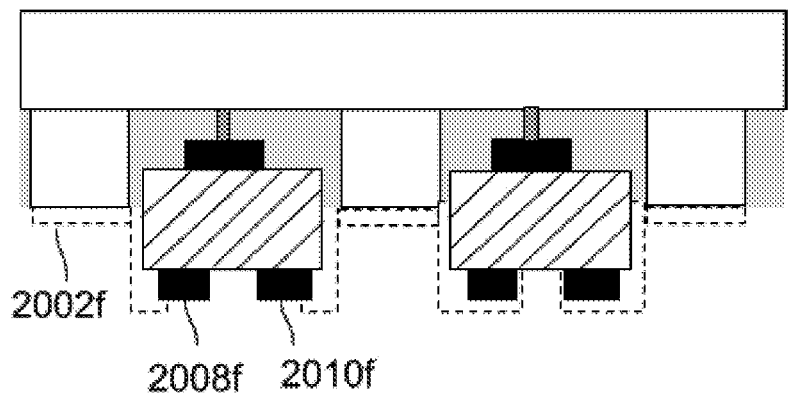

FIG. 20F shows an example of the conductive pads 2008f, 2010f on the surface are not shorted together by the conductive layer 2002f Here, the pads can be fully or partially covered by the conductive layer 2002f as shown. Also, there is no bonding material between the donor substrate and the microdevices. The temporary conductive material acts as a bonding material for microdevices.

Figure 20G:
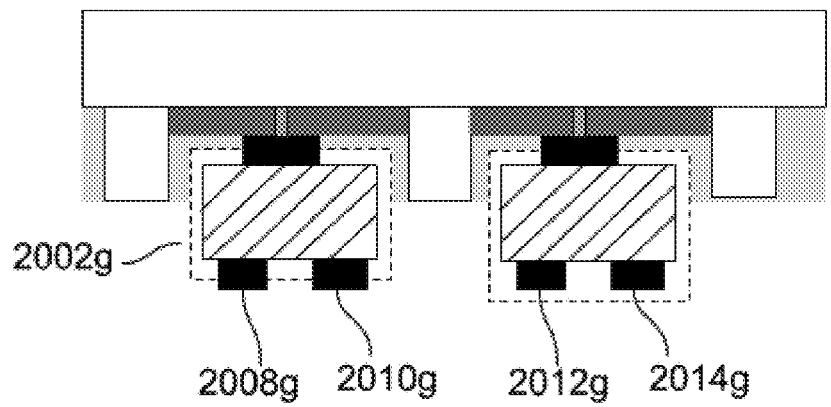

FIG. 20G shows another example where the temporary conductive material 2002g creates a current/voltage path for more than one pad on the surface of the microdevice. Here, the conductive material creates a pass between the surface that faces the donor substrate and the face that is away from the donor substrate. Also, in one case, it shorts the pads on the surface. Here, the conductive material covers the conductive pads 2012g, 2014g or connects to the conductive pads 2008g, 2010g.

Figure 20H:
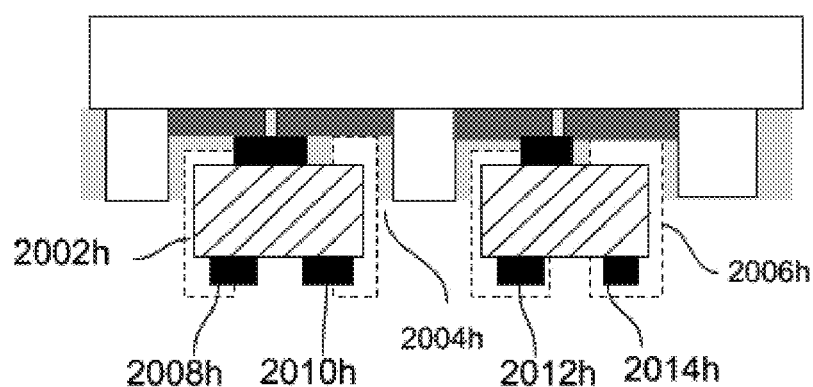

FIG. 20H shows an example of the conductive pads 2008h, 2010h on the surface not shorted together by the conductive layer 2002h. Here, the conductive pads 2012h, 2014h can be fully covered or the conductive pads 2008h, 2010h can be partially covered as shown. In all cases, the conductive material 2004h can directly couple the surface away from the donor substrate to a conductive layer at the donor substrate. In another case, it indirectly couples the surface away from the donor substrate to a conductive layer 2006h at the donor substrate.

FIG. 20I1 and FIG. 20I2 show examples where there are no conductive pads on the surface away from the donor substrate. Here, there are no conductive pads on the surface of microdevices away from the donor substrate. In this case, the temporary material 2002h holds the device in place after the sacrificial layers 2006a, 2008a are removed. The temporary material is either removed or separated from the housing after the microdevice is transferred into another substrate so that the microdevice is released from the donor substrate.

FIGS. 21A-21D show top views of different microdevices structured with the temporary material (conductive or nonconductive), in accordance with embodiments of the invention. The temporary materials can be patterned to create openings on top of the donor substrate. This opening can facilitate some processing such as removing the sacrificial layers to separate the microdevice from the housing sidewalls. This processing can be done prior to or after the microdevice is transferred into the receiver substrate. In one case, chemical etching can be used to remove (or modify) the sacrificial layer. In another case, electromagnetic signals (such as microwave or light) may be used to release the device by removing/modifying the sacrificial layer. Here, the temporary layer can also act as an anchor to hold the device in place. If the temporary layer does not assist with the bonding process, it does not need to be connected (or cover) the pads on the microdevice.

Figure 21A:
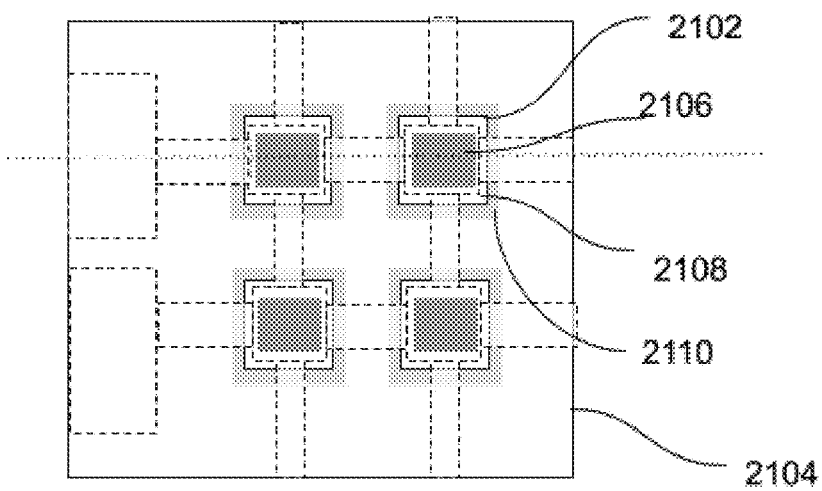
FIG. 21A shows an exemplary top view representation of FIG. 20A, in accordance with an embodiment of the invention.

FIG. 21A shows an exemplary top view representation of FIG. 20A, in accordance with an embodiment of the invention. Here, the microdevice 2102 on a donor substrate 2104 has a conductive pad 2106 surrounded by temporary conductive material 2108 and sacrificial layer 2110. Here, the traces of conductive material on the top of the donor substrate can be connected as mesh, rows, or columns. There can be an access point on the top of the donor substrate to bias the temporary layers through the traces.

FIG. 21B1 shows an exemplary top view representation of FIG. 20B. Here, the traces on the top of the donor substrate can be connected as mesh, rows, or columns. There can be an access point on the top of the donor substrate to bias the temporary layers through the traces. The microdevice 2102 on a donor substrate 2104 has a patterned conductive pad 2106-1 surrounded by a sacrificial layer 2110. The traces of temporary conductive material on the top of the donor substrate can be connected as mesh, rows, or columns. There can be an access point on the top of the donor substrate to bias the temporary layers through the traces.

FIG. 21B2 shows an example where the temporary material is not connected to the pads. The microdevice 2102 on a donor substrate 2104 has a conductive pad 2106-2 surrounded by a sacrificial layer 2110 and the traces of temporary conductive material on the top of the donor substrate can be connected as mesh, rows, or columns. This can be used for other embodiments in this disclosure or related structures.

Figure 21C:
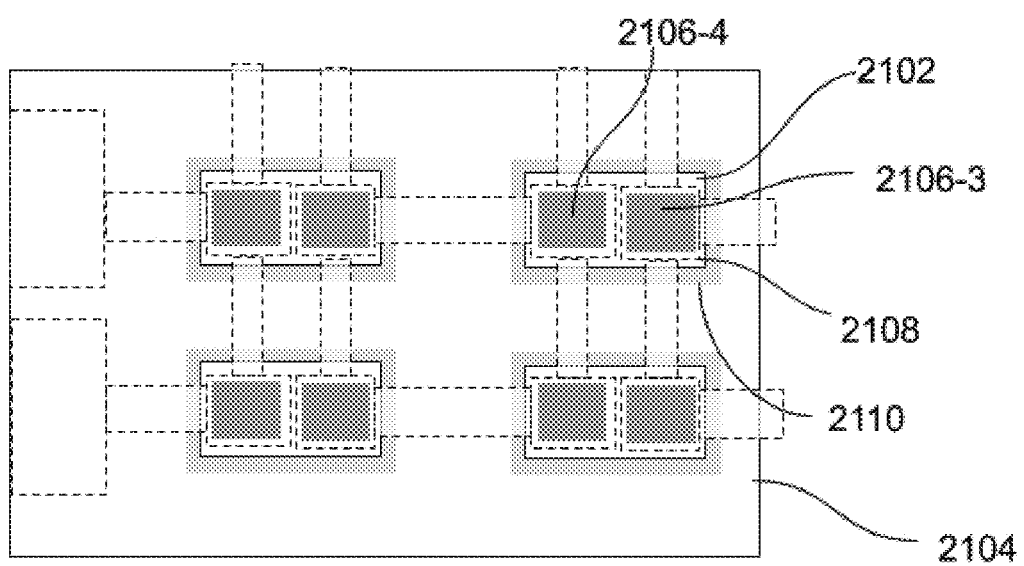
FIG. 21C shows an exemplary top view representation of FIG. 20E, in accordance with an embodiment of the invention.

FIG. 21C shows an exemplary top view representation of FIG. 20E wherein the microdevice 2102 has more than one pad (2106-3, 2106-4) are on the donor substrate 2104 surrounded by temporary conductive material 2108 and sacrificial layer 2110. Here, the traces on the top of the donor substrate 2104 can be either connected as mesh, rows, or columns. Also, the traces for each pad can be treated in separate connection groups. There can be an access point on the top of the donor substrate to bias the temporary layers through the traces.

Figure 21D:
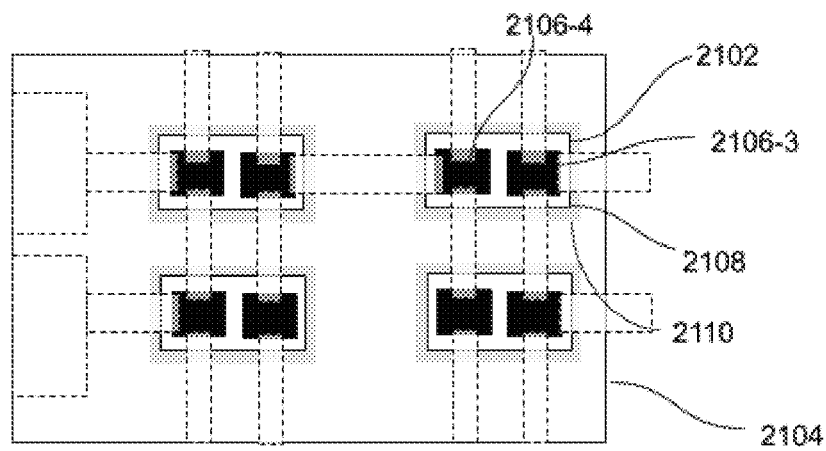
FIG. 21D shows an exemplary top view representation of FIG. 20F, in accordance with an embodiment of the invention.

FIG. 21D shows an exemplary top view representation of FIG. 20F wherein the microdevice 2102 has more than one patterned conductive pads (2106-3, 2106-4) are on the donor substrate 2104 surrounded by temporary conductive material 2108 and sacrificial layer 2110. Here, the traces on the top of the donor substrate 2104 can be either connected as mesh, rows, or columns. Also, the traces for each pad can be treated in separate connection groups. There can be an access point on the top of the donor substrate to bias the temporary layers through the traces.

Releasing Microdevices from Donor Substrate Through Breakable Anchors

Some embodiments of the present disclosure show that microdevices can be provided with different temporary anchors, whereby after liftoff the devices, the temporary anchor holds the device to the donor substrate and can be selectively moved toward or away from the surface of the donor substrate. As a result, when the donor substrate gets close to a receiver substrate, some selected devices are in proximity to or connection with the receiver substrate while other microdevices are still a significant distance from the receiver substrate. The temporary anchors release the micro devices after or during the microdevice are bonded to a pad in the receiver substrate either by the push force or by pull force. The anchors may break under pressure either during pushing the donor substrate and the receiver substrate toward each other or pulling the microdevices by the receiver substrate. The micro devices may stay on the receiver substrate permanently. The anchor may be on the side of the microdevice or at the top (or bottom) of the microdevice.

Figure 22A:
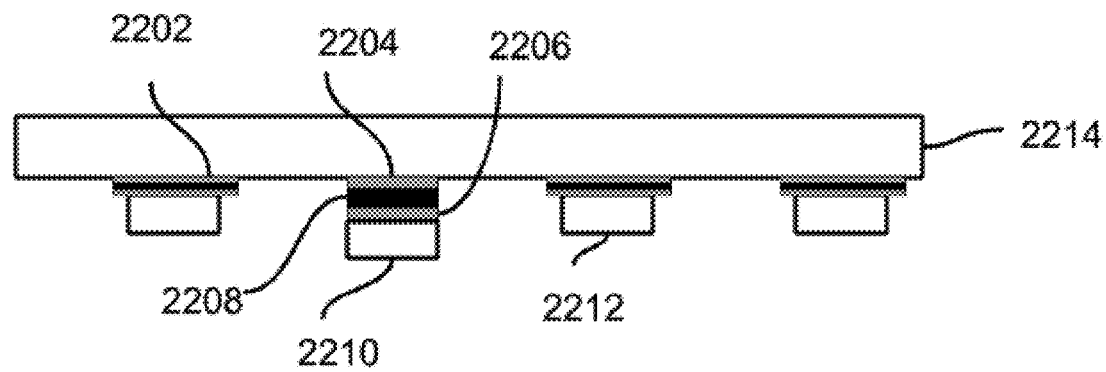
FIGS. 22A-22C show microdevices over a donor substrate where the microdevices can be selectively moved toward or away from the surface of the donor substrate, according to embodiments of the present invention.
Figure 22B:
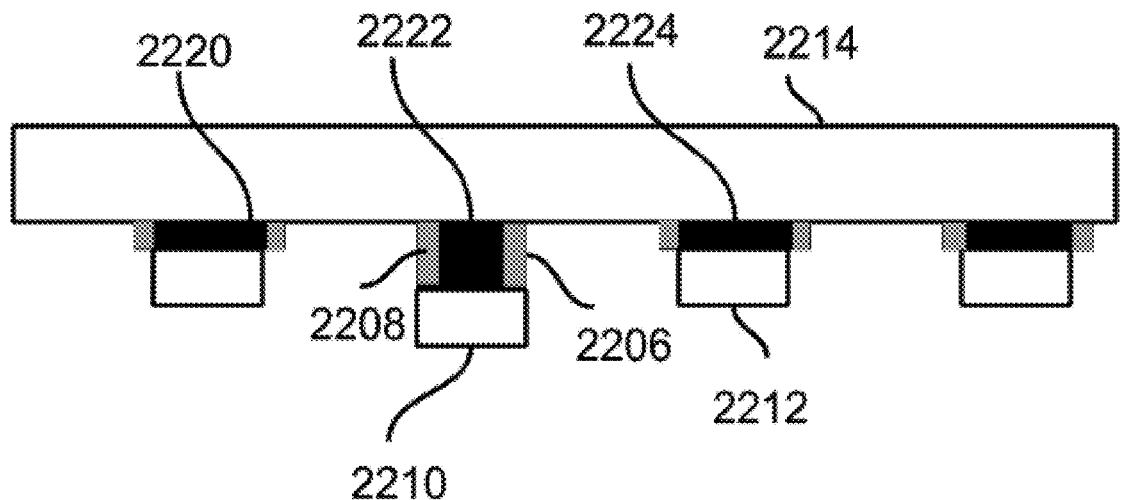
Figure 22C:
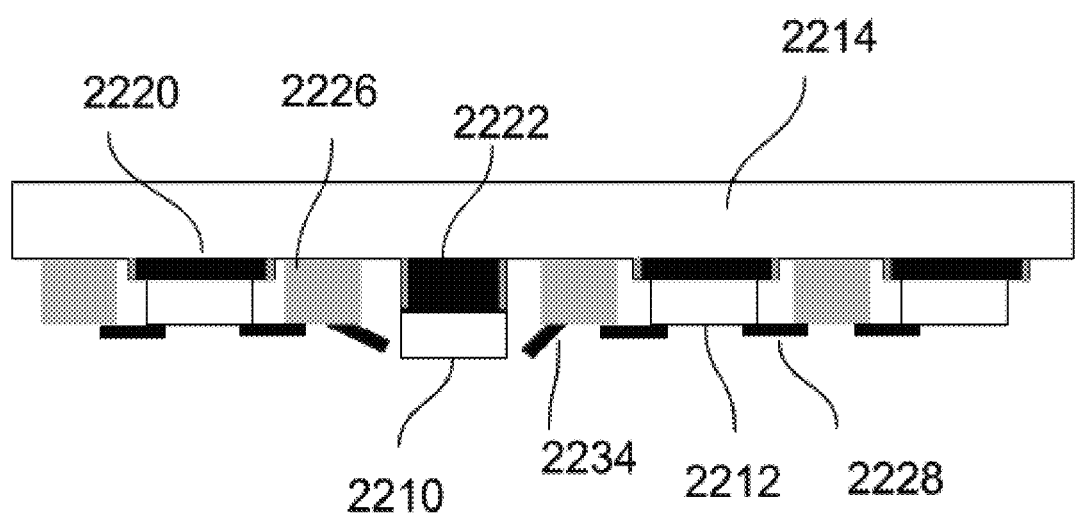

FIGS. 22A-22C show microdevices over a donor substrate where the microdevices can be selectively moved toward or away from the surface of the donor substrate, according to embodiments of the present invention.

Referring to FIG. 22A, according to one embodiment, a stack comprises electrodes 2204, 2206 and an electroactive polymer (EPE) layer 2208 formed underneath the microdevices e.g., 2210, 2212 on top of a donor substrate 2214. The donor substrate and/or receiver substrates are moved so that some of the micro devices in the donor substrate get aligned with some positions in the receiver substrate. In one case, applying a voltage to the stack causes the stacks to thin and therefore bring the devices closer to the surface of the receiver substrate.

Referring to FIG. 22B, according to another embodiment, a stack comprises electrodes 2208, 2206 and an electroactive polymer (EPE) layer 2222 formed underneath the microdevices e.g., 2210, 2212 on top of a donor substrate 2214. In one case, the electrodes can be provided around the EPE layer. The EPE layer can be thin or thick as per the requirements. When a voltage is applied to the stack comprises electrodes and EPE layer, the stack thickens. In one case, housing and anchors can hold the microdevices 2210, 2212 in place as well.

FIG. 22C shows another example, where the microdevice 2210, 2212 structure on top of the stacked electrodes and EPE 2222, 2220 are surrounded by a housing structure 2226. In addition, an anchor 2234 holds the microdevice 2210, 2212 inside the housing structure 2226. In another case, a bonding layer can hold the microdevice on top of the stacked EPE. The housing may have different shapes. In one case the housing may match the device shape. The housing side walls may be shorter than the micro device height. The housing side wall may be connected to the micro device prior to the transfer cycle to provide support for different post processing of micro devices.

During the microdevice 2210, 2212 transfer from the donor substrate 2214 to a receiver substrate, the EPE stack 2222 pushes the microdevice 2210 forward. The push force releases the anchors 2234 and the microdevice can be placed on the surface of a receiver substrate.

Figure 23A:
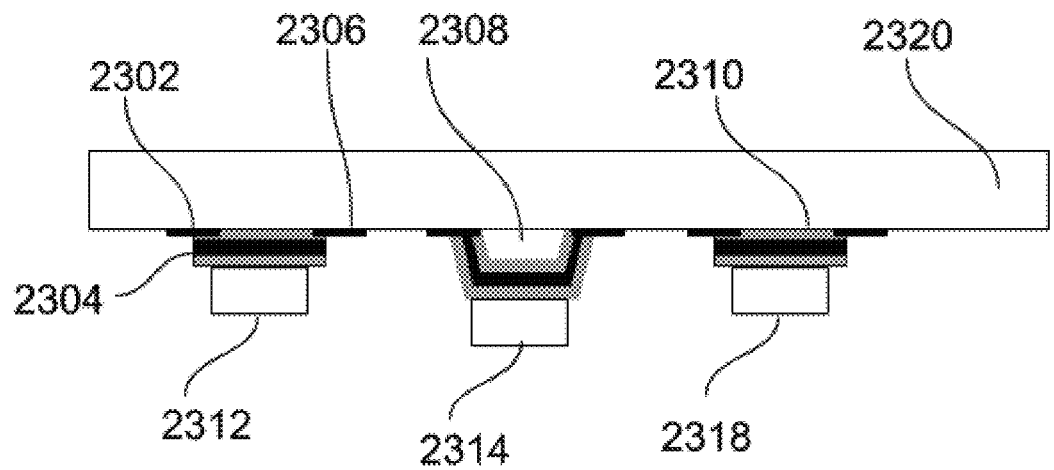
FIGS. 23A-23B show microdevices over a donor substrate where the microdevices can be selectively moved toward or away from the surface of the donor substrate, according to embodiments of the present invention.
Figure 23B:
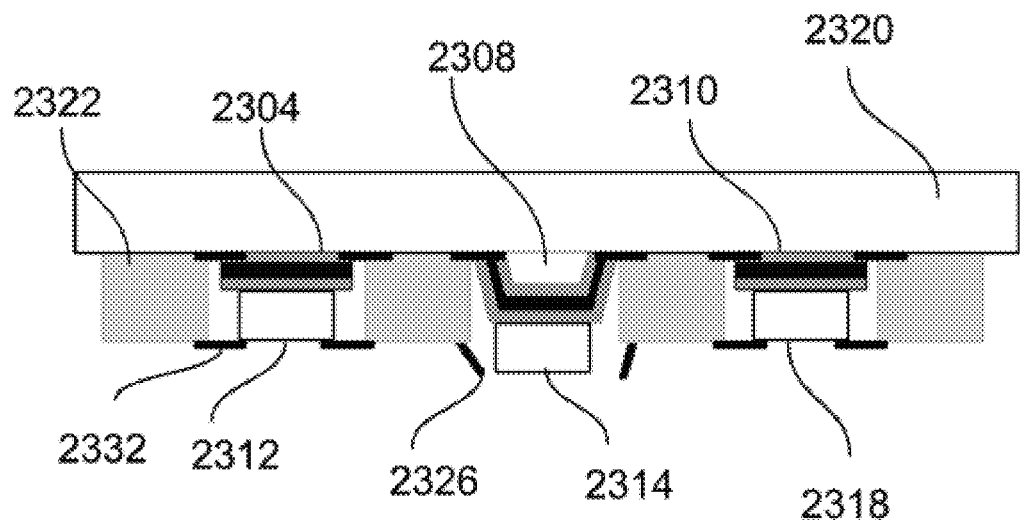

FIGS. 23A-23B show another embodiment where microdevices over a donor substrate where the microdevices can be selectively moved toward or away from the surface of the donor substrate.

In FIG. 23A, according to another embodiment, a stack of different materials 2304, 2308, 2310, with different thermal expansion coefficients, is formed underneath the microdevice 2312, 2314, 2318, respectively on top of a donor substrate 2320. When a temperature of the stack 2308 changes, the stack 2308 becomes warped and pushes the device 2314 further away from the surface of the donor substrate. In one case, applying electrical current through the stack changes the temperature. Here, electrodes 2302, 2306 can convey the current. In another case, a light absorption layer that is part of the stack converts the light to thermal energy. In another case, the stack can resonate to a specific signal frequency such as microwave or ultrasonic. This resonation can increase the temperature or deform the stack directly.

FIG. 23B shows another example, where the microdevice 2312, 2314, 2318 structure on top of the stacked layers 2304, 2308, 2310 is surrounded by a housing 2322. In addition, an anchor 2332, 2326 holds the devices 2312, 2314, and 2318 inside the housing structure. The anchors can be connected to the microdevice or the housing. During the device 2314 transfer from the donor substrate 2320 to a receiver substrate, the stack 2308 pushes the microdevice 2314 forward. The push force releases the anchors 2326 and the microdevice 2314 can be placed on the surface of a receiver substrate.

Figure 24:
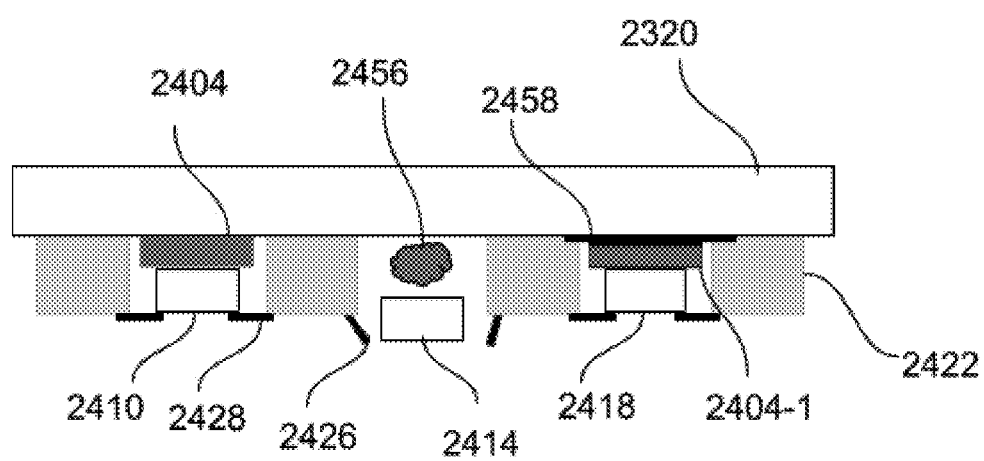
FIG. 24 shows another example of microdevices over a donor substrate where the microdevices can be selectively moved toward or away from the surface of the donor substrate, according to embodiments of the present invention.

FIG. 24 shows another example of microdevices over a donor substrate where the microdevices can be selectively moved toward or away from the surface of the donor substrate, according to embodiments of the present invention.

Here, the microdevice 2410, 2414, 2418 structure on top of the stacked layers 2404 is surrounded by a housing 2422. In addition, an anchor 2426, 2428 holds the devices 2410, 2414, and 2418 inside the housing structure. During the device 2414 transfer from the donor substrate to a receiver substrate, the electroactive polymer layer changes to gas 2456 and the pressure created by the change pushes the microdevice 2414 forward. The push/pull force releases the anchors 2426 and the microdevice 2414 can be placed on the surface of a receiver substrate. Thermal, optical, electrical, or chemical forces can change the layer 2404 to gas. In one case, an absorption layer 2458 can absorb the light and heat up the layer(s) 2404-1 and create gas pressure to push the microdevice forward.

Microdevice Cartridge Structure

Some embodiments of the present invention also disclose methods for the integration of a monolithic array of microdevices into a system substrate or selective transferring of an array of microdevices to a system substrate.

According to one embodiment, there may be provided a method of integrating microdevices on a backplane comprising; providing a microdevice substrate comprising one or more microdevices, bonding a selective set of the microdevices from the substrate to the backplane by connecting pads on the microdevices and corresponding pads on the backplane, leaving the bonded selective set of microdevices on the backplane by separating the microdevice substrate.

In one embodiment, a microdevice array can be developed on a microdevice substrate, wherein the microdevices may be developed by etching one or more planar layers.

In another embodiment, one or more planarization layers can be formed on the microdevice substrate and cured by temperature, light, or other sources.

In one embodiment, an intermediate substrate can be provided, wherein, in one case, one or more bonding layers may be formed on either the intermediate substrate or over the planarization layers.

In another embodiment, the microdevice substrate may be removed by laser or chemical liftoff.

In one embodiment, there may be an opening in the buffer layer that lets the microdevices connect to the planarization layer. In one case, an electrode may be provided on the top or bottom of the planarization layer.

In another embodiment, after the microdevice substrate is removed, an extra process can occur, such as removing extra common layers, or thinning the planarization layer and/or the microdevice.

In one case, more pads may be added to the microdevices. The pads may be electrically conductive or purely used to bond to a system substrate. In one case, the buffer layer may connect at least one microdevice to a test pad. The test pad may be used to bias the microdevice and test its functionality. The test may be done at the wafer level or at the intermediate (cartridge) level. The pad may be accessible at the intermediate level after the excess layers are removed.

In one case, the microdevice can have more than one contact at the top side, the buffer layers may be patterned to connect the contact of at least one of the microdevices to the test pads.

In one embodiment, a backplane may be provided. In one case, the backplane may have transistors and other elements for a pixel circuit to drive the microdevice. In another case, the backplane may be a substrate with no component.

In one embodiment, one or more pads may be provided on the backplane for the bonding process. In one case, the pads on the backplane or on the microdevice may create a force to pull out the microdevices.

After the microdevices are transferred to the backplane, it is possible to detect the location/position of the microdevices and adjust the patterning for other layers to match the alignment in the transfer. In one case, different means may be used to detect the location of a microdevice such as a camera or probe tips. In another case, an offset in the transfer set up may be used to identify the misalignment in the position of the microdevices on the system substrate. In yet another case, a color filter or conversion layer may also be adjusted based on the location of microdevices. In one case, some random offset may be induced in the microdevice location to reduce the optical artifacts.

In one embodiment, patterns related to the microdevices may be modified (e.g., electrodes coupling microdevices to a signal, functional tunable layers such as color filter or color conversion, vias opened in the passivation/planarization layer, or backplane layers).

In one case, a position/shape of an electrode may be modified based on the position of the microdevices. In another case, there can be some extension for each electrode whose position or length can be modified based on the position of the microdevice.

Figure 25A:
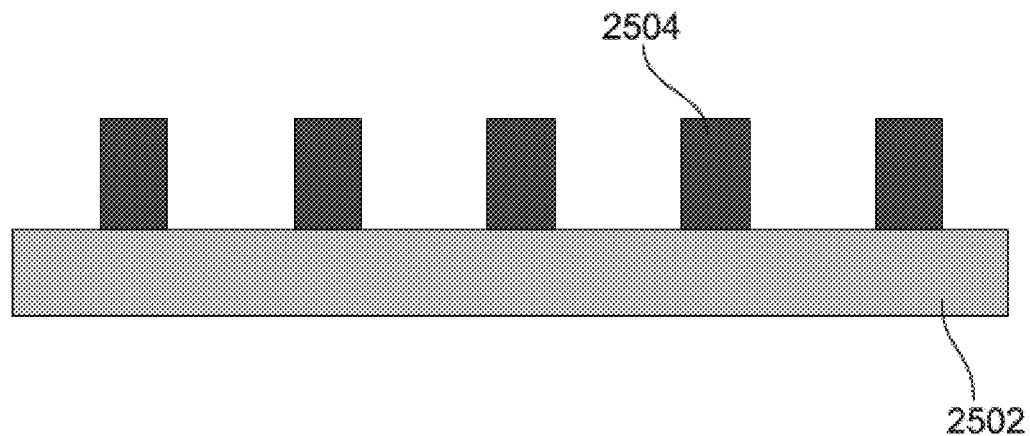
FIG. 25A shows a cross-sectional view of a microdevice array on a microdevice substrate, according to one embodiment of the present invention.

FIG. 25A shows a cross-sectional view of a microdevice array on a microdevice substrate, according to one embodiment of the present invention. Here, a microdevice substrate 2502 is provided. A microdevice array 2504 may be developed on the microdevice substrate 2502. In one case, the microdevices can be microLEDs. In another case, the microdevices may be any microdevice that is typically manufactured in planar batches, including LEDs, OLEDs, sensors, solid state devices, integrated circuits, MEMS, and/or other electronic components.

In one case, one or more planar active layers may be formed on a substrate. The planar active layers may comprise a first bottom conductive layer, functional layers (e.g., light emitting layers), and a second top conductive layer. The microdevices may be developed by etching the planar active layers. In one case, the etching may go all the way to the microdevice substrate. In another case, there may be partial etching on the planar layers to leave some on a surface of the microdevice substrate. Other layers may be deposited and patterned before or after the microdevices are formed.

Figure 25B:
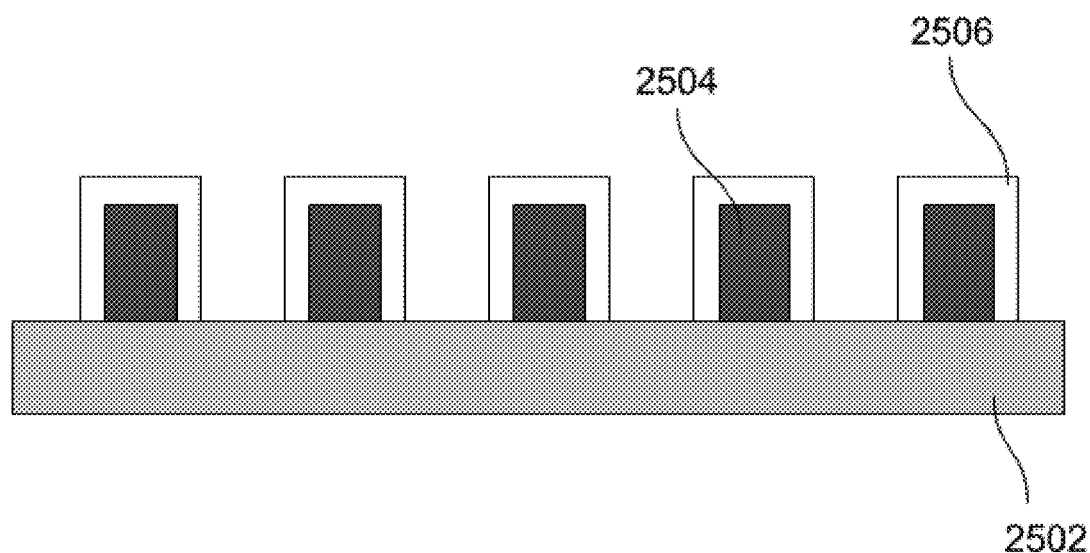
FIG. 25B shows a cross-sectional view of a microdevice array with a patterned buffer layer, according to one embodiment of the present invention.

FIG. 25B shows a cross-sectional view of a microdevice array with a buffer layer, according to one embodiment of the present invention. Here, a buffer layer 2506 may be formed on the microdevice array 2504. The buffer layer 2506 may extend over the surface of the microdevice substrate 2502. The buffer layer may be conductive. In one case, the buffer layer may be a patterned buffer layer. In another case, the buffer layer can be a common buffer layer. In one embodiment, the buffer layer 2506 may include an electrode that can be patterned or used as a common electrode.

Figure 25C:
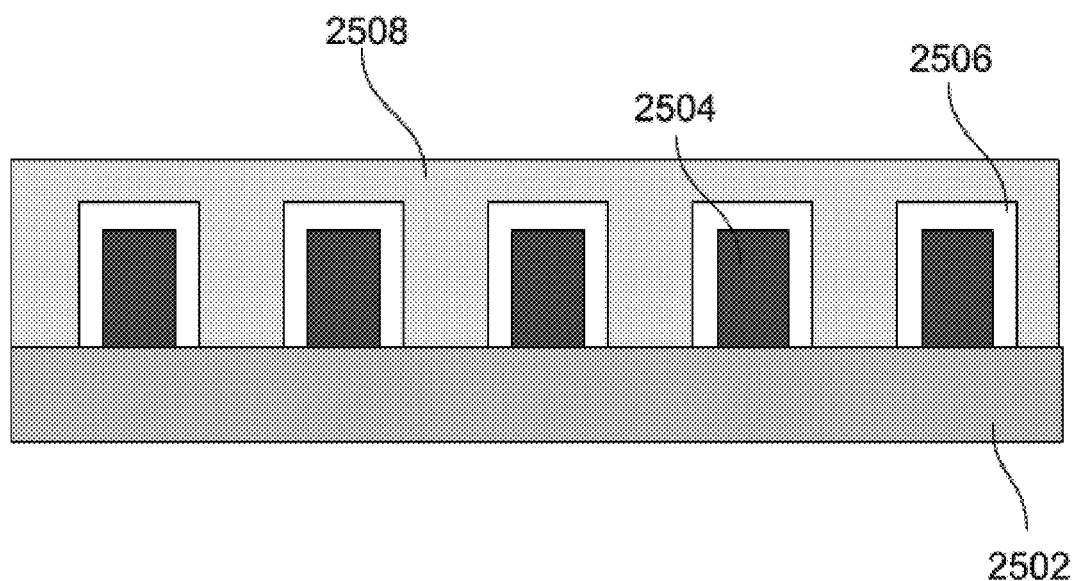
FIG. 25C shows a cross-sectional view of a microdevice array having a planarization layer, according to one embodiment of the present invention.

FIG. 25C shows a cross-sectional view of a microdevice array having a planarization layer, according to one embodiment of the present invention. A planarization layer 2508 may be deposited on top of the microdevice substrate 2502 surrounding each microdevice 2504. The planarization layer 2508 can be used for isolation and/or protection of microdevices. The planarization layer may comprise a polymer such as polyamide, SU8, or BCB. The planarization layer may be cured. In one case, the planarization layer may be cured through temperature, light, or some other source.

Figure 25D:
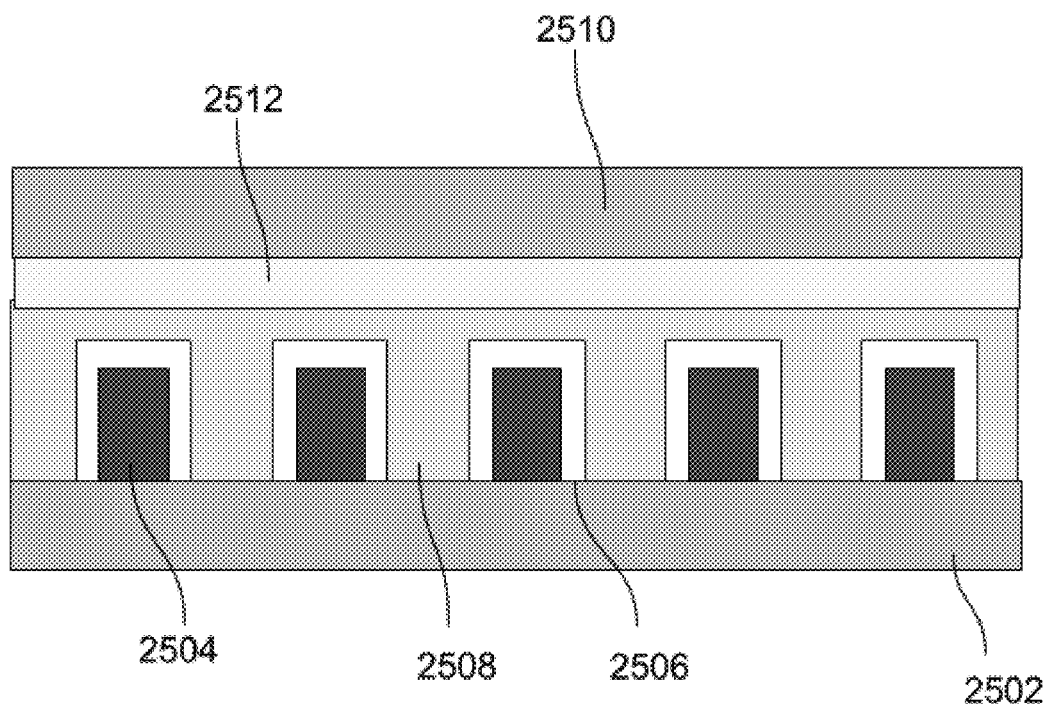
FIG. 25D shows a cross-sectional view of the microdevice array bonded to an intermediate substrate, according to one embodiment of the present invention.

FIG. 25D shows a cross-sectional view of the microdevice array bonded to an intermediate substrate, according to one embodiment of the present invention. In one embodiment, one or more bonding layers 2512 may be formed on the planarization layer 2508. The bonding layer(s) 2512 may be the same or different layers from the planarization layer. In another case, the bonding layer(s) may be formed on top of an intermediate substrate (cartridge) 2510. Bonding layer (s) may provide one or more different forces such as electrostatic, chemical, physical, or thermal. The bonding layer 2512 may come into contact with planarization layer 2508. To make a contact between the planarization layers and the bonding layers, the bonding layer is cured by pressure, temperature, light, or other sources. The intermediate substrate In one embodiment, after forming an intermediate substrate 2510 over the bonding layer, the microdevice substrate 2502 may be removed, which may be done by laser or chemical liftoff.

In one case, there may be an opening in the buffer layer 2506 that allows the microdevices 2504 to be connected to the planarization layer 2508. This connection may act as an anchor. In one case, the buffer layer may be etched to form a housing, base, or anchor that at least partially surrounds each microdevice. After liftoff, the anchor may hold the microdevice to the substrate. In another case, the buffer layer may couple at least one of the microdevice pads to an electrode. The electrode may be placed on the top or bottom of the planarization layer.

Figure 25E:
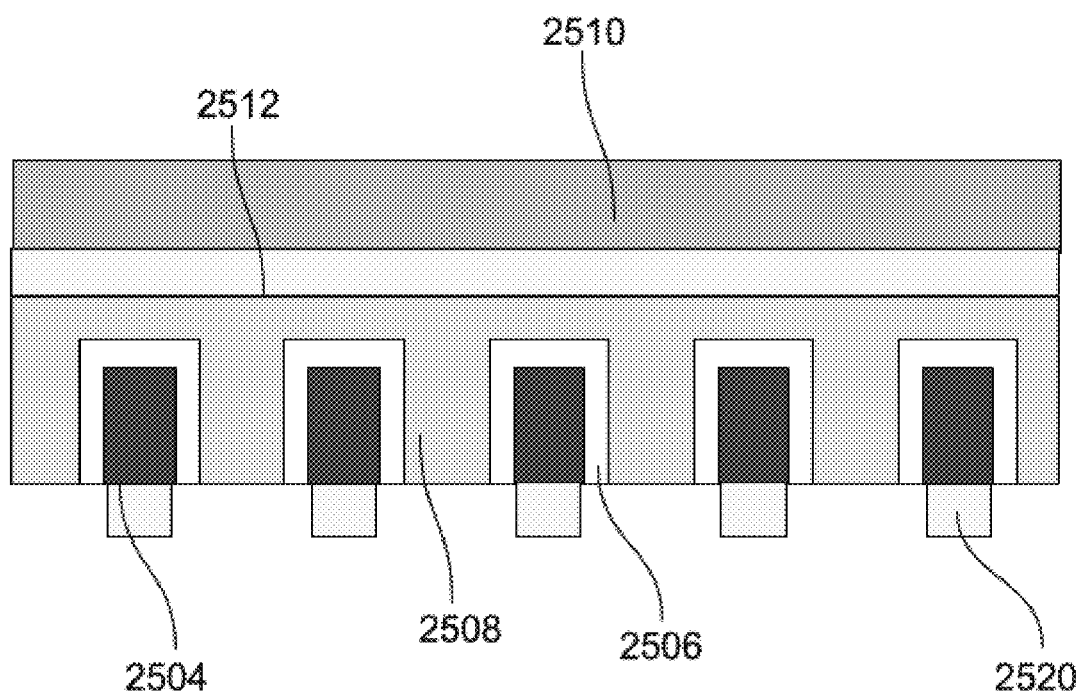
FIG. 25E shows a cross-sectional view of the microdevice array with pads, according to one embodiment of the present invention.

FIG. 25E shows a cross-sectional view of the microdevice array with pads, according to one embodiment of the present invention. The microdevice substrate may be removed to enable a flexible system or for post processing steps performed on the side of the system facing the substrate. After the substrate is removed, extra processes may be done. These processes comprise one of: removing extra common layers or thinning the planarization layer and/or the microdevice. In one case, one or more pads 2520 may be added to the microdevices 2504. In one case, these pads may be electrically conductive. In another case, these pads be purely used to bond to a system substrate. In one case, the buffer layer 2506 may be conductive.

In one embodiment, the buffer layer 2506 may connect one or more microdevices to a test pad. The test pad may bias the microdevice and test its functionality. In one case, the test can be done at the wafer/substrate level. In another case, the test may be done at the intermediate (cartridge) level. The pad may be accessible at the intermediate level after the excess layers are removed.

In one case, if the microdevice has more than one contact at the top side, the buffer layer may be patterned to connect the contacts of at least one of the microdevices to the test pads.

Figure 26:
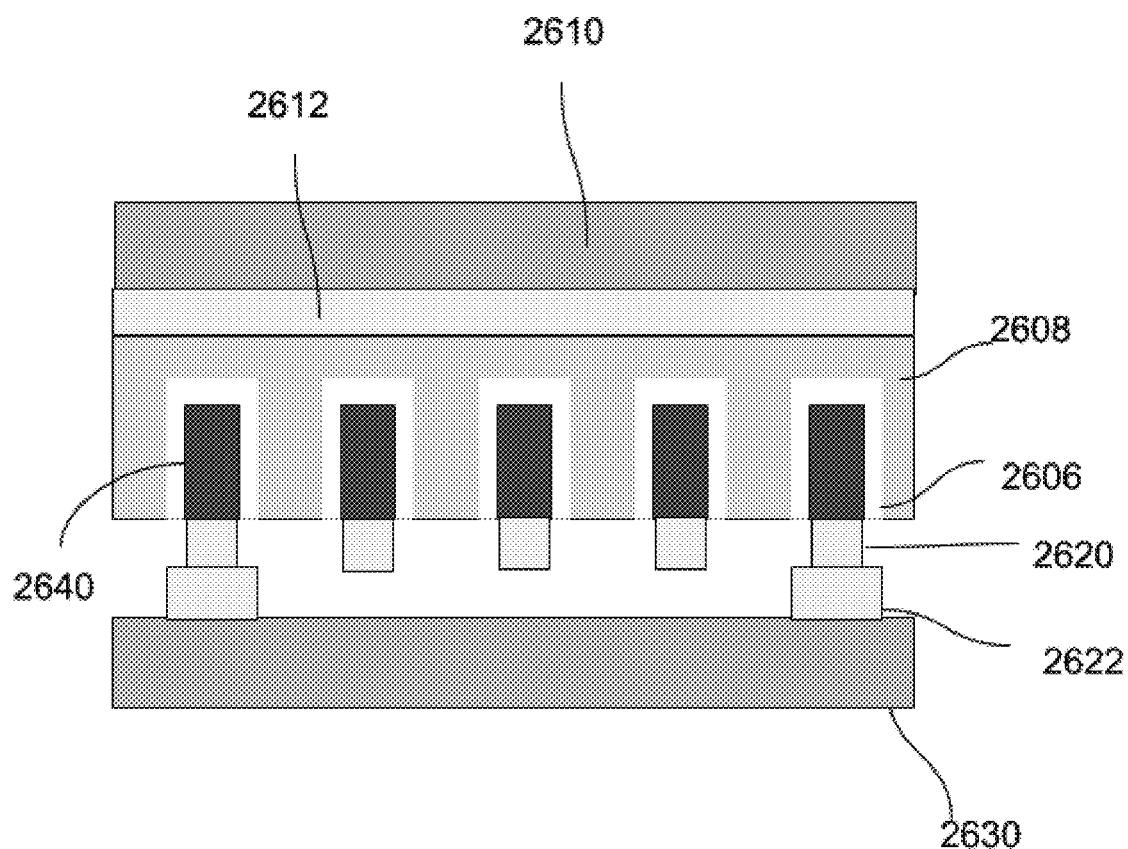
FIG. 26 shows a cross-sectional view of a microdevice array bonded to an intermediate substrate and a backplane, according to one embodiment of the present invention.

FIG. 26 shows a cross-sectional view of a microdevice array bonded to an intermediate substrate and a backplane, according to one embodiment of the present invention. Here, a backplane 2630 may be provided. In one case, the backplane may be made with a TFT process. In another case, the backplane may be made with a chiplet fabricated with complementary metal oxide semiconductor (CMOS) or other processes.

In one embodiment, the backplane may have transistors and other elements for a pixel circuit to drive the microdevices. In another embodiment, the backplane may be a substrate with no elements. One or more pads 2622 may be formed on the backplane 2630 to bond the backplane to the microdevice array. In one case, the one or more pads on the backplane may be electrically conductive.

In one embodiment, the buffer layer 2606 may be removed or deformed to release the microdevices. The pads 2622 on the backplane or the pads 2620 on the microdevices may create a force to pull out the selected microdevices 2640. In another embodiment, the buffer layer 2606 or the housing may be etched back, reduced, or removed. The housing may be removed from the empty LED spots.

Figure 27A:
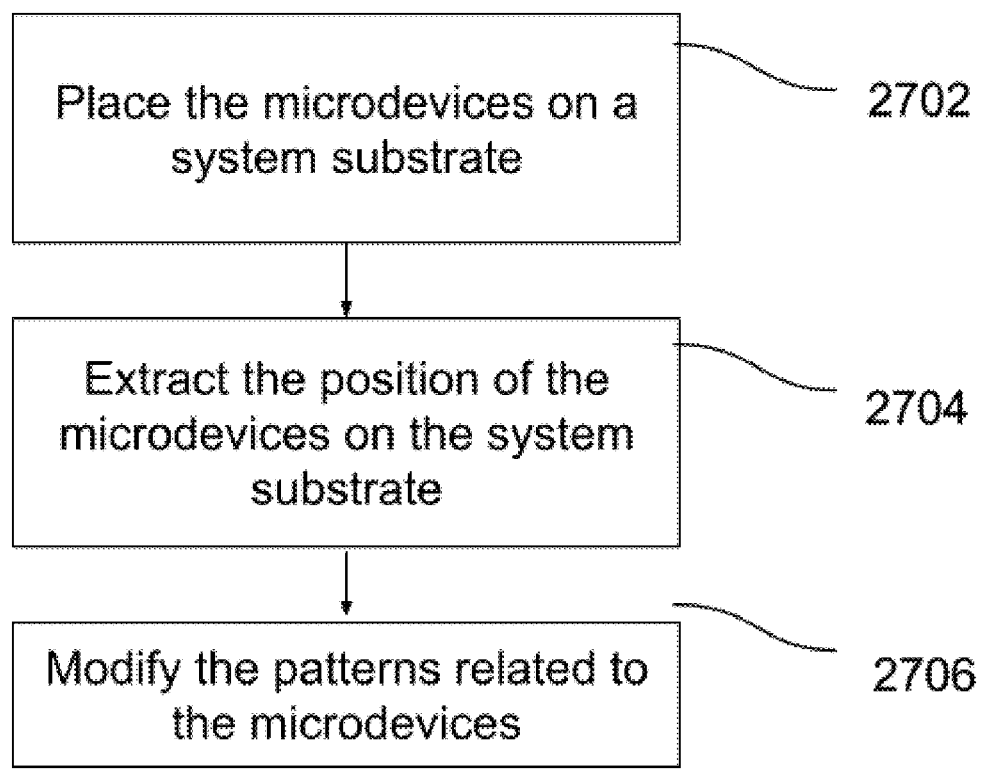
FIG. 27A shows process steps to extract microdevice positions, according to one embodiment of the present invention.

FIG. 27A shows process steps to extract microdevice positions, according to one embodiment of the present invention. After the microdevices are transferred to the backplane, a microdevice location on the backplane may be detected, and if there is misalignment during transfer, the patterning for other layers may be adjusted to match this transfer misalignment. The process steps comprise: step 2702, placing the microdevices on a system substrate; step 2704, extracting the position of the microdevices on the system substrate, using camera, surface profiler (optical, ultrasonic, electrical), or other means; step 2706, possibly modifying the patterns related to the microdevices, wherein the patterns may include one of: electrodes coupling microdevices to a signal, functional tunable layers (e.g. color conversion or color filter), vias opening in the passivation/planarization layer, or backplane layers. There can be some reference structure on the system substrate to calibrate the tool used to extract the microdevice position first, or the reference can be used to find the relative position of the microdevices.

In one embodiment, different means may detect the microdevice's location. For example, camera, probe tips, surface profiler (optical, ultrasonic, electrical), or other means may detect/extract the location/position of the microdevice. In another embodiment, an offset in the transfer setup may identify the misalignment in the position of the microdevices on the system substrate/backplane.

For example, in one case, metalization patterning may avoid shorts. In another case, a color filter or color conversion may also be adjusted based on the location of the microdevices. This can reduce the tolerance required to place microdevices. Some random offset may also be induced in the microdevice location to reduce optical artifacts.

Figure 27B:
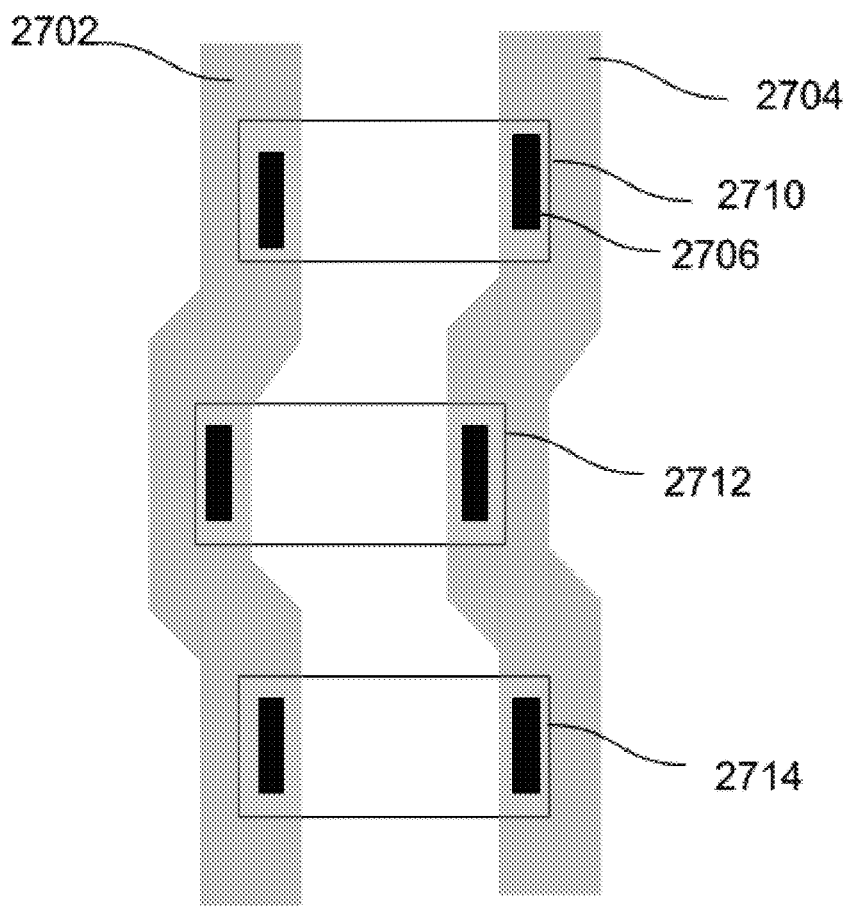
FIG. 27B shows modifications in the position/shape of the electrode based on the position of microdevices, according to one embodiment of the present invention.

FIG. 27B shows a modification in the position/shape of the electrode based on the position of microdevices, according to one embodiment of the present invention. One or more microdevices 2710, 2712, or 2714 may be provided with contact pads 2706. In one case, a position/shape of an electrode 2702, 2704 may be modified based on the position of the microdevices 2710, 2712, 2714. In another case, the position/shape of the electrode may be modified based on the position of the via. In another case, the position of the via in the planarization/passivation layer can be modified according to the microdevice position.

Figure 27C:
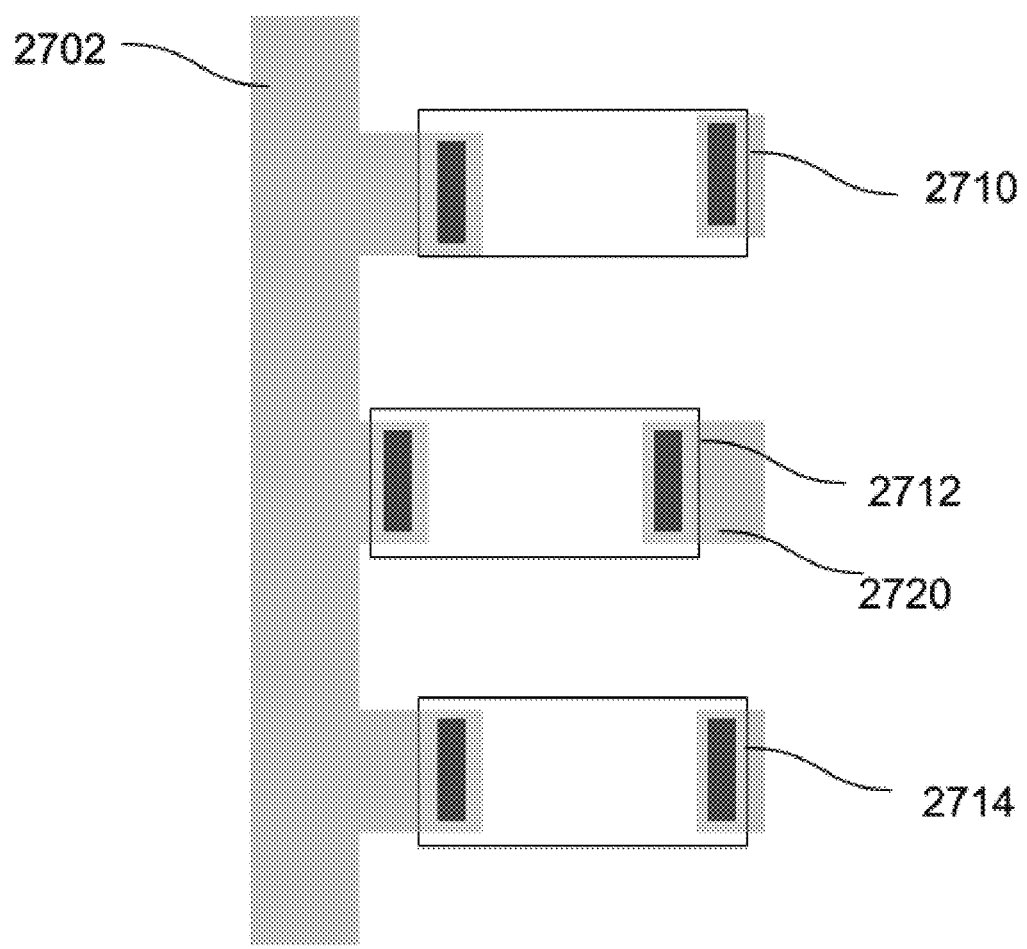
FIG. 27C shows extensions provided to the electrodes, according to one embodiment of the present invention.

FIG. 27C shows extensions provided to the electrodes, according to one embodiment of the present invention. In one case, the position of the electrode 2702 may be modified. Also, there can be some extension 2720 for each electrode such that its position or length can be modified based on the position of the microdevice 2710, 2712, or 2714. This can be used for the common electrode or an individual electrode.

According to one embodiment, a bonding structure may be provided. The bonding structure may comprising a plurality of microdevices on a donor substrate, each microdevice comprises one or more conductive pads formed on a surface of the microdevice; and a temporary material to cover at least a part of each micro device or the one or more conductive pads, wherein the temporary material is coupled to a current/voltage source to redirect current to the one or more conductive pads through the temporary material. The temporary material comprises conductive material or non-conductive material and wherein the temporary conductive material further covers fully or partially the one or more conductive pads.

According to another embodiment, the method may further comprising a conductive layer at the donor substrate to couple the temporary conductive material to the current/voltage source, a housing structure to cover at least a part of each microdevice on the donor substrate, wherein the temporary material act as an anchor holding the plurality of microdevices inside the housing structure in the donor substrate.

According to yet another embodiment, the method may further comprising at least one sacrificial layer between the housing structure and each microdevice, wherein the temporary material is patterned to create an opening on a top surface of the donor substrate. The opening at the top surface of the donor substrate is used to release the micro device from sidewalls of the housing structure by removing the sacrificial layer. The temporary material holds each microdevice in place after removal of the sacrificial layer and the sacrificial layer is removed by using a chemical etch process or electromagnetic signals.

According to further embodiments, the temporary material is separated from the housing structure after transferring each microdevice to a receiver substrate by one of: a mechanical process, an optical process, a thermal process, and a chemical process. The conductive traces on the top surface of the donor substrate are connected as one of: a mesh, rows, or columns.

According to some embodiments, a plurality of access point on the top surface of the donor substrate is used for biasing the temporary material through the conductive traces. The temporary material creates a passage between a surface facing the donor substrate and a surface facing away from the donor substrate.

According to one embodiment, a method of bonding at least one micro device to a receiver substrate is provided. The method comprising: forming a stack comprises electrodes and an electroactive polymer layer underneath the at least one micro device on a donor substrate; applying a voltage to the stack to bring at least one micro device to a contact/proximity of the surface of the receiver substrate.

According to some embodiments, the method may further comprising: providing a housing structure surrounding the at least one micro device; and providing an anchor to hold the at least one micro device inside the housing structure.

According to another embodiment, the anchor releases the micro device on a surface of the receiver substrate by one of a: push force or pull force, the stack further comprises an absorption layer that converts the light to a thermal change and the electroactive polymer layer changes to gas and a pressure created by the change pushes the at least one micro device to the surface of the receiver substrate.

According to one embodiment, there may be provided a method to integrate microdevices on a backplane comprising; forming a buffer layer on or over the one or more micro devices extended over the substrate, forming a planarization layer on the buffer layer, the planarization layer comprises a polymer and wherein the polymer comprises one of: polyamide, SU8 or BCB; and depositing a bonding layer between the planarization layer and an intermediate substrate.

According to another embodiment, the method may further comprise curing the bonding layer after contact with the planarization layer, and removing the microdevice substrate by either laser or chemical liftoff. The bonding layer is cured by pressure, temperature, or light.

According to another embodiment, the method may further comprise removing the micro device substrate by one of: a laser or a chemical lift off and wherein bonding the selective set of the micro devices from the substrate to the backplane comprising the steps of: aligning and bringing the microdevices and the backplane in contact, removing the buffer layer to release the micro devices, creating a force to pull out the selected set of micro devices; and bonding the selected set of micro devices to the backplane.

According to another embodiment, the method may further comprise providing an opening in the buffer layer to let the microdevices connect to the planarization layer. The buffer layer is conductive, wherein the buffer layer connects at least one microdevice to a test pad.

According to another embodiment, the method may further comprise providing an electrode either on a top or a bottom of the planarization layer, coupling at least one microdevice to the electrode through the buffer layer, extracting the position of the microdevices on the backplane, and extending a position of the electrode to extract the position of the microdevices on the backplane, wherein the position of the microdevices is extracted by a camera, a probe tip, or a surface profiler.

In summary, the present disclosure provides a microdevice integration process, transferring to a system substrate for finalizing and electronic control integration. The transfer may be facilitated by various means, including providing temporary materials, breakable anchors on the donor substrates, or temporary intermediate substrates.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method of integrating microdevices on a backplane, the method comprising
providing a microdevice substrate comprising the microdevices;
bonding a selective set of the microdevices from the substrate to the backplane by connecting contact pads on the microdevices and corresponding pads on the backplane;
forming a buffer layer on or over the microdevices extended over the substrate, the buffer layer connecting at least one microdevice to a test pad;
forming a planarization layer on the buffer layer, the planarization layer comprising a polymer of polyamide, SU8 or BCB;
depositing a bonding layer between the planarization layer and an intermediate substrate; and
leaving the bonded selective set of the microdevices on the backplane by separating the microdevice substrate.

2. The method of claim 1, further comprising:
curing the bonding layer after being in contact with the planarization layer,
wherein the bonding layer is cured by either one of pressure, temperature or light.

3. The method of claim 1, wherein the buffer layer is conductive.

4. The method of claim 1, further comprising
providing an electrode either on a top or bottom of the planarization layer; and
coupling at least one microdevice to the electrode through the buffer layer.

5. The method of claim 4, further comprising
extracting positions of the microdevices on the backplane by a camera, a probe tip, or a surface profiler; and
extending a position of the electrode to the extracted positions of the microdevices on the backplane.

6. The method of claim 1, further comprising
removing the microdevice substrate by one of: a laser or a chemical lift off.

7. The method of claim 1, wherein pads on the microdevices and corresponding pads on the backplane are electrically conductive.

8. The method of claim 1, wherein the bonding the selective set of the microdevices from the substrate to the backplane comprises the steps of:
aligning and brining the microdevices and the backplane in contact;
removing the buffer layer to release the microdevices;
creating a force to pull out the selected set of the microdevices; and
bonding the selected set of the microdevices to the backplane.

9. The method of claim 1, further comprising
providing an opening in the buffer layer to allow the microdevices to connect to the planarization layer.

* * * * *